(12) United States Patent
Chen et al.

(10) Patent No.: US 11,721,603 B2
(45) Date of Patent: Aug. 8, 2023

(54) INTEGRATED FAN OUT METHOD UTILIZING A FILLER-FREE INSULATING MATERIAL

(71) Applicant: Taiwan Semiconductor Manufacturing Co., Ltd., Hsinchu (TW)

(72) Inventors: Wei-Chih Chen, Taipei (TW); Sih-Hao Liao, New Taipei (TW); Yu-Hsiang Hu, Hsinchu (TW); Hung-Jui Kuo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 102 days.

(21) Appl. No.: 17/220,722

(22) Filed: Apr. 1, 2021

(65) Prior Publication Data

US 2022/0122898 A1    Apr. 21, 2022

Related U.S. Application Data

(60) Provisional application No. 63/091,966, filed on Oct. 15, 2020.

(51) Int. Cl.
*H01L 23/31* (2006.01)
*H01L 23/498* (2006.01)

(52) U.S. Cl.
CPC ...... *H01L 23/3178* (2013.01); *H01L 23/3192* (2013.01); *H01L 23/49822* (2013.01); *H01L 23/49861* (2013.01)

(58) Field of Classification Search
CPC ........... H01L 23/3192; H01L 23/49861; H01L 23/3178

USPC ........................................................ 257/666
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2007/0069347 A1 | 3/2007 | Lin et al. |

(Continued)

FOREIGN PATENT DOCUMENTS

| | | |
|---|---|---|
| JP | 2015053371 A | 3/2015 |
| KR | 20160112210 A | 9/2016 |
| KR | 20190112628 A | 10/2019 |

OTHER PUBLICATIONS

Lee et al. "Shrinkage ratio of PDMS and its alignment method for the wafer level process," Technical Paper, Microsyst Technol, 2008, vol. 14, pp. 205-208.

*Primary Examiner* — Quoc D Hoang
(74) *Attorney, Agent, or Firm* — Slater Matsil, LLP

(57) ABSTRACT

A redistribution structure is made using filler-free insulating materials with a high shrinkage rate. As a result, good planarity may be achieved without the need to perform a planarization of each insulating layer of the redistribution structure, thereby simplifying the formation of the redistribution structure.

20 Claims, 57 Drawing Sheets

(56) References Cited

U.S. PATENT DOCUMENTS

| | | | |
|---|---|---|---|
| 2008/0081459 A1* | 4/2008 | Lee | H01L 24/05 |
| | | | 438/624 |
| 2019/0304910 A1 | 10/2019 | Fillion | |
| 2019/0335590 A1 | 10/2019 | Jung et al. | |
| 2020/0126923 A1 | 4/2020 | Hu et al. | |
| 2020/0194362 A1* | 6/2020 | Park | H01L 23/367 |
| 2022/0165582 A1 | 5/2022 | Kim et al. | |
| 2022/0359327 A1 | 11/2022 | Yu et al. | |

* cited by examiner

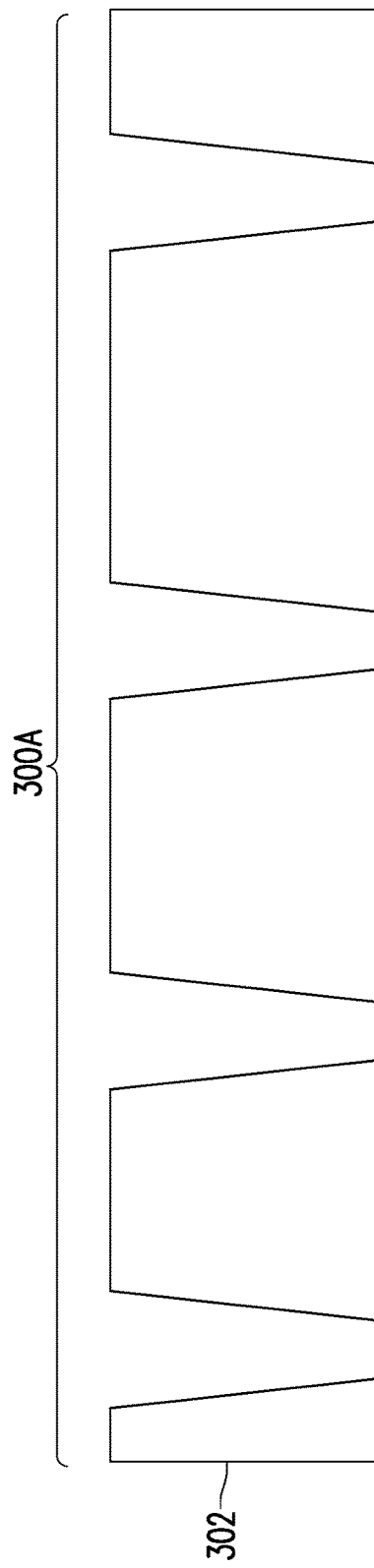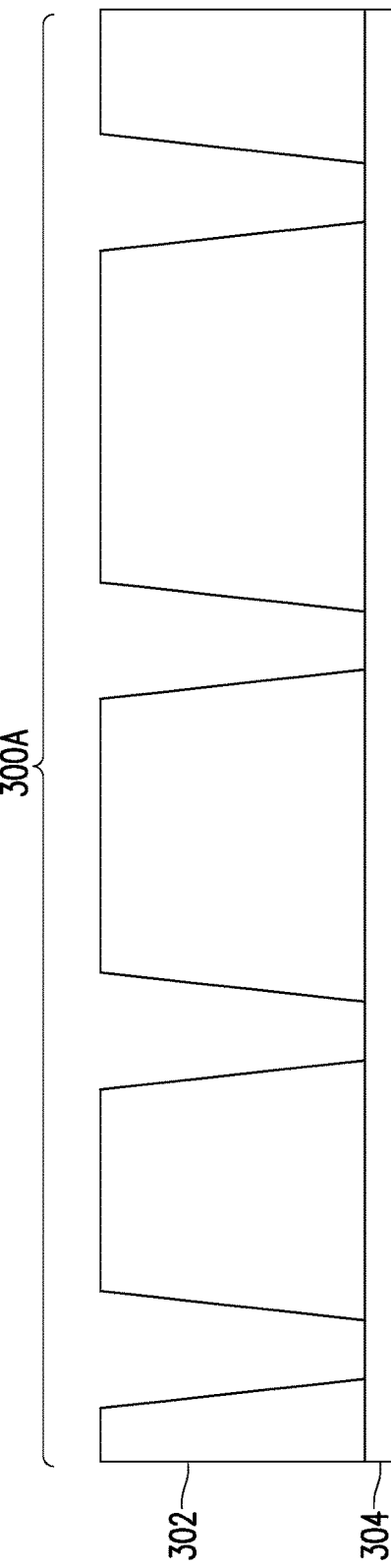

INTEGRATED FAN OUT METHOD UTILIZING A FILLER-FREE INSULATING MATERIAL

PRIORITY CLAIM AND CROSS-REFERENCE

This application claims priority to U.S. Provisional Application No. 63/091,966, filed on Oct. 15, 2020, which application is hereby incorporated by reference herein as if reproduced in its entirety.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 31 through 37 illustrate intermediate processes in the formation of a device stack, in accordance with some embodiments.

DETAILED DESCRIPTION

Figure 1:
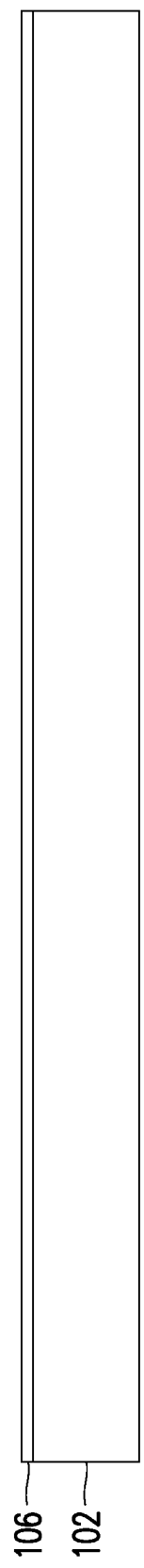
FIGS. 1 through 19 illustrate intermediate processes in the formation of a redistribution structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, redistribution structures are disclosed which are made of filler-free insulating layers with shrinkage rates to achieve an upper profile which is wavy, but within allowances to avoid the need for a flattening process, such as a planarization, of the insulating layers between each successive deposition of the layers of the redistribution structure. As a result, the redistribution structures may be made more simply and the insulating layers may advantageously be made thinly. In addition, the first metallization pattern of the redistribution structure may be made with a relatively thicker metal to provide increase signal delivery and less attenuation. Some embodiments may utilize a ceramic carrier, such as an aluminum oxide carrier for good heat dissipation and electrical insulating properties. An embedded die can be used for further functionality for the redistribution structure.

In FIGS. 1 through 19, a redistribution structure 100 (see FIG. 19) is formed over a substrate 102. Referring briefly to FIG. 19, the redistribution structure 100 serves to electrically couple conductive features 101 in the substrate 102 to other conductive features 101 in the substrate 102 and to electrically couple conductive features 101 in the substrate 102 to conductive connectors 160. The redistribution structure 100 includes insulating layers 112, 122, 132, 142, and 152 and metallization patterns containing conductive layers 108, 118, 128, 138, and 148. The metallization patterns may also be referred to as redistribution layers or redistribution lines. The redistribution structure 100 is shown as an example having five layers of metallization patterns. More or fewer dielectric layers and metallization patterns may be formed in the redistribution structure 100. If fewer dielectric layers and metallization patterns are to be formed, steps and process discussed below may be omitted. If more dielectric layers and metallization patterns are to be formed, steps and processes discussed below may be repeated.

FIG. 1 illustrates a cross-sectional view of a substrate 102 of a semiconductor device. In some embodiments, the semiconductor device is a device wafer including active devices and/or passive devices. In some embodiments, the substrate 102 and the semiconductor device may be singulated to form a plurality of chips/dies therefrom, which the illustrated view of FIG. 1 may be one of such dies. In some embodiments, the substrate 102 may correspond to an interposer wafer, which is free from active devices and may include passive devices. In some embodiments, the substrate 102 may correspond to a package substrate strip, which includes a core-less package substrate or a cored package substrate with a core therein. In some embodiments, the substrate 102 may correspond to a device wafer which is singulated in subsequent processes. The redistribution structure embodiments of the present disclosure may also be applied to interposer wafers, package substrates, packages, or the like.

In some embodiments, the substrate 102 may correspond to logic dies (e.g., central processing units (CPUs), graphics processing units (GPUs), system-on-chips (SoCs), application processors (APs), microcontrollers, application-specific integrated circuit (ASIC) dies, or the like), memory dies (e.g., dynamic random access memory (DRAM) dies, static random access memory (SRAM) dies, high bandwidth memory (HBM) dies, or the like), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies or the like), front-end dies (e.g., analog front-end (AFE) dies), the like, or a combination thereof.

In some embodiments, the substrate 102 may be a semiconductor substrate and may include features formed at a top surface of the substrate 102. In such embodiments, substrate 102 may be a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or a glass substrate. Other substrates, such as a multi-layered or gradient substrate may also be used. In some embodiments, the semiconductor material of the substrate 102 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Shallow trench isolation (STI) regions (not separately illustrated) may be formed in the substrate 102 to isolate active regions in the substrate 102. Vias (not separately illustrated) may be formed extending into the substrate 102 or through the substrate 102 (e.g., through-vias) and may be used to electrically inter-couple features on opposite sides of the substrate 102.

In some embodiments, the substrate 102 includes integrated circuit devices, which are formed on the top surface of semiconductor substrate 102 and coupled to the conductive features 101 of FIG. 19. The integrated circuit devices may include complementary metal-oxide semiconductor (CMOS) transistors, resistors, capacitors, diodes, and the like. The details of the integrated circuit devices are not illustrated herein. In some embodiments, the substrate 102 is used for forming interposers (which are free from active devices), and the substrate 102 may be a semiconductor substrate or a dielectric substrate.

A seed layer 106 is formed over the substrate 102. The seed layer 106 may be formed of any suitable material by a suitable process. In some embodiments, the seed layer may include copper, aluminum, platinum, gold, palladium, titanium, tungsten, cobalt, the like, and combinations thereof, and may be deposited by sputtering, a CVD process, a PVD process, the like, or combinations thereof. The seed layer 106 may be deposited to a thickness between 0.2 μm and 0.6 μm, or any suitable thickness.

Figure 2:
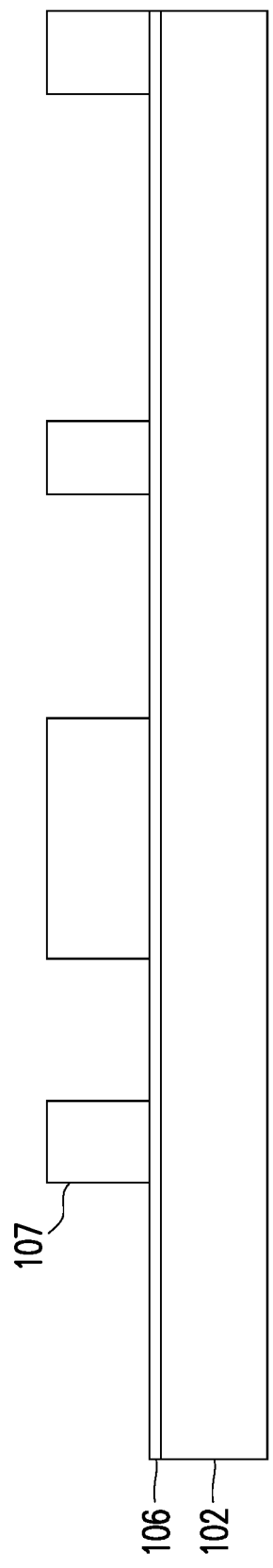

In FIG. 2, a mask layer 107 is formed on the seed layer 106 and patterned to expose portions of the seed layer 106. The mask layer 107 may be formed from a photosensitive material and patterned using acceptable photolithography techniques. In some embodiments, the mask layer 107 may be a bottom layer of a bi-layer or tri-layer photo mask, where an upper layer of the mask is patterned using photolithography and underlying layers, including the mask layer 107, are subsequently patterned using etching. In some embodiments, double-patterning or multi-patterning processes may be used. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over substrate 102 and patterned using a photolithography process. Spacers are formed alongside the patterned sacrificial layer using a self-aligned process. The sacrificial layer is then removed, and the remaining spacers may then become the mask layer 107.

Figure 3:
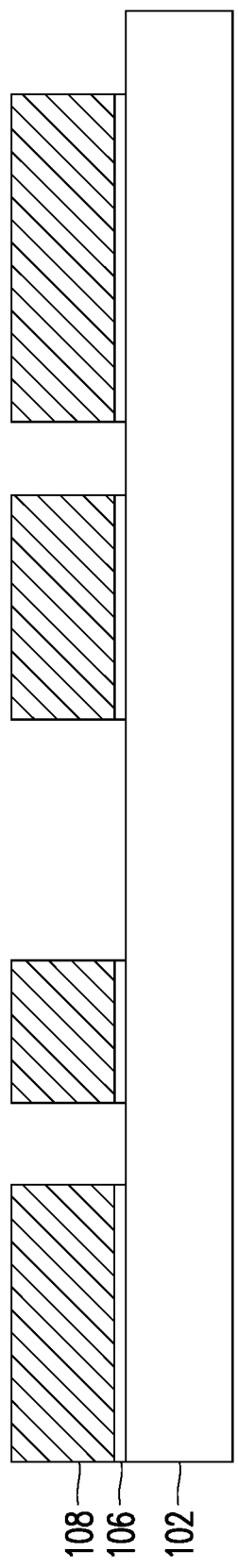

In FIG. 3, the conductive layer 108 is deposited on the exposed portions of the seed layer 106. In some embodiments, the conductive layer 108 is relatively thick, for example, compared to the thickness of the dielectric layer separating the conductive layer 108 from another conductive layer formed in a subsequent process (described below). Also, the conductive layer 108 is thick relative to subsequent metal lines and can be used for routing signals with less signal loss in, for example, radio or analog signals. In some embodiments, the thickness of the combination of the seed layer 106 and the conductive layer 108 may be between about 10 μm and about 60 μm thick, though other thicknesses are contemplated and may be used. The conductive layer 108 may be formed of any suitable conductive material, including, for example, Co, Cu, Al, Ti, Ta, W, TiN, TaN, the like, or combinations thereof. The conductive layer 108 may be formed using any suitable technique, including PVD, ALD, CVD, variants thereof, the like, or combinations thereof. The conductive layer 108 is a first metallization layer of a redistribution structure.

Still referring to FIG. 3, the mask layer 107 is removed by an etch back or ashing technique. Any material of the conductive layer 108 that may lie atop the mask layer 107 is removed when the mask layer 107 is removed. Next, exposed portions of the seed layer 106 are removed by an etching technique using a suitable etchant selective to the material of the seed layer 106.

Figure 4:
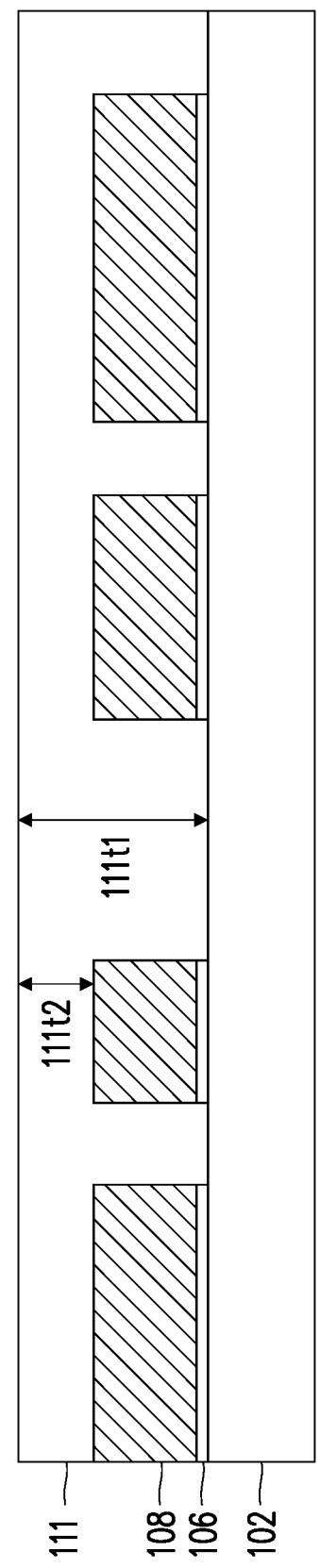

In FIG. 4, an insulating material 111 is deposited over the conductive layer 108. FIG. 4 illustrates the insulating material 111 just after deposition, i.e., before curing. The insulating material 111 may be a varnish type of insulating material rather than a dry type of insulating material. The insulating material 111 may be a resin only, that is, the resin may be free of filler material. For example, the insulating material 111 may be a type of polymer known as an additional polymer, such as an epoxy, bismaleimide (BMI), polyphenylene oxide (PPO), cyanate ester, acrylate, the like, or combinations thereof. The molecular weight of the insulating material may be less than 50000 g/mol, such as between about 25000 g/mol and 50000 g/mol. The solid content of the resin may be greater than 40%, such as between about 40% to about 60%. The shrinkage rate of the insulating material 111 may be between about 95-99%, or in other words, the thickness of the final cured insulating material 112 (see FIG. 5) is 95-99% of the thickness of the uncured insulating material 111. Or still in other words, the shrinkage is very low (between 1% and 5%). The insulating material 111 may be deposited using any technique, such as spin coating, screen printing, spray coating, the like, or combinations thereof. An SAP process may be used as well, an example of which is further described in conjunction with the description below, in which the subsequently formed via and conductive layer are processed at the same time. As a result of the deposition technique, an upper surface of the insulating material 111 just after deposition may have a high degree of planarity, i.e., may be flat, such as illustrated in FIG. 4. Thus, the thickness of the insulating material 111 varies due to the underlying conductive layer 108, being thicker (e.g., thickness 111$t$1) between elements of the conductive layer 108 and thinner (e.g., thickness 111$t$2) over elements of the conductive layer 108.

The insulating material 111 may be deposited to a thickness 111$t$1 between about 12 µm to about 120 µm (or a thickness 111$t$2 between about 2 µm and about 60 µm, or less than the thickness of the combination of the seed layer 106 and the conductive layer 108, such as between 30% and 100% or between 30% and 70% of the thickness of the combination of the seed layer 106 and the conductive layer 108). Because the shrinkage rate of the insulating material 111 is only 95% to 99%, as the insulating material 111 shrinks, the differences in the thickness due to the conductive layer 108 are minimal. Therefore, as the insulating material 111 shrinks after application, the combination of the shrinkage rate, filler-free design, molecular weight, and solid content provides only small recesses to occur in the upper surface which correspond to areas where the pattern of the conductive layer 108 are sparse. Also, because the insulating material 111 has additional-type polymerization, there are no extra side products to be removed during curing and little to no weight loss of the insulating material 111 is observed.

Figure 5:
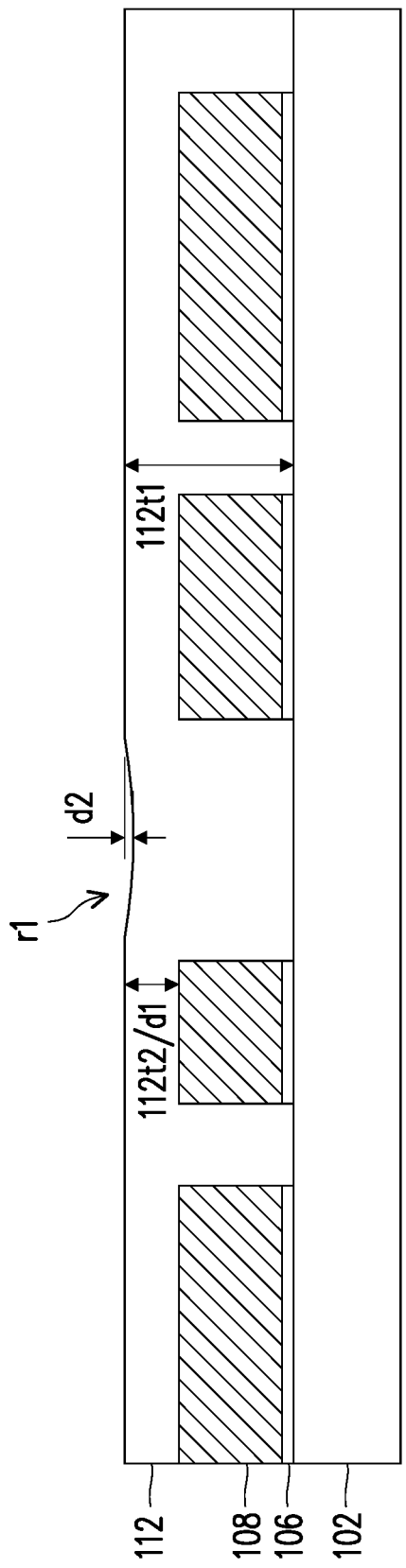

Referring to FIG. 5, after the insulating material 111 shrinks into its final form as the insulating layer 112, the thickness 1120 of the insulating material between elements of the conductive layer 108 from the underlying substrate 102 to the upper surface of the insulating layer 112 may be between about 12 µm and about 114 µm. The thickness d1 (or 112$t$2) of the insulating material over the conductive layer 108 may be between about 2 µm and about 57 µm. In other words, the thickness d1 of the insulating layer 112 may be between about 25% and 100% of the thickness of the combined conductive layer 108 and seed layer 106, such as between about 30% and 60%. In some embodiments, the thickness d1 of the insulating layer 112 may be less than half the thickness of the combined conductive layer 108 and seed layer 106. The relatively thin insulating layer 112 over the thick metal conductive layer 108 reduces transmittance loss and increases power efficiency. The illustrated process advantageously provides an insulating layer 112 which is less than the thickness of the underlying metallization (seed layer 106 and conductive layer 108) without the need for any additional planarization processes.

Where the insulating layer 112 fills the spaces laterally surrounding the conductive layer 108, when the film of the insulating material 111 shrinks to the final form in the insulating layer 112, recesses r1 may be formed in the upper surface of the insulating layer 112 due to the different thicknesses of the insulating layer 112 over elements of the conductive layer 108 versus between elements of the conductive layer 108. The recesses r1 may have a depth d2 determined by the differences in the thicknesses 111$t$1 and 111$t$2. This difference is attributable to the metallization pattern (conductive layer 108 and seed layer 106). Therefore the depth d2 is approximately the thickness of the metallization pattern times the shrinkage rate. Thus, recesses r1 may have a depth d2 between 1% to 5% of the thickness of the combined conductive layer 108 and seed layer 106, such as between 0.1 µm to about 3 µm. Taking into account the thickness of d1 as it relates to the conductive layer 108 and seed layer 106, the recesses r1 are also between 1% and 5% of the thickness d1.

Because the recesses r1 are only between 1% and 5% of the thickness d1, a planarization process may be omitted, thereby saving time and resources. This results in an upper surface of the insulating layer 112 which may have some slight waviness due to the recesses r1. Also, if a planarization were performed, there would be marks left as a result of the planarization process. However, in the present embodiments, there are not planarization marks on the insulating layer 112 (and subsequent insulating layers). When subsequent conductive layers and insulating layers are formed, these recesses r1 may propagate to the subsequent layers to some degree; however, the propagation for each successive layer may be less than the previous layer because generally only a fraction of the depth d2 of the recesses r1 will propagate. For example, as noted above, the depth d2 of the recesses r1 are between 1% and 5% of the thickness of the combined conductive layer 108 and seed layer 106. In a subsequent insulating layer, the propagation diminishes by a similar amount, depending on the material of the next insulating layer, so that any propagation of the recesses r1 may only about 1% to 35% of the depth d2. As such, acceptable planarity of the subsequent layers may be maintained without the need for planarization steps. Acceptable planarity allows for subsequent photolithography techniques to be performed reliably, e.g., without focus errors that may result from topography issues.

Figure 6:
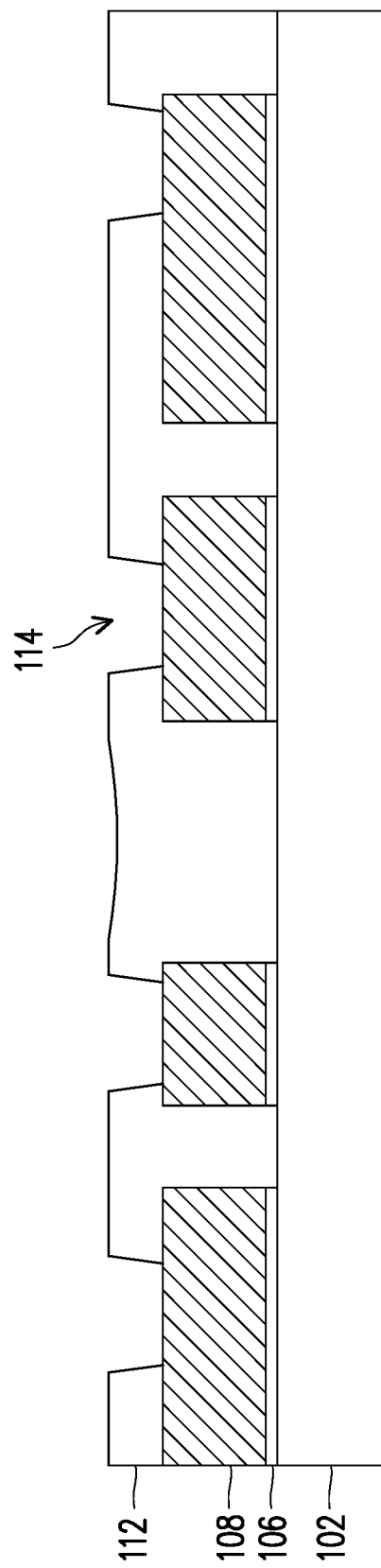

In FIG. 6, after the insulating layer 112 is formed, the insulating layer 112 is then photo patterned using an acceptable photolithography technique, such as by exposure, developing, and curing to form the openings 114 in the insulating layer 112 to reveal portions of the conductive layer 108. Although the openings 114 are illustrated as being tapered, the openings 114 may be rectangular, that is, having vertical sidewalls.

Figure 7:
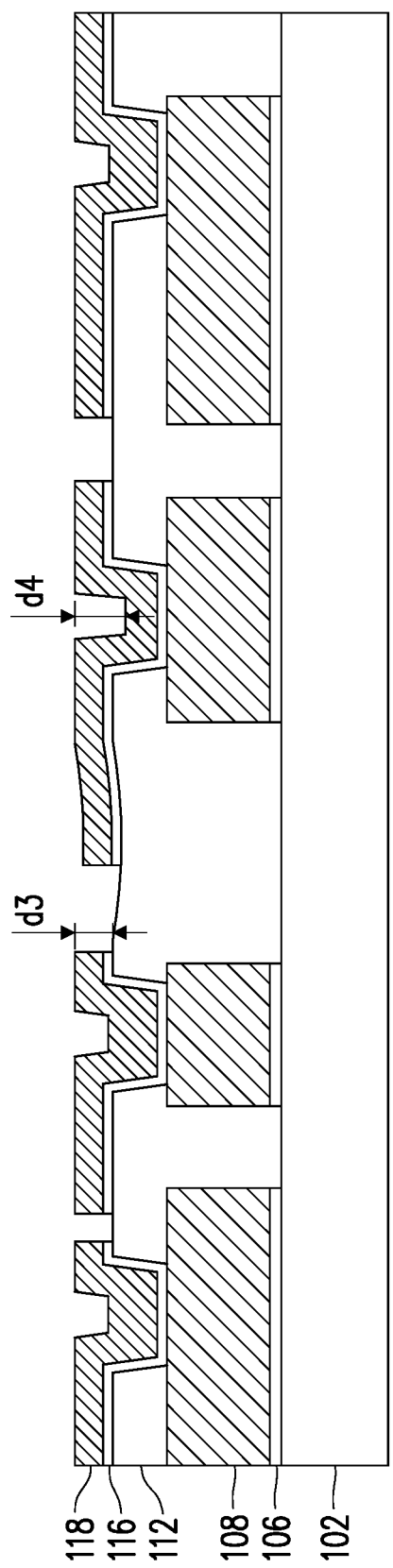

In FIG. 7, a metallization pattern is formed which includes conductive elements, such as the seed layer 116 and conductive layer 118 extending along the major surface of the insulating layer 112 and extending through the insulating layer 112 to physically and electrically couple to conductive layer 108. As an example to form the metallization pattern, the seed layer 116 is formed over the insulating layer 112 and in the openings 114 extending through the insulating layer 112. In some embodiments, the seed layer 116 is a metal layer, which may be a single layer or a composite layer comprising a plurality of sub-layers formed of different materials. In some embodiments, the seed layer 116 comprises a titanium layer and a copper layer over the titanium layer. The seed layer 116 may be formed using, for example, PVD or the like. A photoresist is then formed and patterned on the seed layer 116. The photoresist may be formed by spin coating or the like and may be exposed to light for patterning. The pattern of the photoresist corresponds to the metallization pattern including the conductive layer 118. The patterning forms openings through the photoresist to expose the seed layer. The conductive layer 118 is then formed in the openings of the photoresist and on the exposed portions of the seed layer 116. The conductive layer 118 may be formed by plating, such as electroplating or electroless plating, or the like. The conductive layer 118 may comprise a metal, like copper, titanium, tungsten, aluminum, or the like. The combination of the conductive layer 118 and underlying portions of the seed layer 116 form the metallization pattern. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The thickness d3 of the combined seed layer 116 and conductive layer 118 may be between 15% to 30% of the thickness of the conductive layer 108. In other words, the thickness d3 of the subsequent metallization patterns may be much thinner than the thickness of the first metallization patterns of the redistribution structure 100. In some embodiments, the conductive layer 118 may be used for routing signals which are not as sensitive to attenuation as the signals routed in the conductive layer 108. The reduced thickness of the conductive layer 118, as compared to the conductive layer 108, helps reduce overall device thickness as well as control heat dissipation. The reduced thickness of the conductive layer 118 also helps maintain good planarity in the subsequently formed insulating layer, without the need of a planarization process, such as described below. In some embodiments, the thickness d3 of the combined seed layer 116 and conductive layer 118 may be between about 3 μm and about 8 μm. The seed layer 116 and conductive layer 118 follow the shape of the openings 114 causing a portion of the conductive layer 118 to have an upper surface in the openings 114 which dips down into the openings 114 by a distance d4 up to about half the thickness of the insulating layer 112 over the conductive layer 108. In some embodiments, the distance d4 may be greater than the thickness d3, for example, between 0 and (d3+(d1)/2). In other embodiments, the distance d4 may be less than the thickness d3.

Figure 8:
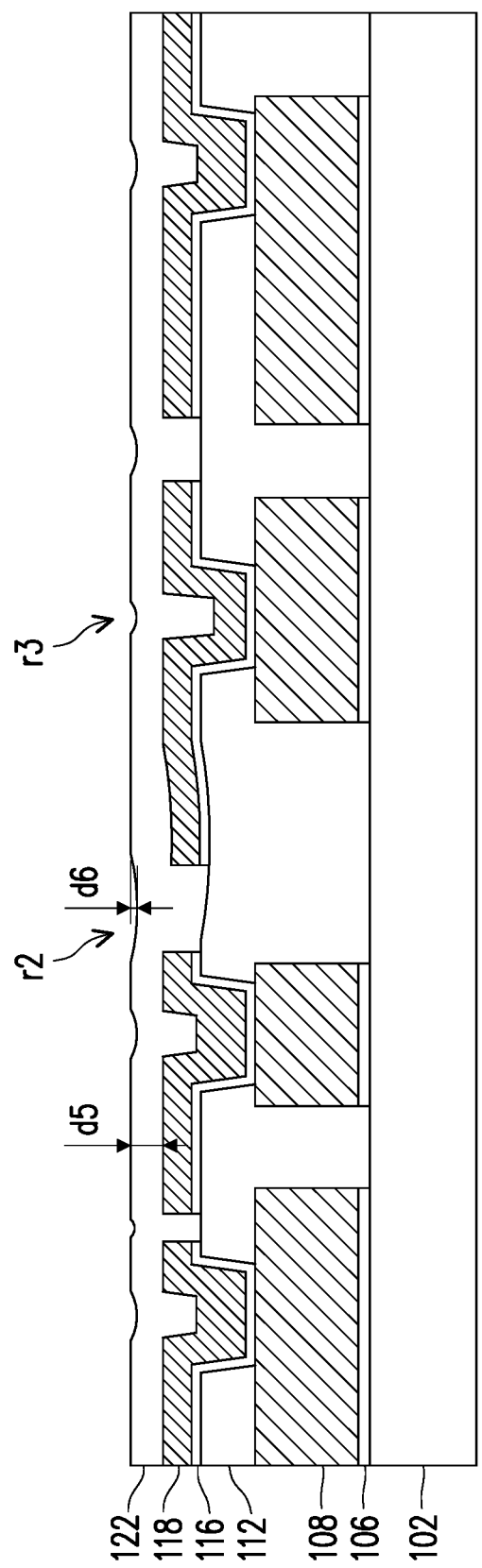

In FIG. 8, an insulating layer 122 is deposited over the conductive layer 118 and over portions of the insulating layer 112. In some embodiments, the insulating layer 122 may be an additional polymer such as used in the insulating layer 112 and may be formed using like materials and processes as those discussed above with respect to the insulating layer 112, though the material composition of the insulating layer 122 may be the same or different than the material composition of the insulating layer 112. In other embodiments, the insulating layer 122 may be a different type of polymer, such as a condensation polymer. The insulating layer 122 may be a varnish type of insulating material rather than a dry type of insulating material. The material may be a resin only, that is, the resin may be free of filler material. For example, the material may be a condensation polymer, such as a polyimide, polybenzoxazole (PBO), nylon, the like, or combinations thereof. The molecular weight of the material of the insulating layer 122 may be less than 25000 g/mol, such as between about 10000 g/mol and 25000 g/mol. The solid content of the resin may be greater than 45%, such as between about 45% to about 60%. The shrinkage rate of the material of the insulating layer 122 may be between about 65% and 80%, such as between 68% and 75%. In other words, the insulating layer 122 may lose 20% to 35% of the thickness of the material of the insulating layer 122 while curing from the as-deposited state to the cured state. The insulating layer 122 may be deposited using any technique, such as spin coating, screen printing, spray coating, the like, or combinations thereof. As a result of the deposition technique, an upper surface of the insulating material of the insulating layer 122 just after deposition may be have a high degree of planarity, i.e., may be flat. Thus, the thickness of the insulating material varies due to the underlying conductive layer 118 and recesses r1, being thicker between elements of the conductive layer 118 and thinner over elements of the conductive layer 118.

The insulating layer 122 may be deposited to a thickness between about 7 μm to about 25 μm. Because the shrinkage rate of the material of the insulating layer 122 is relatively high, as the material of the insulating layer 122 shrinks after application, the combination of the shrinkage rate, filler-free design, molecular weight, and solid content tends to project attenuated versions of the underlying dips and bumps to form a wavy upper surface of the insulating layer 122. These attenuated projections project at a rate of about one to three or about one to four, or in other words for every 3 μm to 4 μm of variation, about 1 μm of it is projected to the surface of the insulating layer 122 (give or take 50%). For example, the underlying features such as the conductive layer 118 and/or the recesses r1 may be projected to the upper surface of the insulating layer 122. In other words, although the insulating material of the insulating layer 122 may be planar as deposited, after curing, the insulating layer 122 may have an upper surface which is somewhat conformal to the underlying features. However, the insulating layer 122 is relatively thin, e.g., as compared to the thickness of the conductive layer 118. As such, it is difficult to reliably flatten, for example by planarization, the upper surface of the insulating layer 122. Therefore, rather than planarize the upper surface of the insulating layer 122, as noted in the subsequent processes described below, the subsequent metallization patterns are formed directly on the wavy upper surface of the insulating layer 122.

After the insulating material of the insulating layer 122 shrinks into its final form as the insulating layer 122, the thickness d5 of the insulating layer 122 over the conductive layer 118 may be between about 5 μm and about 7 μm. The illustrated process advantageously provides the insulating layer 122 which is 100% to 200% of the thickness of the underlying metallization (seed layer 116 and conductive layer 118) without the need for any additional planarization processes. Portions of the insulating layer 122 may extend into depressions in the conductive layer 118 according to the distances d4 (see FIG. 7), and as a result, in some embodiments, the bottom surface of the insulating layer 122 may extend lower than an upper surface of the insulating layer 112.

Where the insulating layer 122 fills the spaces laterally surrounding the conductive layer 118, recesses r2 may be formed in the upper surface of the insulating layer 122. Also, where the insulating layer 122 fills in the depression in the upper surface of the conductive layer 118 (e.g., according to the distance d4), recesses r3 may be formed in the upper surface of the insulating layer 122. The recesses r2 and r3 may have a depth d6 between 10% to 35% of the thickness d5, such as between 1.0 μm to about 3.0 μm. The recesses r2 and r3 may have a depth d6 between 30% to 60% of the thickness of the conductive layer 118, such as between 1.0 μm to about 3.0 μm. Because the recesses r2 and r3 are between 10% and 35% of the thickness d5, a planarization process may be omitted, thereby saving time and resources. This results in an upper surface of the insulating layer 122 with waviness due to the recesses r2 and r3.

Figure 9:
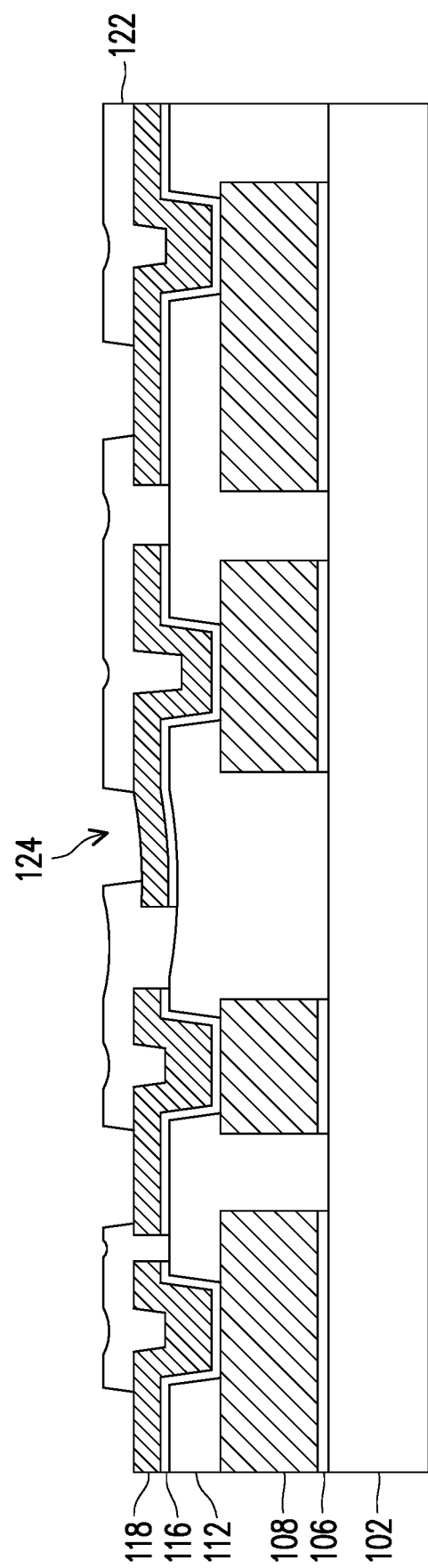

In FIG. 9, after the insulating layer 122 is formed, the insulating layer 122 is then photo patterned using an acceptable photolithography technique, such as by exposure, developing, and curing to form the openings 124 in the insulating layer 122 to reveal portions of the conductive layer 118. Although the openings 124 are illustrated as being tapered, the openings 124 may be rectangular, that is, having vertical sidewalls.

Figure 10:
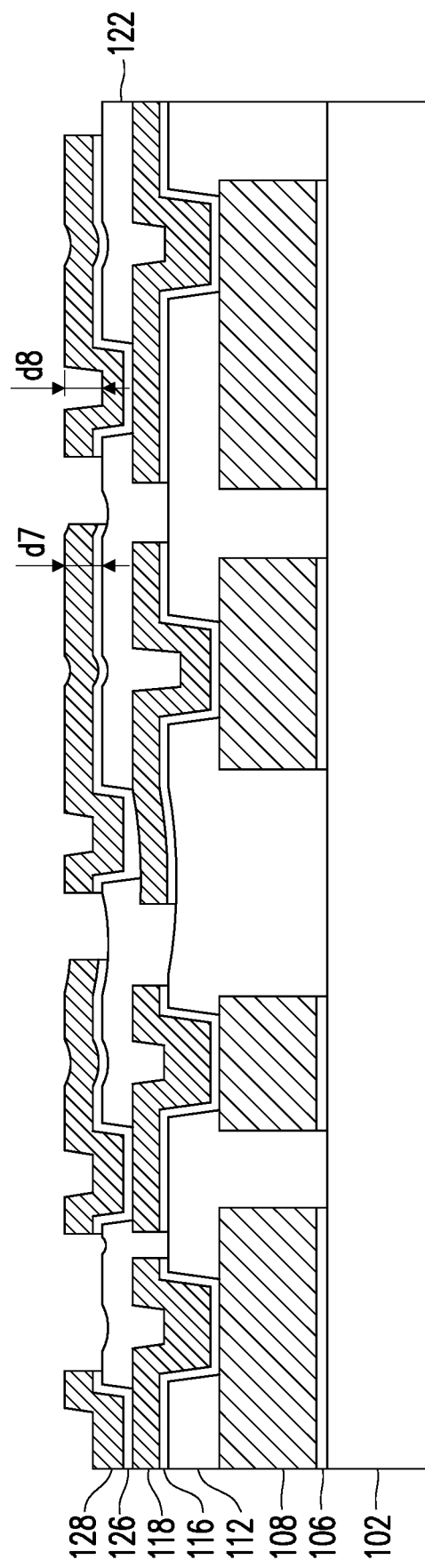

In FIG. 10, the seed layer 126 and conductive layer 128 may be formed in the openings 124 and extend along an upper surface of the insulating layer 122. The seed layer 126 and conductive layer 128 may be formed using processes and materials similar to those discussed above with respect to the seed layer 116 and the conductive layer 118, which are not repeated. The seed layer 126 and conductive layer 128 follow the shape of the openings 124, which may cause a portion of the conductive layer 128 to have an upper surface in the openings 124 which dips down into the openings 124 by a distance up to about half the thickness of the insulating layer 122 over the conductive layer 128. In some embodiments, the distance d8 may be greater than the thickness d7, for example, between 0 and (d7+(d5)/2). In other embodiments, the distance d8 may be less than the thickness d7.

Figure 11:
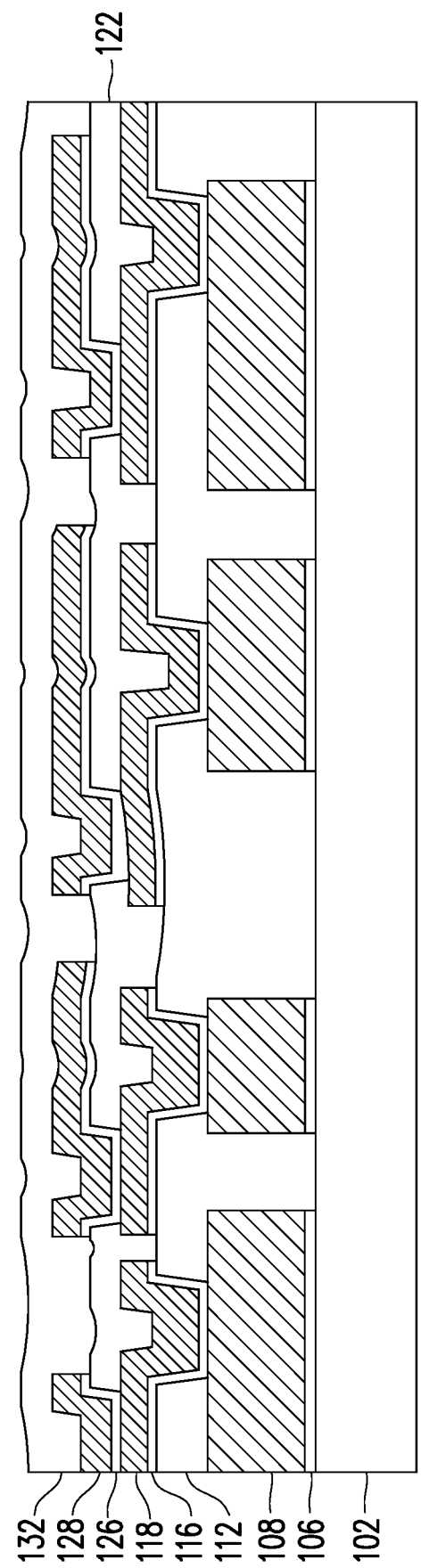

In FIG. 11, the insulating layer 132 may be deposited over the conductive layer 128 and insulating layer 122. In some embodiments, the insulating layer 132 may be an additional polymer like the insulating layer 112, and may be formed by materials and processes similar to those discussed above with respect to the insulating layer 112, though the material composition of the insulating layer 132 may be the same or different than that of the insulating layer 112. In other embodiments, the insulating layer 132 may be a condensation polymer like the insulating layer 122, and may be formed by materials and processes similar to those discussed above with respect to the insulating layer 122, though the material composition of the insulating layer 132 may be the same or different than that of the insulating layer 122.

Figure 12:
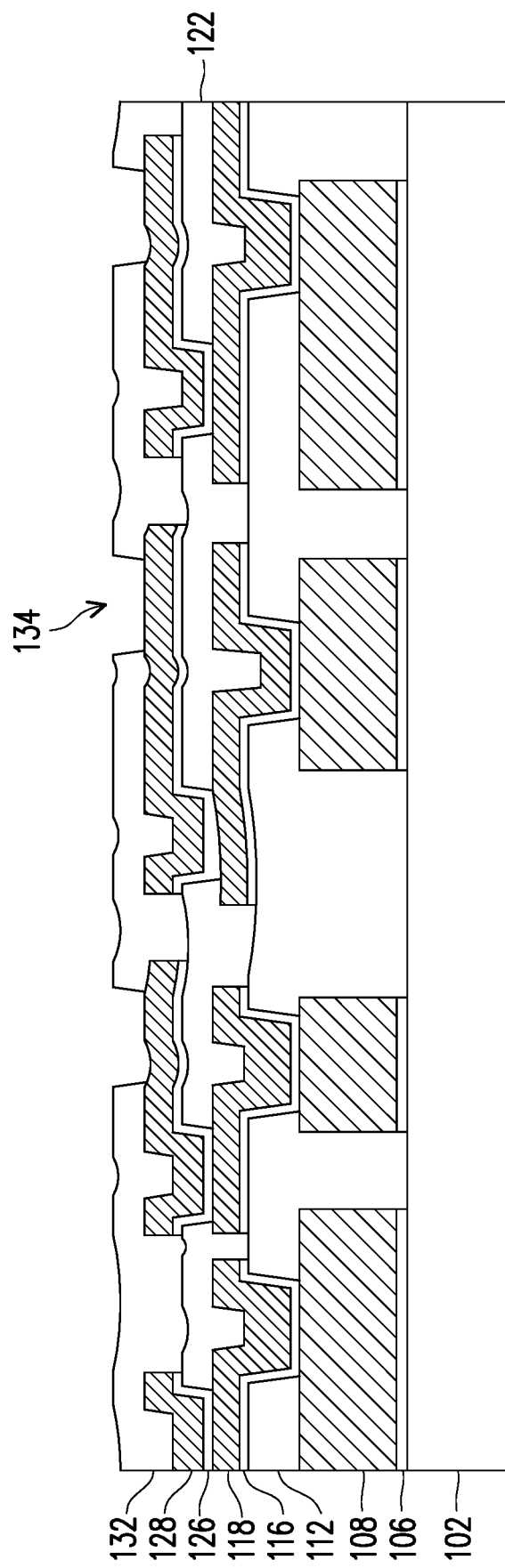

In FIG. 12, after the insulating layer 132 is formed, the insulating layer 132 is then photo patterned using an acceptable photolithography technique, such as by exposure, developing, and curing to form the openings 134 in the insulating layer 132 to reveal portions of the conductive layer 128. Although the openings 134 are illustrated as being tapered, the openings 134 may be rectangular, that is, having vertical sidewalls.

Figure 13:
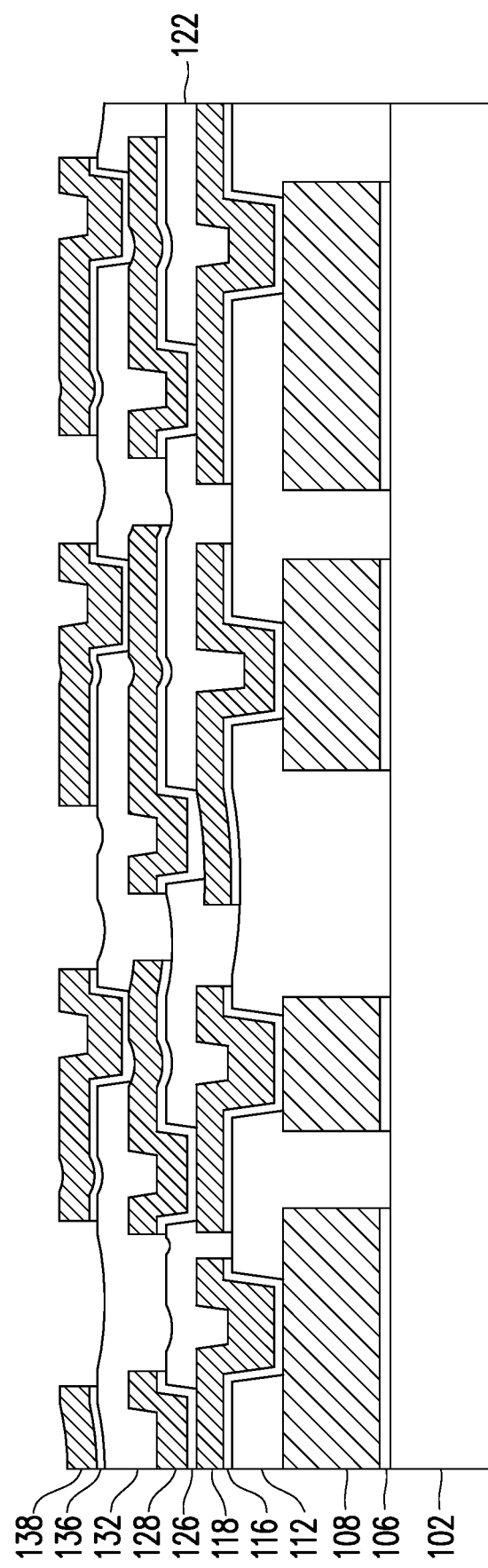

In FIG. 13, the seed layer 136 and conductive layer 138 may be formed in the openings 134 and extend along an upper surface of the insulating layer 132. The seed layer 136 and conductive layer 138 may be formed using processes and materials similar to those discussed above with respect to the seed layer 116 and the conductive layer 118.

Figure 14:
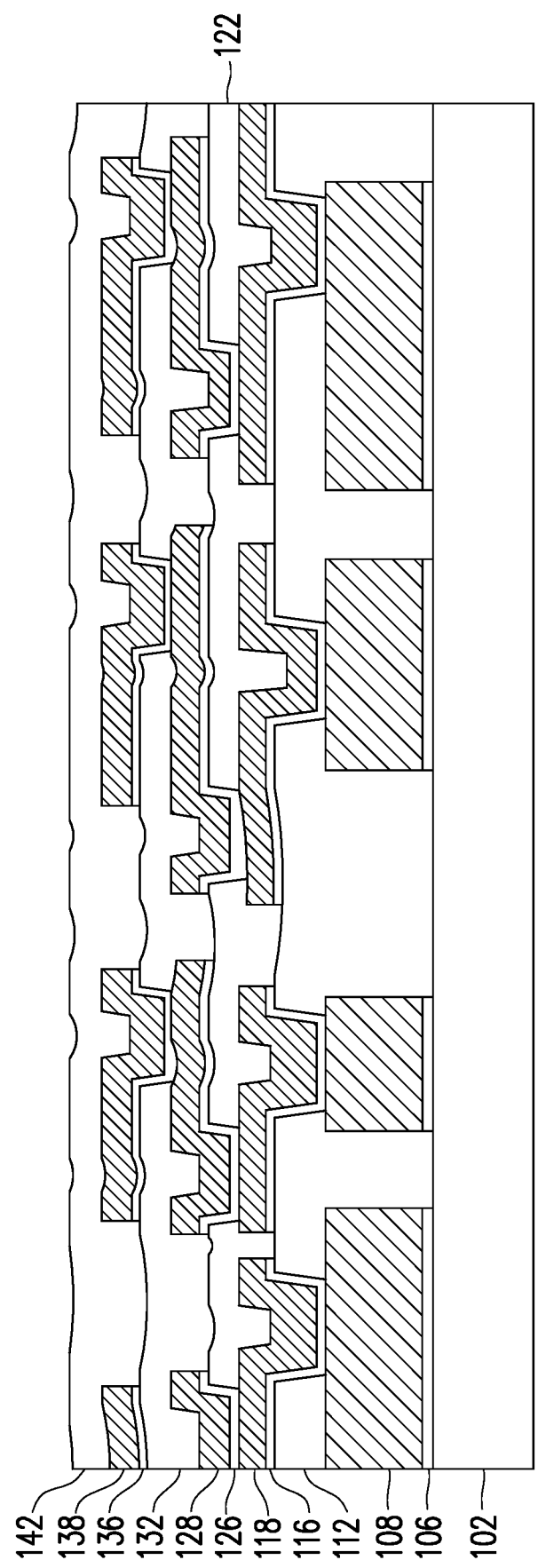

In FIG. 14, the insulating layer 142 may be deposited over the conductive layer 138 and insulating layer 132. In some embodiments, the insulating layer 142 may be an additional polymer like the insulating layer 112, and may be formed by materials and processes similar to those discussed above with respect to the insulating layer 112, though the material composition of the insulating layer 142 may be the same or different than that of the insulating layer 112. In other embodiments, the insulating layer 142 may be a condensation polymer like the insulating layer 122, and may be formed by materials and processes similar to those discussed above with respect to the insulating layer 122, though the material composition of the insulating layer 142 may be the same or different than that of the insulating layer 122.

Figure 15:
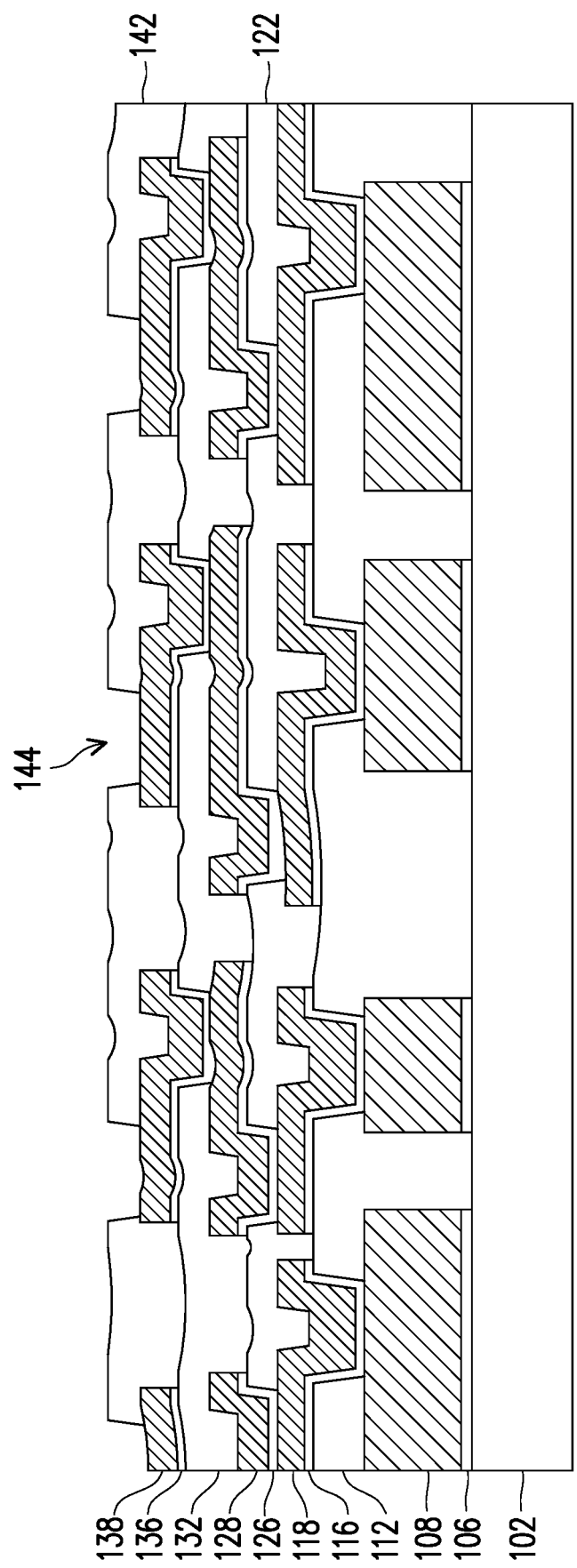

In FIG. 15, after the insulating layer 142 is formed, the insulating layer 142 is then photo patterned using an acceptable photolithography technique, such as by exposure, developing, and curing to form the openings 144 in the insulating layer 142 to reveal portions of the conductive layer 138. Although the openings 144 are illustrated as being tapered, the openings 144 may be rectangular, that is, having vertical sidewalls.

Figure 16:
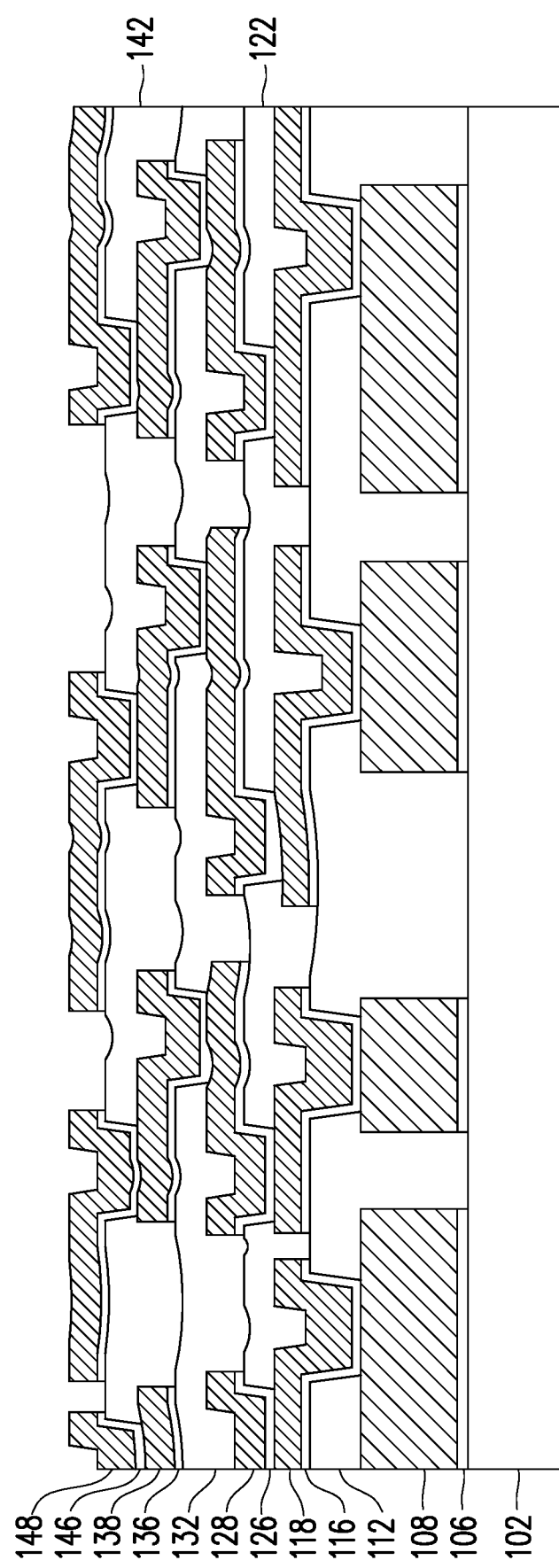

In FIG. 16, the seed layer 146 and conductive layer 148 may be formed in the openings 144 and extend along an upper surface of the insulating layer 142. The seed layer 146 and conductive layer 148 may be formed using processes and materials similar to those discussed above with respect to the seed layer 116 and the conductive layer 118.

Figure 17:
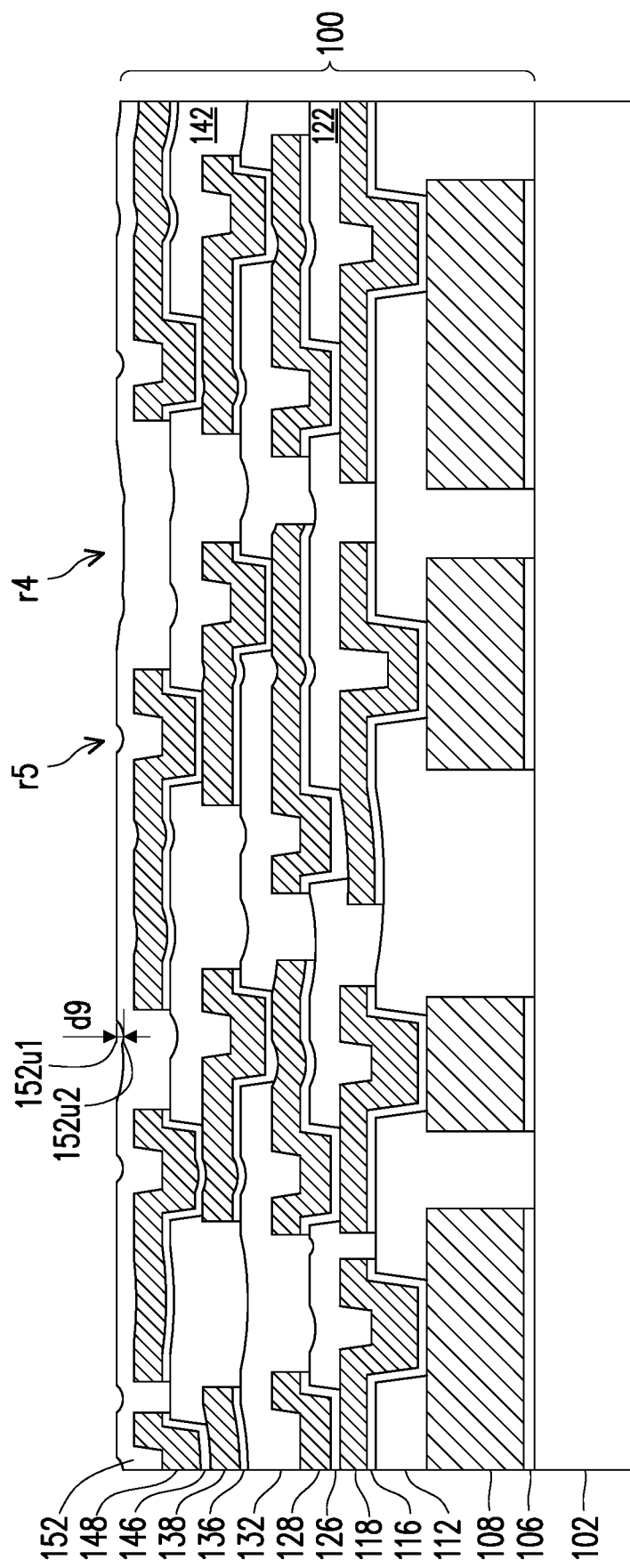

In FIG. 17, the insulating layer 152 may be deposited over the conductive layer 148 and insulating layer 142. In some embodiments, the insulating layer 152 may be an additional polymer like the insulating layer 112, and may be formed by materials and processes similar to those discussed above with respect to the insulating layer 112, though the material composition of the insulating layer 152 may be the same or different than that of the insulating layer 112. In other embodiments, the insulating layer 152 may be a condensation polymer like the insulating layer 122, and may be formed by materials and processes similar to those discussed above with respect to the insulating layer 122, though the material composition of the insulating layer 152 may be the same or different than that of the insulating layer 122.

The insulating layer 152 is illustrated as being a topmost insulating layer of the redistribution structure 100. It should be understood that more or fewer metallization patterns may be used in the redistribution structure 100 by repeating or omitting the processes above of patterning the insulating layer and depositing a seed layer and conductive layer. The redistribution structure 100 may be further processed as described below and as described in other embodiments to form connectors or other conductive features. An upper surface of the insulating layer 152 may include recesses r4 corresponding to recesses in the upper surface which represent recesses due to the thickness of the conductive layer (e.g., the combination seed layer 146 and conductive layer 148). The recesses r4 may also include recesses due to propagation of recesses in the upper surface of the underlying insulating layer (e.g., insulating layer 142). The upper surface of the insulating layer 152 may also include recesses r5 which correspond to an area of the underlying conductive layer (e.g., conductive layer 148) which extends through the underlying insulating layer (e.g., insulating layer 142) and contacts another underlying conductive layer (e.g., conductive layer 138). These recesses are similar to the recesses r2 and the recesses r3, discussed above. The upper surface of the insulating layer 152 may therefore be wavy, due to the recesses r4 and the recesses r5.

In FIG. 17, one measure of the waviness of the topmost insulating layer 152 is the distance d9 between the average peak 152$u$1 of the upper surface of the insulating layer 152 and the average valley 152$u$2 of the upper surface of the insulating layer 152 may be between about 3 μm and about 5 μm. The waviness of the various layers of the redistribution structure is similar to the waviness of the topmost insulating layer 152. Waviness in a redistribution structure is generally undesirable because it increases the possibility of delamination, metallization shorts and breaks, and patterning focus errors. In the embodiments described herein, however, the waviness is controlled by the selection of the material of the insulating layers, the thicknesses of the underlying metallization patterns, and the deposition techniques employed. As a result, a separate planarization process is not needed after formation of each insulating layer (e.g., insulating layers 112, 122, 132, 142, and 152. And because a planarization process is omitted, extra material need not be deposited for the insulating layers which would be needed to provide margin for the planarization processes. Advantageously, therefore, the thickness of the redistribution structure may be less and the extra steps of the planarization processes may be omitted.

Figure 18:
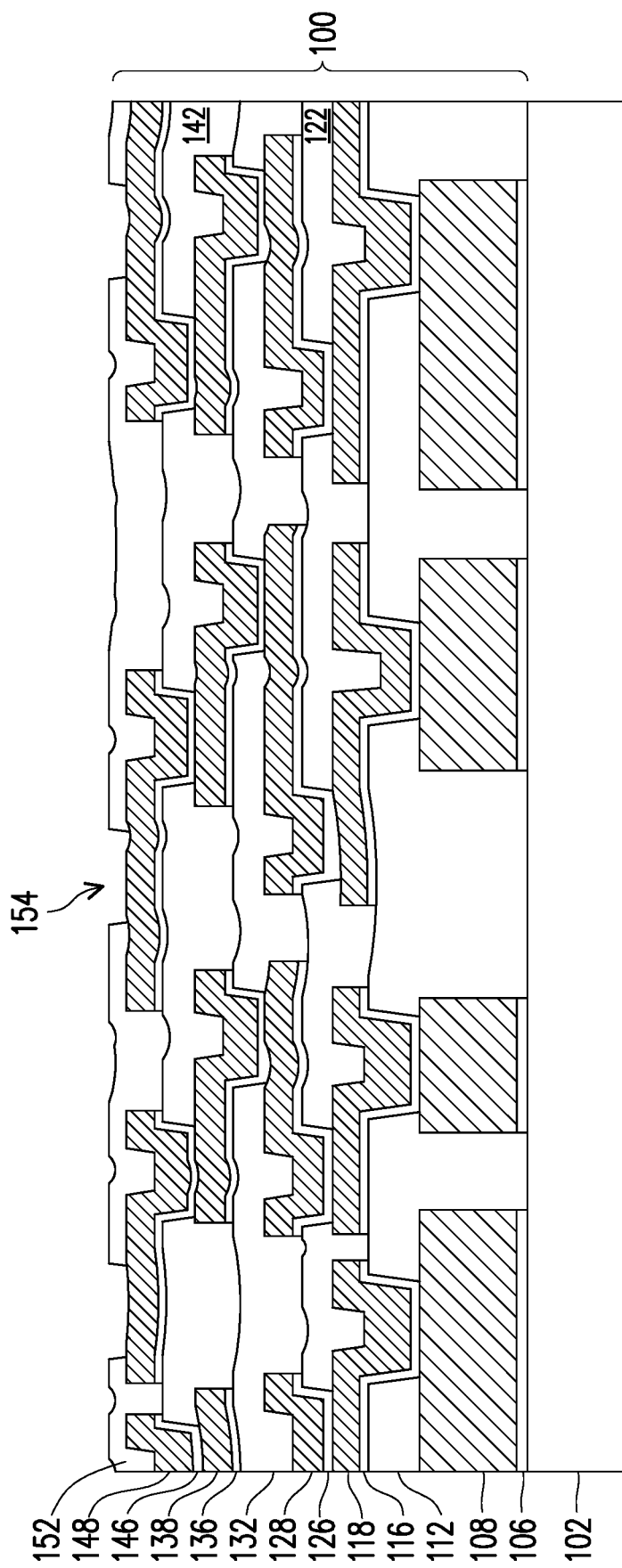
Figure 19:
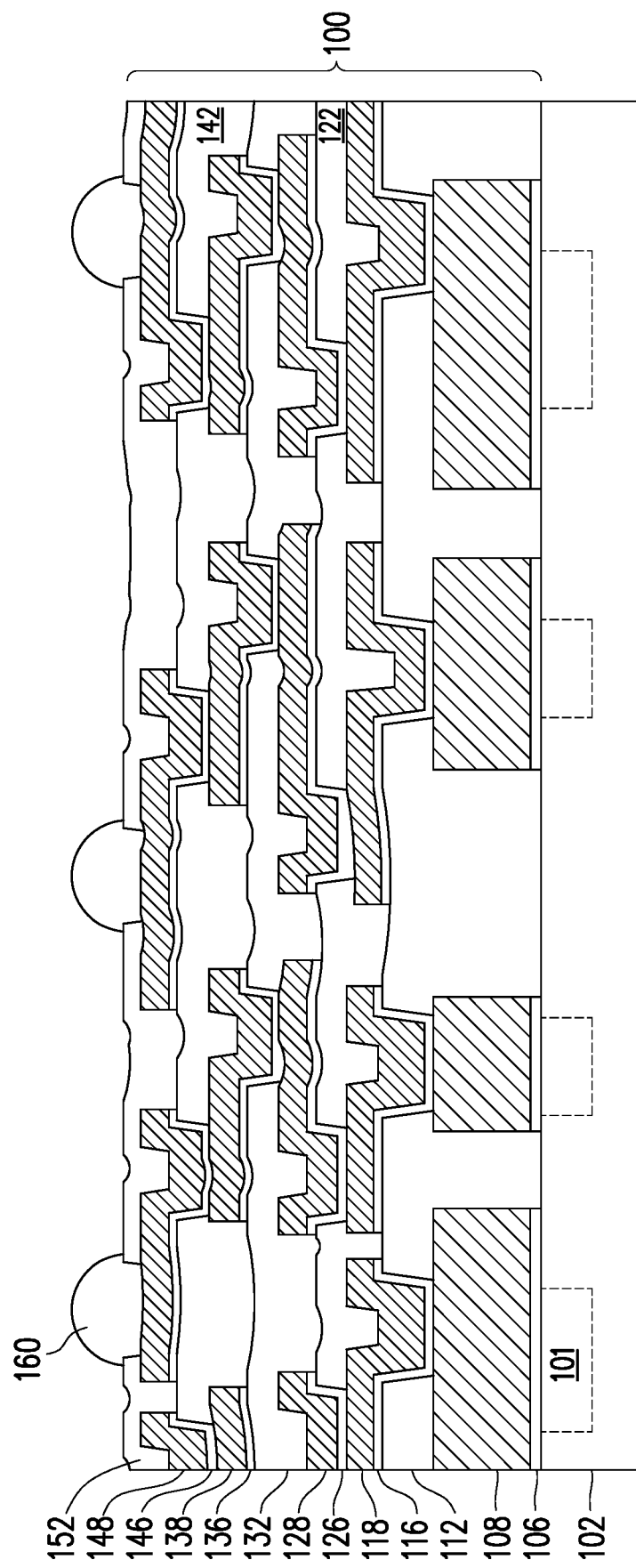

In FIG. 18, after the insulating layer 152 is formed, the insulating layer 152 is then photo patterned using an acceptable photolithography technique, such as by exposure, developing, and curing to form the openings 154 in the insulating layer 152 to reveal portions of the conductive layer 148. Although the openings 154 are illustrated as being tapered, the openings 154 may be rectangular, that is, having vertical sidewalls.

In FIG. 19, conductive connectors 160 are formed in the openings 154. In some embodiments, the conductive connectors 160 may be formed on under bump metallization structures (UBMs) (see, e.g., UBMs 394 in FIG. 51) first formed in the openings 154. In such embodiments, UBMs may be formed for external connection to the front-side of the redistribution structure 100. The UBMs may have bump portions on and extending along the major surface of the insulating layer 152, and have via portions extending through the insulating layer 152 to physically and electrically couple the conductive layer 148. As a result, the UBMs are electrically coupled through the various conductive layers 148 to conductive features 101 in the substrate 102, which may be coupled to devices in the substrate 102. The UBMs may be formed of the same material as the seed layer 146 and/or conductive layer 148. In some embodiments, the UBMs have a different size (e.g., thickness) than the metallization patterns corresponding to the conductive layers 108, 118, 128, 138, 148, and so forth.

The conductive connectors 160 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 160 may include a conductive material such as solder, copper, aluminum, gold, nickel, silver, palladium, tin, the like, or a combination thereof. In some embodiments, the conductive connectors 160 are formed by initially forming a layer of solder through evaporation, electroplating, printing, solder transfer, ball placement, solder paste, or the like. Once a layer of solder has been formed on the structure, a reflow may be performed in order to shape the material into the desired bump shapes. In another embodiment, the conductive connectors 160 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

The resulting redistribution structure 100 may be used and combined in various packages and devices, such as described below with respect to the subsequent embodiments. The redistribution structure 100 advantageously uses an extremely high shrinkage insulating material over a thick metal conductive layer without the need for planarization processes to achieve a final insulating layer which is only 25% to 50% thicker than the thickness of the thick metal conductive layer, providing excellent signal transfer capability, reliability, and heat dissipation, using simplified processes. Additional insulating layers of the redistribution structure 100 also exhibit good planarity due to high shrinkage and filler less composition.

Figure 27:
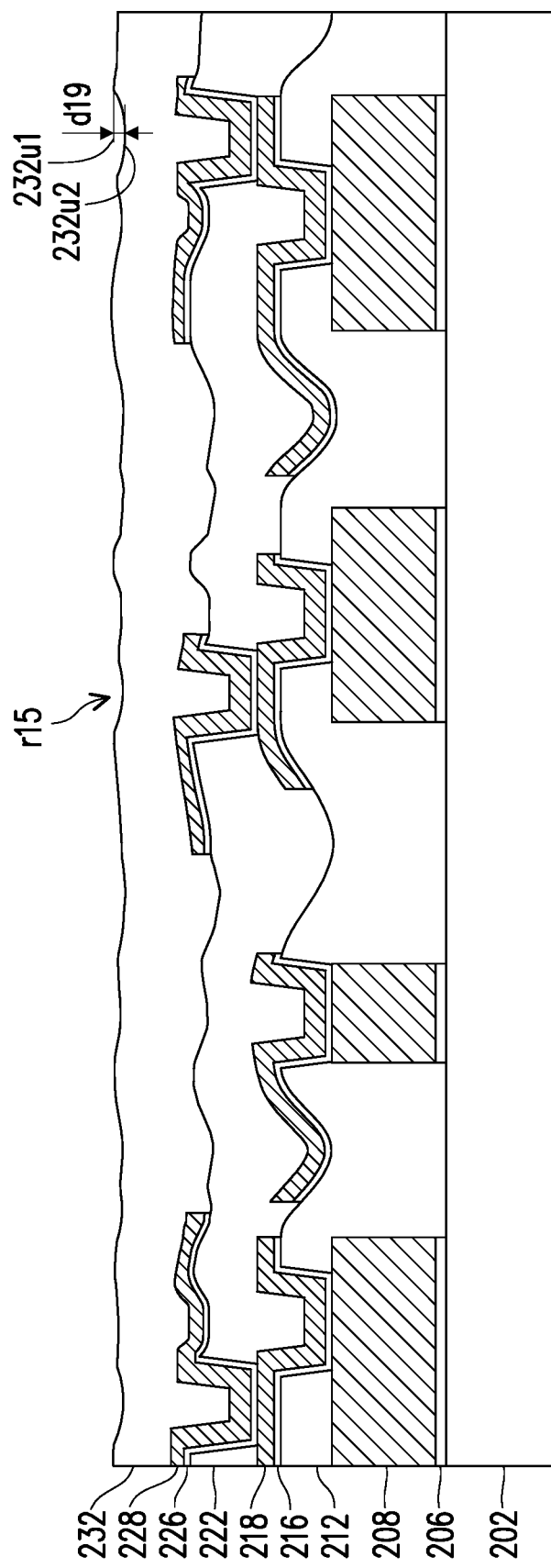
Figure 28:
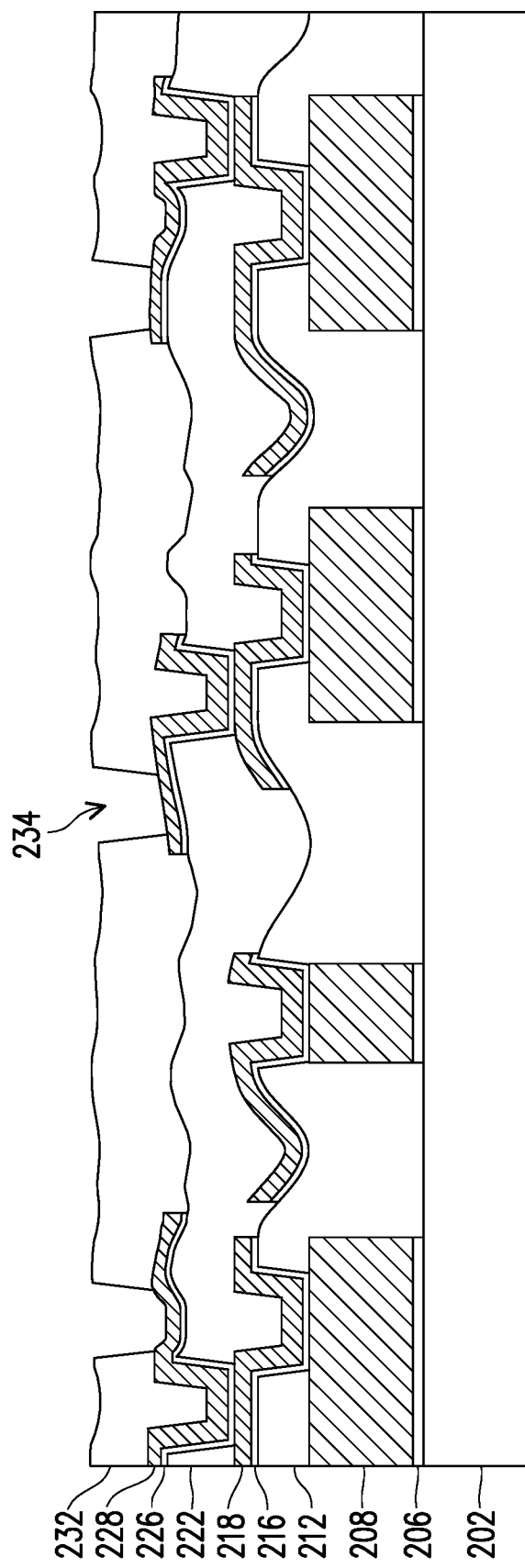
Figure 29:
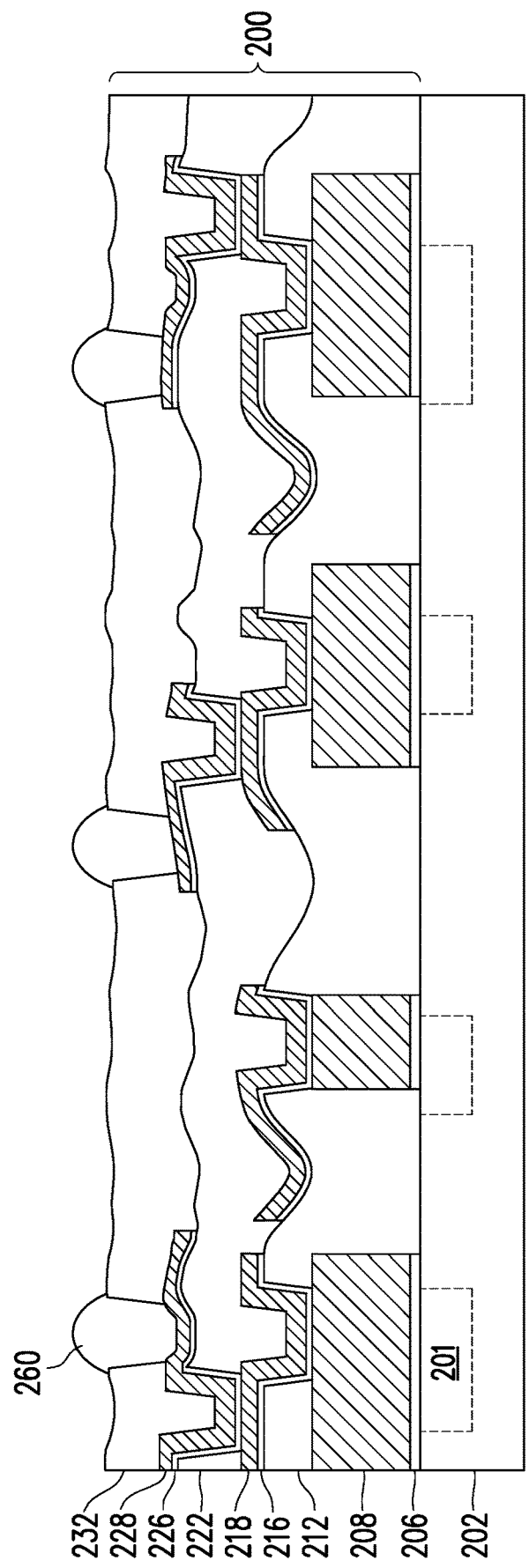

FIGS. 20 through 29 illustrate intermediate stages of forming a redistribution structure 200, in accordance with some embodiments. FIGS. 20 through 29 use reference numbers which are similar to those used in FIGS. 1 to 19, except that the leading '1' in the number '1xx' is replaced with a '2' in a corresponding number '2xx'. Like reference numbers indicate like elements in FIGS. 20 through 29, except where otherwise noted. Referring briefly to FIG. 29, the redistribution structure 200 serves to electrically couple conductive features 201 in the substrate 202 to other conductive features 201 in the substrate 202 and to electrically couple conductive features 201 in the substrate 202 to conductive connectors 260. The redistribution structure 200 includes insulating layers 212, 222, and 232 and metallization patterns containing conductive layers 208, 218, and 228. The metallization patterns may also be referred to as redistribution layers or redistribution lines. The redistribution structure 200 is shown as an example having three layers of metallization patterns. More or fewer dielectric layers and metallization patterns may be formed in the redistribution structure 200. If fewer dielectric layers and metallization patterns are to be formed, steps and process discussed below may be omitted. If more dielectric layers and metallization patterns are to be formed, steps and processes discussed below may be repeated.

Figure 20:
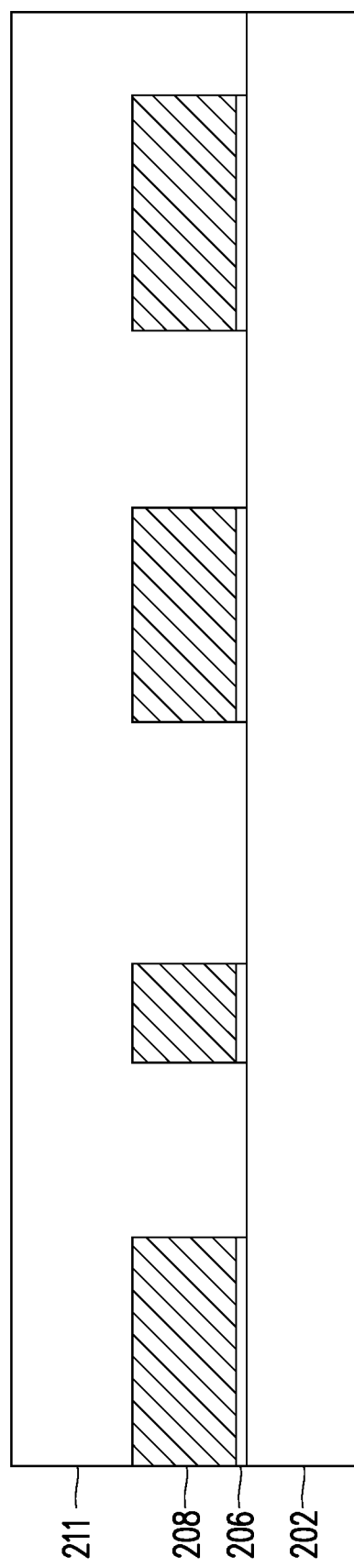
FIGS. 20 through 30 illustrate intermediate processes in the formation of a redistribution structure, in accordance with some embodiments.

FIG. 20 illustrates a substrate 202, seed layer 206, and conductive layer 208 which may be formed using processes and materials similar to those discussed above with the substrate 102, seed layer 106, and conductive layer 108, respectively, such as illustrated in FIG. 3. In FIG. 20, however, the insulating material 211 is formed from a different material than the insulating material 111 of insulating layer 112 illustrated in FIGS. 4 and 5. In particular, the insulating layer 212 may be formed using a condensation polymer which is described above for the insulating layer 122. The insulating material 211 may be a varnish type of insulating material rather than a dry type of insulating material. The insulating material 211 may be a resin only, that is, the resin may be free of filler material. For example, the insulating material 211 may be a condensation polymer, such as polyimide (PI), polybenzoxazine (PBO), nylon, the like, or combinations thereof. The molecular weight of the insulating material 211 may be less than 25000 g/mol, such as between about 15000 g/mol and 25000 g/mol. The solid content of the resin may be greater than 40%, such as between about 40% to about 60%. The shrinkage rate of the insulating material 211 may be between about 65% and 80%, such as between about 68% and 75%. In other words, the insulating layer 122 may lose 20% to 35% of the thickness of the material of the insulating layer 122 while curing from the as-deposited state to the cured state. The insulating material 211 may be deposited using any technique, such as spin coating, screen printing, spray coating, the like, or combinations thereof. As a result of the deposition technique an upper surface of the insulating material 211 just after deposition may have a high degree of planarity, i.e., may be flat. Thus, the thickness of the insulating material 211 just after deposition varies due to the underlying conductive layer 208. The insulating material 211 may be deposited to a thickness between about 7 μm to about 25 μm more than the thickness of the underlying conductive layer 208.

Figure 21:
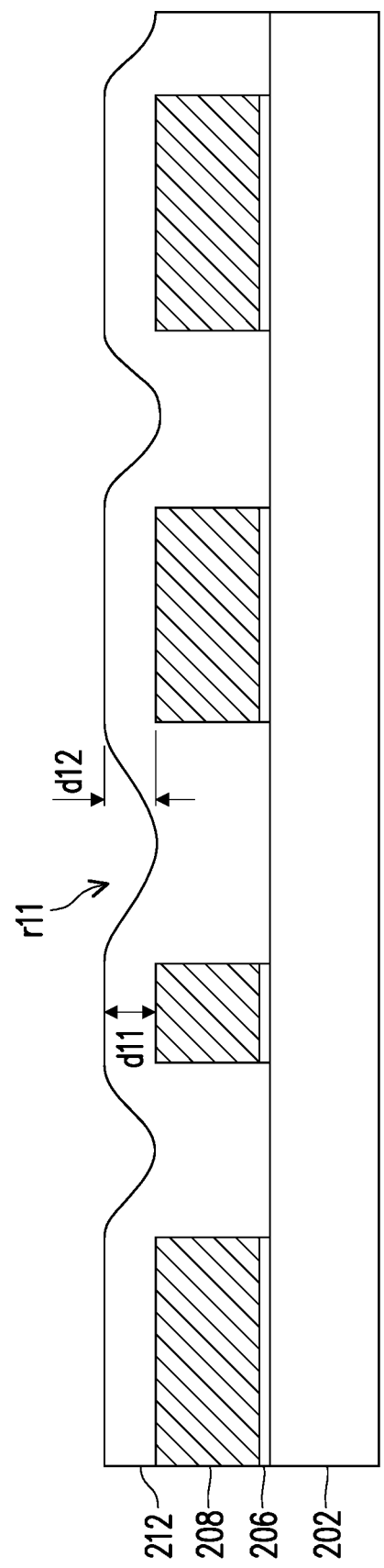

In FIG. 21, the insulating material 211 cures and shrinks into the insulating layer 212. Because the insulating material 211 will shrink by 20% to 35%, as the insulating material 211 shrinks after application into the insulating layer 212, the combination of the shrinkage rate, filler-free design, molecular weight, and solid content tends to project attenuated versions of the conductive layer 208 to the upper surface of the insulating layer 212 to form a wavy upper surface of the insulating layer 212. These attenuated projections project at a rate of about one to three, or in other words for every 3 µm of variation, about 1 µm of it is projected to the surface of the insulating layer 212 (give or take 50%). Although the insulating material of the insulating material 211 may be planar as deposited, after curing, the insulating layer 212 may have an upper surface which is somewhat conformal to the underlying features. The conductive layer 208 may be relatively thick, for example, being about twice the thickness of the insulating layer 212 over the conductive layer 208. As such, the shrinkage between portions of the conductive layer 208 may be prominent, including shrinking to have an upper surface which dips below the level of the upper surface of the conductive layer 208. Even if the upper surface of the insulating layer 212 did not dip below the level of the upper surface of the conductive layer, it would be difficult to reliably planarize the upper surface of the insulating layer 212 due to the lack of margin in the thickness of the insulating layer 212. Therefore, rather than planarize the upper surface of the insulating layer 212, as noted in the subsequent processes described below, the subsequent metallization patterns are formed directly on the wavy upper surface of the insulating layer 212.

The thickness d11 of the insulating material over the conductive layer 208 may be between about 5 µm and about 10 µm. In other words, the thickness d11 of the insulating layer 212 may be between about 25% and 50% of the thickness of the combined conductive layer 208 and seed layer 206. The relatively thin insulating layer 212 over the thick metal conductive layer 208 reduces transmittance loss and increases power efficiency. The illustrated process advantageously provides an insulating layer 212 which is 25% to 50% of the thickness of the underlying metallization (seed layer 106 and conductive layer 108) without the need for any additional planarization processes. Also, where planarization is performed, there are marks left as a result of the planarization process. However, in the present embodiments, there are not planarization marks on the insulating layer 212 (and subsequent insulating layers).

Where the insulating layer 212 fills the spaces laterally surrounding the conductive layer 208, recesses r11 may be formed in the upper surface of the insulating layer 212. The recesses r11 may have a depth d12 between 75% to 125% of the thickness d11, such as between 5 µm to about 12.5 µm. The recesses r11 may have a depth d12 between 25% to 65% of the thickness of the conductive layer 108, such as between 5 µm to about 13 µm.

The recesses r11 cause a wavy top surface of the insulating layer 212 due to the thick metallization of conductive layer 208 and the shrinkage rate of the insulating layer 212. The insulating material 211 of the insulating layer 212 may have a shrinkage rate, as noted above, of between 65% and 80%, such as between 68% and 75%. As such, the amount of insulating material 211 that surrounds the conductive layer 208 is subject to a greater difference in shrinkage than the insulating material 211 that is directly over the conductive layer 208. It is desirable to keep the distance d11 thin to achieve a reduction in transmittance loss and to increase power and heat dissipation efficiency.

Even though the top surface of the insulating layer 212 is wavy, the top surface is not planarized and is instead allowed to stay wavy. Because the subsequent conductive layers are deposited more thinly, the waviness of the insulating layer 212 can remain. The waviness of the insulating layer 212 will propagate to the subsequent layers of the redistribution structure, however, the distance between a high point and low point of the subsequently formed insulating layers will attenuate and the propagation will lessen with each subsequent layer.

Figure 22:
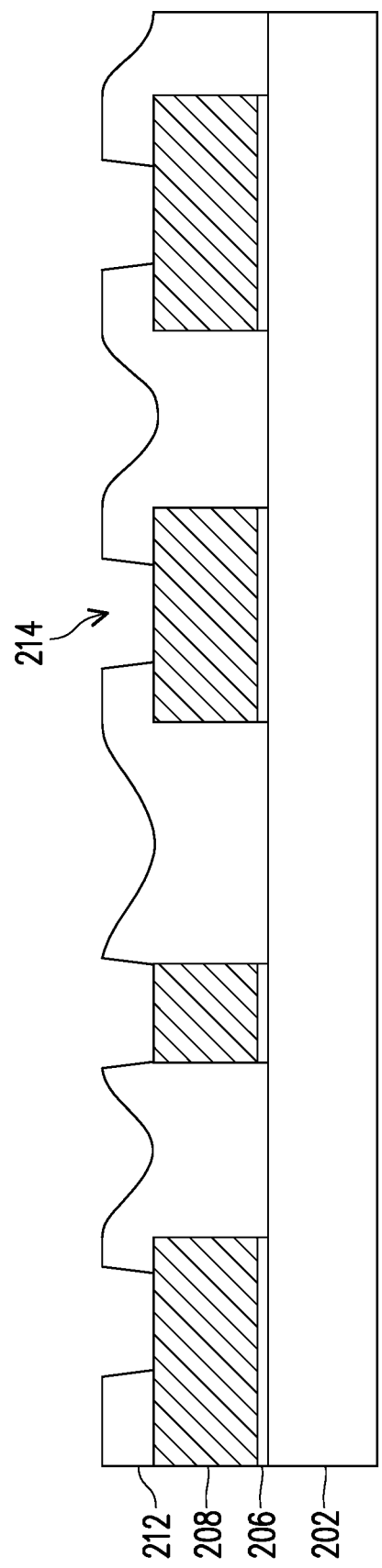

In FIG. 22, after the insulating layer 212 is formed, the insulating layer 212 is then photo patterned using an acceptable photolithography technique, such as by exposure, developing, and curing to form the openings 214 in the insulating layer 212 to reveal portions of the conductive layer 208. Although the openings 214 are illustrated as being tapered, the openings 214 may be rectangular, that is, having vertical sidewalls.

Figure 23:
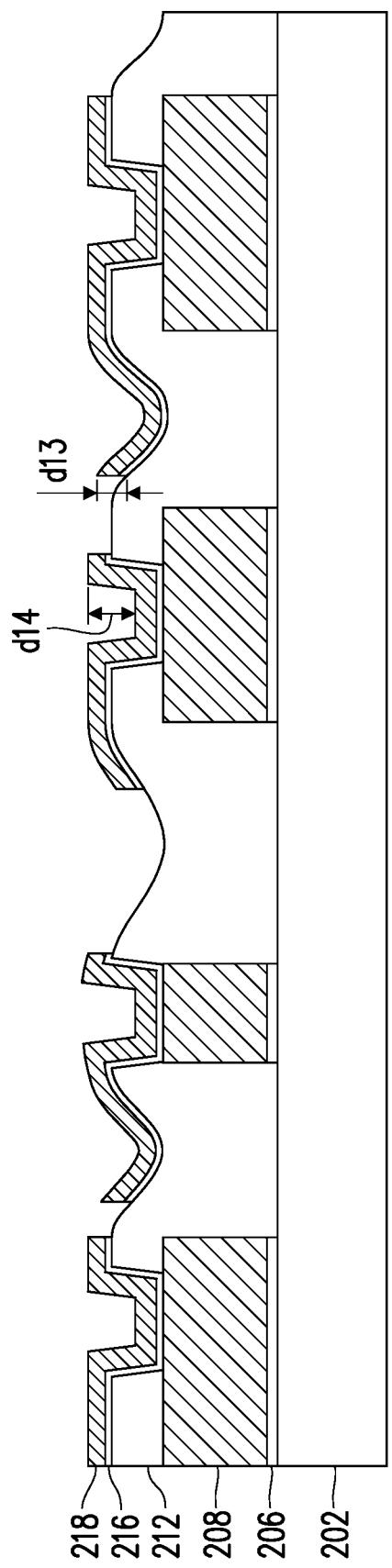

In FIG. 23, a metallization pattern is formed which includes conductive elements, such as the seed layer 216 and conductive layer 218 extending along the major surface of the insulating layer 212 and extending through the insulating layer 212 to physically and electrically couple to conductive layer 208. The seed layer 216 and conductive layer 218 may be formed using processes and materials similar to the seed layer 116 and conductive layer 118, discussed above with respect to FIG. 7.

The thickness d13 of the combined seed layer 216 and conductive layer 218 may be between about 15% and 35% of the thickness of the conductive layer 208. In other words, the thickness of the metallization pattern for conductive layer 208 may be between 3 to 5 times thicker than the thickness d13. In some embodiments, the conductive layer 218 may be used for routing signals which are not as sensitive to attenuation as the signals routed in the conductive layer 208. The reduced thickness as compared to the conductive layer 208 helps reduce overall device thickness as well as control heat dissipation. The reduced thickness of the conductive layer 218 also helps contribute to improving planarity of the top layer of the redistribution structure, without the need of a planarization process, such as described below. In some embodiments, the thickness d13 of the combined seed layer 216 and conductive layer 218 may be between 3 µm and about 8 µm. The seed layer 216 and conductive layer 218 follow the shape of the openings 214, causing a portion of the conductive layer 218 to have an upper surface in the openings 214 which dips down into the openings 214 by a distance d14 up to about half the thickness of the insulating layer 212 over the conductive layer 218. In some embodiments, the distance d14 may be greater than the thickness d13, for example, between 0 and (d13+(d11)/12). In other embodiments, the distance d14 may be less than the thickness d13.

The metallization pattern also follows the contours of the wavy upper surface of the insulating layer 212. Each of the metallization patterns corresponding to the conductive layer 218 is thinner than the distance d12 and has sufficient lateral separation to prevent the conductive layers 218 from merging.

Figure 24:
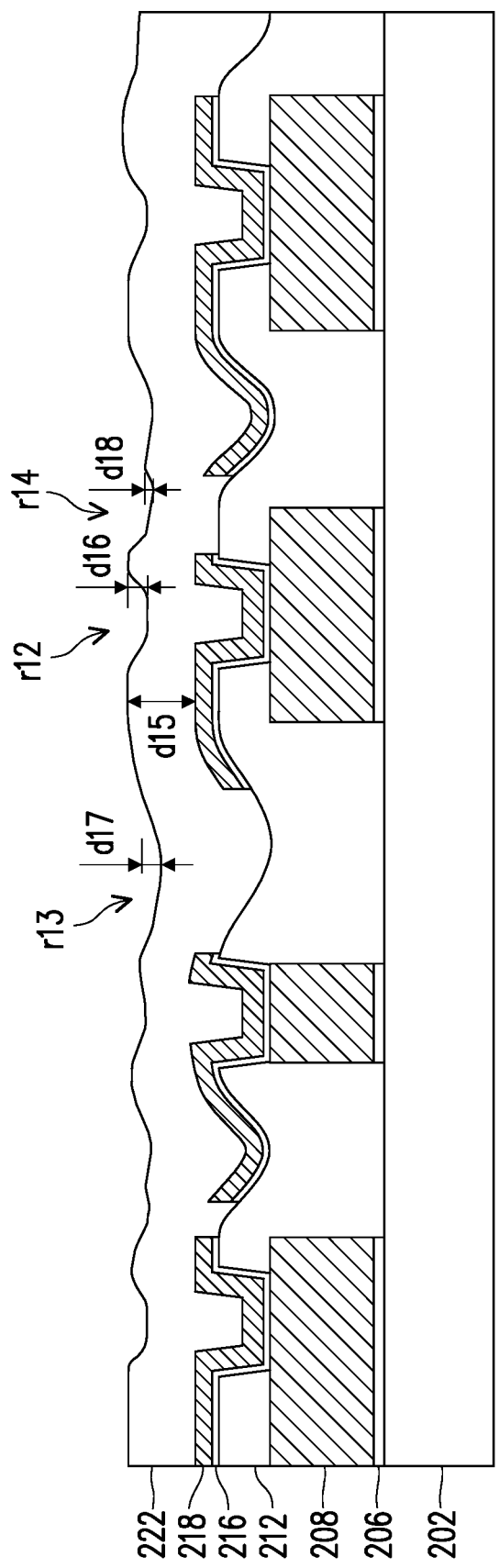

In FIG. 24, insulating layer 222 is deposited over the conductive layer 218 and over portions of the insulating layer 212. In some embodiments, the insulating layer 222 may be a condensation polymer such as the insulating layer 212 and may be formed using materials and processes such as those discussed above with respect to the insulating layer 212, such as illustrated in FIG. 24, though the material composition of the insulating layer 222 may be different than the material composition of the insulating layer 212. In other embodiments, the insulating layer 222 may be an additional polymer, similar to the insulating layer 112 and may be formed using materials and processes as those discussed above with respect to the insulating layer 112. As a result of the deposition technique, an upper surface of the insulating material of the insulating layer 222 just after deposition may have a high degree of planarity, i.e., may be flat. Thus, the thickness of the insulating material of the insulating layer 222 varies due to the underlying conductive layer 218 and the wavy surface of the insulating layer 212.

The insulating layer 222 may be deposited thickly to a thickness between about 15 µm to about 70 µm. As the material of the insulating layer 222 cures and shrinks, the underlying topography will begin to project to the surface of the insulating layer 222. However, because the shrinkage rate of the material of the insulating layer 222 is between 65% and 80%, such as between about 68% and 75%, as the material of the insulating layer 222 shrinks after application (losing between 20% to 35% of the thickness as deposited), the combination of the shrinkage rate, filler-free design, molecular weight, and solid content will mute the projections of the underlying layer. In other words, the topography of the upper surface of the insulating layer 222 after curing will be flatter than corresponding topography of the upper surface of the insulating layer 212. An example of this muting effect is discussed below.

After the insulating material of the insulating layer 222 shrinks into its final form as the insulating layer 222, the thickness d15 of the insulating layer 222 over the conductive layer 218 may be between about 5 µm and about 20 µm. The illustrated process advantageously provides the insulating layer 222 which is 50% to 200% of the thickness of the underlying metallization (seed layer 216 and conductive layer 218) without the need for any additional planarization processes.

Where the insulating layer 222 fills the spaces laterally surrounding the conductive layer 218, various recesses may be formed in the upper surface of the insulating layer 222. The recesses r12 correspond to the area of the metallization corresponding to the conductive layer 218 which is used as a via, extending through the insulating layer 222 and contacting the conductive layer 208. The depth d16 of the recess r12 may correspond to the topography of the underlying conductive layer 218, but may be muted. For example, the depth d16 may be about 20% to 40% the depth d14, such as between 1 µm and 4 µm. The recesses r13 correspond to the area of the insulating layer 222 which has waviness corresponding to the underlying topography of the insulating layer 212 without any of the conductive layer 218 interposed between the top of the insulating layer 212 and the top of the insulating layer 222. The depth d17 of the recess r13 thus corresponds to the depth d12 of the recess r11 of FIG. 21. However, due to the material of the insulating layer 222, the projection of the recess r11 is muted in the insulating layer 222. For example, the depth d17 may be about 20% to 40% of the depth d12, such as between 1 µm and 3 µm. The recesses r14 correspond to the area of the insulating layer 222 which has waviness corresponding to a transition between the underlying topography of the insulating layer 212 and the underlying topography of the conductive layer 218. The depth d18 of the recess r14 thus corresponds to the thickness d13 of the metallization of the conductive layer 218. However, due to the material of the insulating layer 222, the projection of the thickness of the conductive layer 218 is muted in the insulating layer 222. For example, the depth d18 may be about 20% to 40% of the thickness d13, such as between 0.5 µm and 1.5 µm.

Even though the upper surface of the insulating layer 222 is wavy, the waviness is less than the waviness of the insulating layer 212. Thus, a separate planarization process is not performed before depositing additional conductive lines, thereby saving time and resources. This results in an upper surface of the insulating layer 222 which has waviness.

Figure 25:
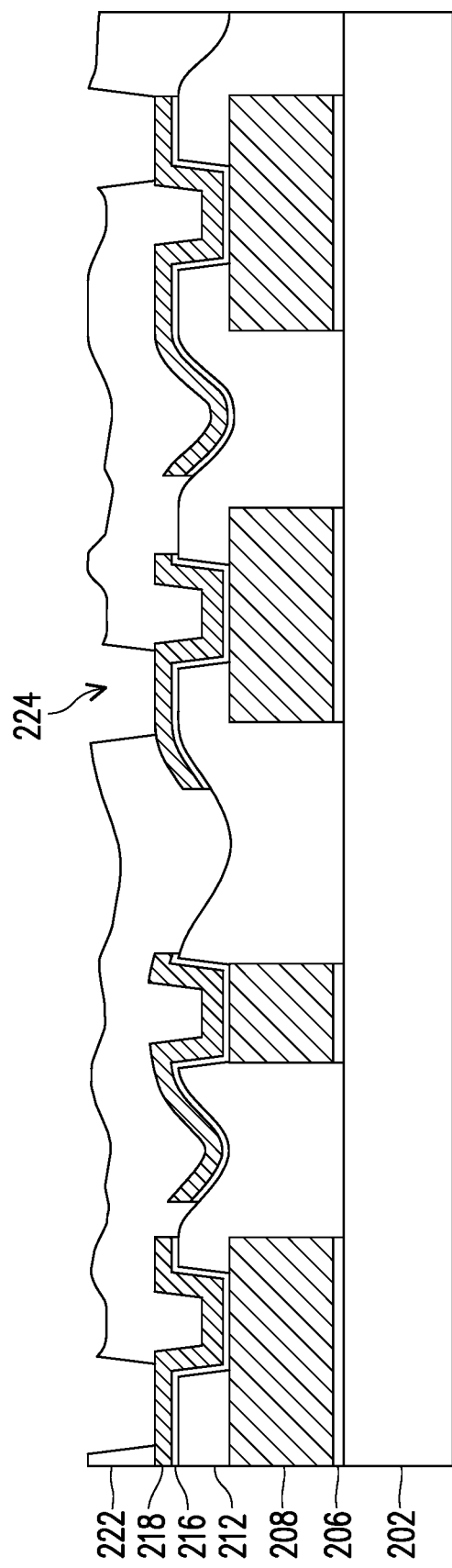

In FIG. 25, after the insulating layer 222 is formed, the insulating layer 222 is then photo patterned using an acceptable photolithography technique, such as by exposure, developing, and curing to form the openings 224 in the insulating layer 222 to reveal portions of the conductive layer 218. Although the openings 224 are illustrated as being tapered, the openings 224 may be rectangular, that is, having vertical sidewalls.

Figure 26:
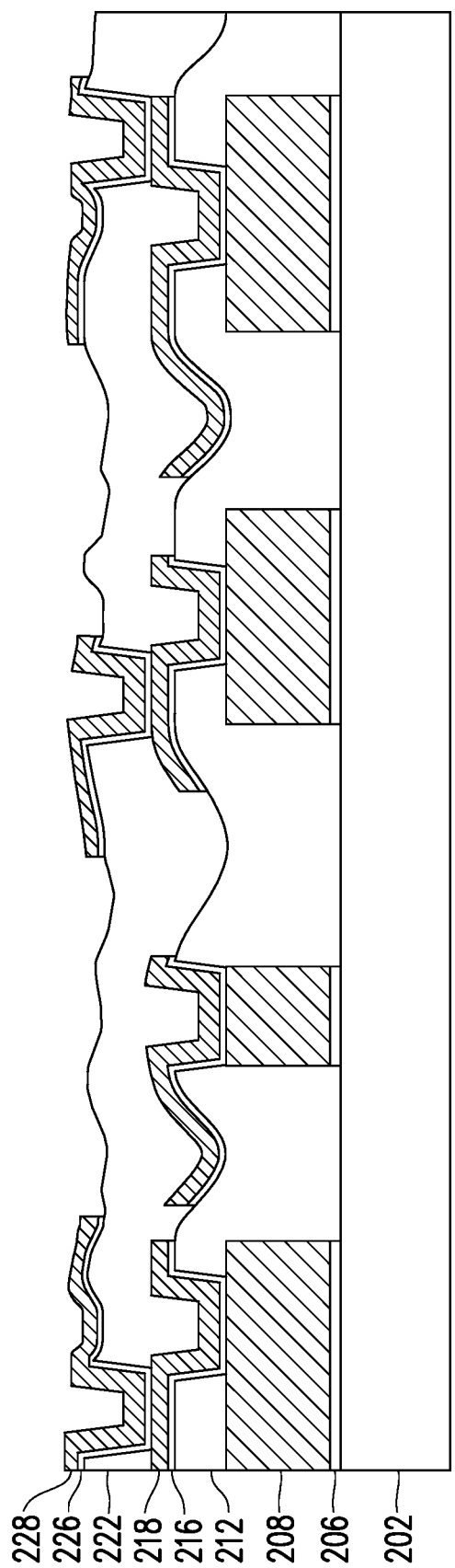

In FIG. 26, the seed layer 226 and conductive layer 228 may be formed in the openings 224 and extend along an upper surface of the insulating layer 222. The seed layer 226 and conductive layer 228 may be formed using processes and materials similar to those discussed above with respect to the seed layer 216 and the conductive layer 218, which are not repeated. The seed layer 226 and conductive layer 228 follow the shape of the openings 224, which may cause a portion of the conductive layer 228 to have an upper surface in the openings 224 which dips down into the openings 224 by a distance up to about half the thickness of the insulating layer 222 over the conductive layer 228, with dimensions similar to those discussed above with respect to FIG. 23.

In FIG. 27, the insulating layer 232 is deposited over the conductive layer 228 and over portions of the insulating layer 222. In some embodiments, the insulating layer 232 may be a condensation polymer such as the insulating layer 212 and may be formed using materials and processes such as those discussed above with respect to the insulating layer 212, as illustrated in FIG. 27, though the material composition of the insulating layer 232 may be different than the material composition of the insulating layer 212. In other embodiments, the insulating layer 232 may be an additional polymer, similar to the insulating layer 112 and may be formed using materials and processes as those discussed above with respect to the insulating layer 112.

For reasons similar to those discussed above with respect to FIG. 24, the projections of the topography from the underlying insulating layer 222 and the metallization corresponding to the conductive layer 228 will be further muted in the upper surface of the insulating layer 232. As a result, each successive layer of the redistribution structure 200 generally has a flatter upper surface than the previous one. For example, in some embodiments, the difference between the peak height and lowest valley of the insulating layer 212 is between about 1 µm and 16 µm, whereas, in some embodiments, the difference between the peak height and lowest valley of the insulating layer 222 is between about 1 µm and 8 µm, and in some embodiments, the difference between the peak height and lowest valley of the insulating layer 232 is between about 0.5 µm and 4 µm, though other values are contemplated.

The insulating layer 232 is illustrated as being a topmost insulating layer of the redistribution structure 200. It should be understood that more or fewer metallization patterns may be used in the redistribution structure 200 by repeating or omitting the processes above of patterning the insulating layer and depositing a seed layer and conductive layer. The redistribution structure 200 may be further processed as described below and as described in other embodiments to form connectors or other conductive features. An upper surface of the insulating layer 232 may include recesses r15 corresponding to recesses propagating from the underlying features. The recesses r15 may include recesses due to propagation of the thickness of the conductive layer (e.g., the combination seed layer 226 and conductive layer 228; see, e.g., recesses r14 of FIG. 24); recesses due to propagation of recesses in the upper surface of the underlying insulating layer (e.g., insulating layer 222; see, e.g., recesses r13 of FIG. 24); and recesses due to propagation of an area of the underlying conductive layer (e.g., conductive layer 228; see, e.g., recesses r12 of FIG. 24) which extends through the underlying insulating layer (e.g., insulating layer 222) and contacts another underlying conductive layer (e.g., conductive layer 218). The upper surface of the insulating layer 232 may therefore be wavy, due to the recesses r15.

In FIG. 27, one measure of the waviness of the topmost insulating layer 232 is the distance d19 between the average peak 232$u$1 of the upper surface of the insulating layer 232 and the average valley 232$u$2 of the upper surface of the insulating layer 232 may be between about 3 μm and about 5 μm. The waviness of the various layers of the redistribution structure is similar to the waviness of the topmost insulating layer 232. Waviness in a redistribution structure is generally undesirable because it increases the possibility of delamination, metallization shorts and breaks, and patterning focus errors. In the embodiments described herein, however, the waviness is controlled by the selection of the material of the insulating layers, the thicknesses of the underlying metallization patterns, and the deposition techniques employed. As a result, a separate planarization process is not needed after formation of each insulating layer (e.g., insulating layers 212, 222, and 232. And because a planarization process is omitted, extra material need not be deposited for the insulating layers which would be needed to provide margin for the planarization processes. Advantageously, therefore, the thickness of the redistribution structure may be less and the extra steps of the planarization processes may be omitted.

In FIG. 28, after the insulating layer 232 is formed, the insulating layer 232 is then photo patterned using an acceptable photolithography technique, such as by exposure, developing, and curing to form the openings 234 in the insulating layer 232 to reveal portions of the conductive layer 228. Although the openings 234 are illustrated as being tapered, the openings 234 may be rectangular, that is, having vertical sidewalls.

In FIG. 29, conductive connectors 260 are formed in the openings 234. In some embodiments, the conductive connectors 260 may be formed on under bump metallization structures (UBMs) first formed in the openings 254. In such embodiments, UBMs may be formed for external connection to the front-side of the redistribution structure 200. The UBMs may have bump portions on and extending along the major surface of the insulating layer 232, and have via portions extending through the insulating layer 232 to physically and electrically couple the conductive layer 228. As a result, the UBMs are electrically coupled through the various conductive layers 228 to conductive features 201 in the substrate 202, which may be coupled to devices in the substrate 202. The UBMs may be formed of the same material as the seed layer 216 and conductive layer 218. In some embodiments, the UBMs have a different size (e.g., thickness) than the metallization patterns corresponding to the conductive layers 208, 218, and 228, and so forth.

The conductive connectors 260 may be formed using processes and materials similar to those discussed above with respect to the conductive connectors of FIG. 19.

The resulting redistribution structure 200 may be used and combined in various packages and devices, such as described below with respect to the subsequent embodiments. The redistribution structure 200 advantageously uses a high shrinkage insulating material over a thick metal conductive layer to achieve a final insulating layer which is only 25% to 50% thicker than the thickness of the thick metal conductive layer, providing excellent signal transfer capability, reliability, and heat dissipation, using simplified processes. In forming the various layers of the redistribution structure, separate planarization processes are omitted and the upper surfaces are allowed to remain wavy. However, due to the selection of the insulating materials of the insulating layers, the waviness is muted or attenuated in each successive layer of the redistribution structure, advantageously allowing for planarization processes to be omitted.

Figure 30:
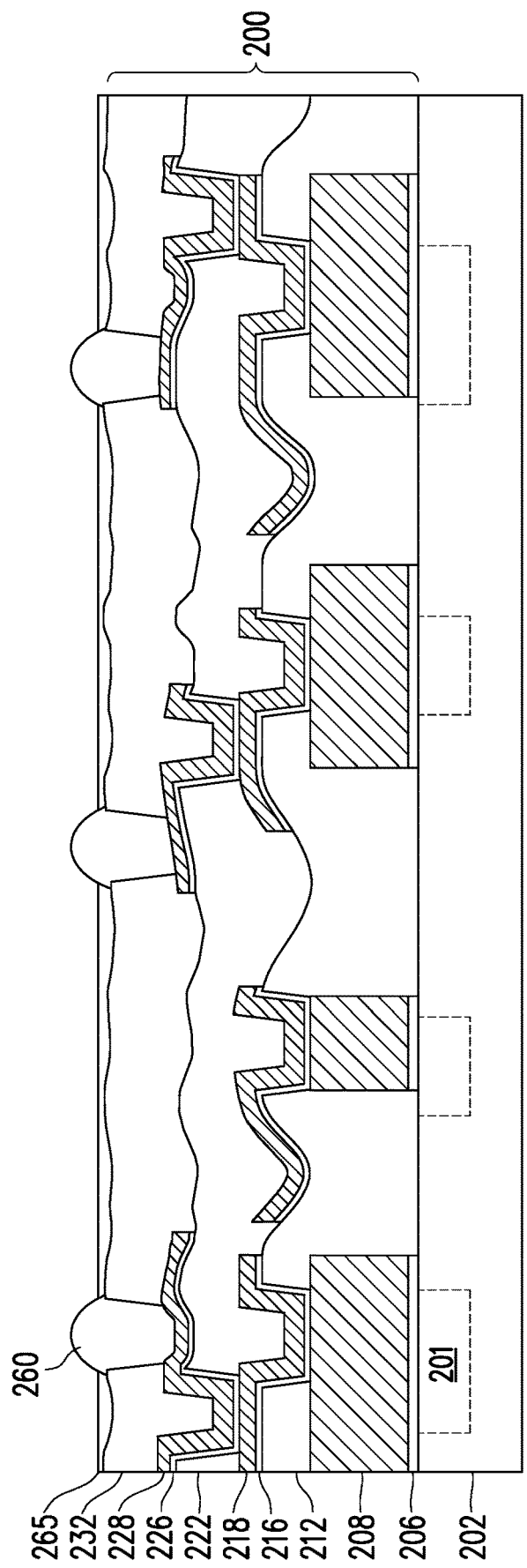

FIG. 30 illustrates the redistribution structure 200 of FIG. 29, however, in FIG. 30, a passivation layer 265 is deposited over the insulating layer 232. The passivation layer 265 may provide a flat upper surface and eliminate the remaining waviness of the upper surface of the insulating layer 232. In some embodiments, the materials and deposition process of the passivation layer 265 may be selected so that the upper surface is flat without the need for a planarization process. In other embodiments, a planarization process, such as grinding or a chemical mechanical polishing (CMP) process is used on the passivation layer 265. The passivation layer 265 may be formed before or after the openings 234, and additional openings are formed through the passivation layer 265 corresponding to the openings 234 prior to forming the conductive connectors 260. Other embodiments may omit the passivation layer 265 and use a planarization process, such as grinding or a CMP to level the upper surface of the last insulating layer of the redistribution structure 200, e.g., the insulating layer 232, prior to forming the openings for the conductive connectors, e.g., openings 234.

FIG. 31 through 53 illustrate cross-sectional views of various intermediate stages in forming a semiconductor device, such as integrated fan out (InFO) package, for example, for use with a MEMS device. In FIG. 31 a package region 300A is illustrated. The package region 300A may be one of several package regions and represents a portion of the entire package region 300A. Also in FIG. 31, a carrier 302 is provided. The carrier 302 may have openings preformed therein or the openings may be formed in the carrier 302 using any suitable process. The openings may traverse completely through the carrier 302 (as illustrated) or may traverse only part way through the carrier 302. In some embodiments, the carrier 302 may be a ceramic carrier. In some embodiments, the carrier 302 is provided in a wafer form.

Alternatively, the carrier 302 may be provided in any other suitable form (e.g., a panel form, a chip form, or a strip form, etc.) depending on the process requirements. In some embodiments, a material of the carrier 302 is selected to have material properties of high thermal conductivity to provide good heat dissipation. In some embodiments, the selected material of the carrier 302 has a permittivity (or dielectric constant (Dk)) higher than a conventional dielectric material (e.g., molding material having a Dk of about 3.3, or FR-4 having a Dk of about 4.5 to about 4.9). The selected material of the carrier 302 may have a dissipation factor (or dielectric loss tangent, DO lower than the conventional dielectric material (e.g., FR-4 having a Df of about 0.013 to about 0.020). The lower the dissipation factor of the material of the carrier 302 is, the less the signal transmission loss is. In some embodiments, the material of the carrier 302 is selected to have a good processing property so as to withstand the semiconductor structure formed thereon. The material of the carrier 302 may be chosen to have a coefficient of thermal expansion (CTE) closely matching the CTE of the semiconductor chip (e.g., silicon material) so as to prevent the subsequently formed chip package on the carrier 302 from cracking or detaching under the influence of variations in temperature.

For example, a material of the carrier 302 may include aluminum nitride (AlN), silicon carbide (SiC), aluminum oxide ($Al_2O_3$), silicon nitride ($Si_3N_4$), boron nitride (BN), zirconia ($ZrO_2$), or other suitable materials. In some embodiments in which an aluminum nitride wafer is used, the carrier 302 includes a permittivity (or dielectric constant; Dk) value ranging between about 7.7 and about 9.9, a dielectric loss tangent (Df) may be in a range of about 0.003 at 10 GHz to about 0.00045 at 140 GHz. The carrier 302 may be tailored to provide a desired material property such as enhanced thermal conductivity, thereby facilitating heat dissipation. In some embodiments, the thermal conductivity of the carrier 302 may be in a range of about 60 W/m-K to about 120 W/m-K. In certain embodiments, the thermal conductivity of the carrier 302 may be in a range of about 80 W/m-K to about 180 W/m-K or about 200 W/m-K. In other embodiments, a thermal conductivity of the carrier 302 at room temperature ranges from about 20 W/m-K to about 150 W/m-K. Alternatively, a thermal conductivity of the carrier 302 at room temperature ranges from about 3 W/m-K to about 150 W/m-K. Other suitable carrier materials having good dielectric properties and heat dissipation properties may be used.

In FIG. 32, the back side of carrier 302 may be attached to a tape 304 for ease of handling. It should be understood that the illustrated cross-sectional view of the carrier 302 and tape 304 represent only a portion of the carrier 302 and tape 304.

Figure 33:
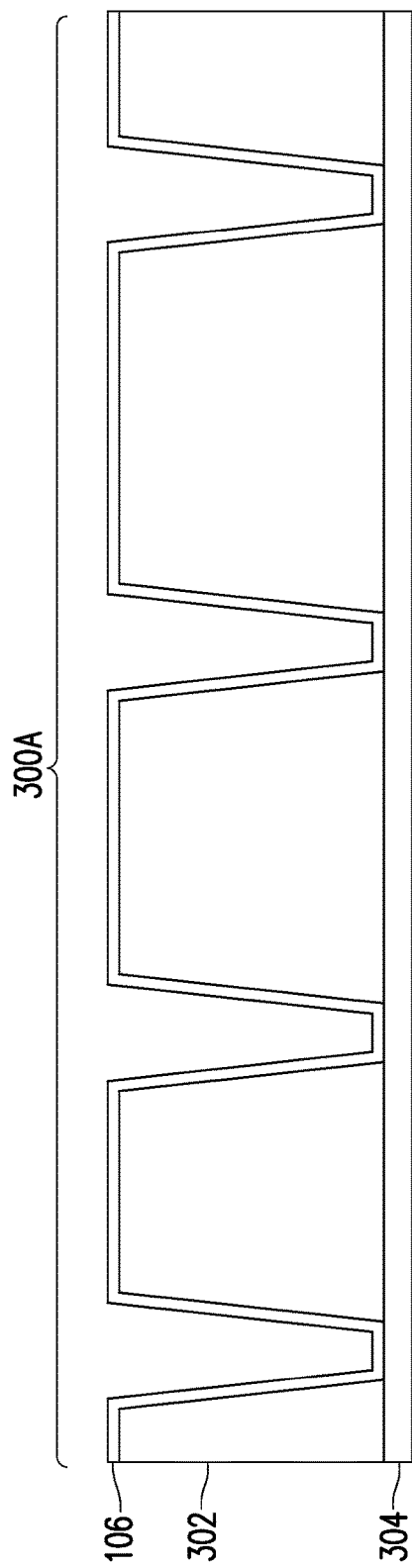
Figure 34:
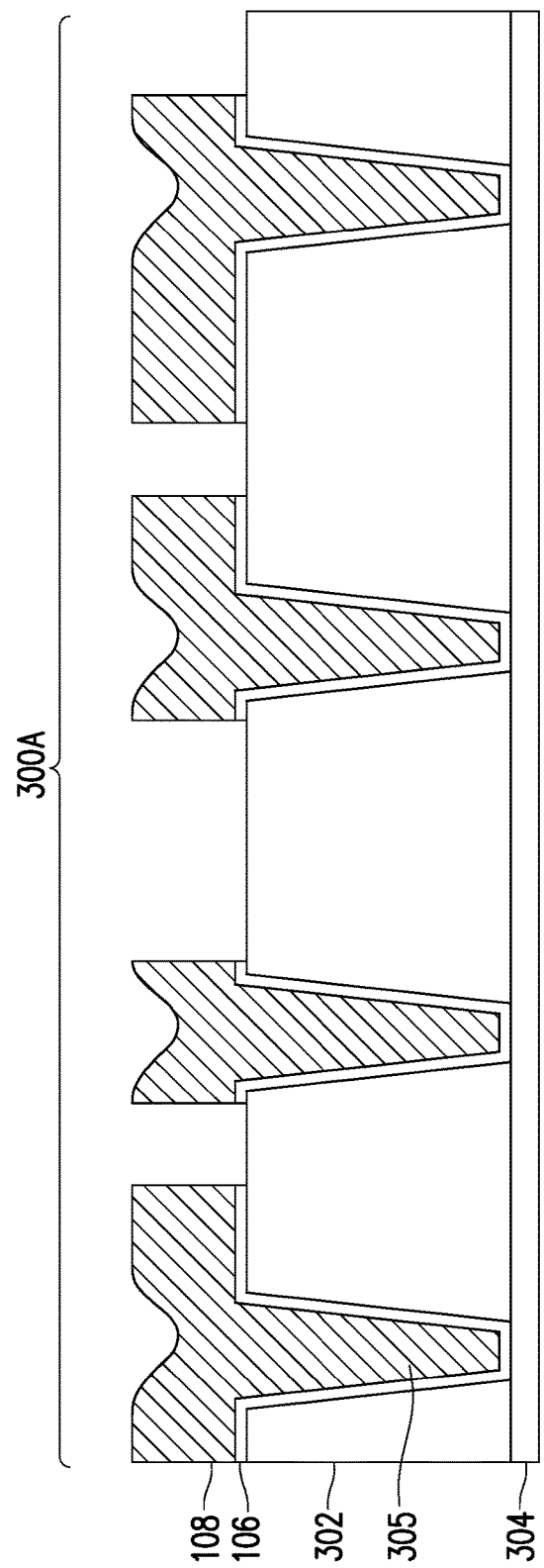
Figure 35:
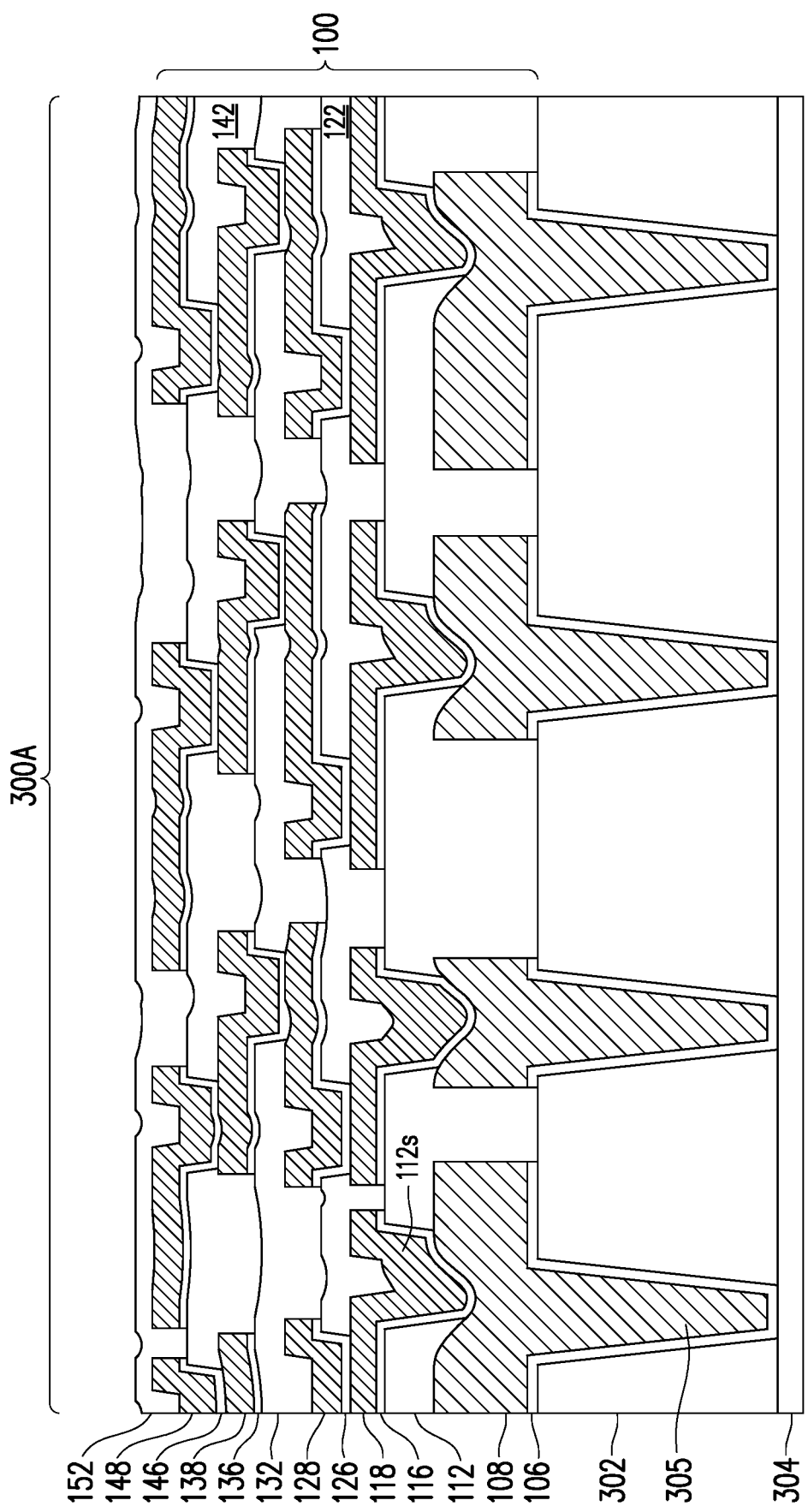

In FIGS. 33 through 35, a redistribution structure 100 is formed (FIG. 35). In FIG. 33, a seed layer 106 is formed. The seed layer 106 may be formed using processes and materials similar to those discussed above with respect to the seed layer of FIG. 2. The seed layer 106 lines the openings in the carrier 302, and may extend along the tape 304 in some embodiments. In FIG. 34, a conductive layer 108 is formed on the seed layer 106 including in the openings of the carrier 302. The conductive layer 108 may be formed using processes and materials similar to those discussed above with respect to the conductive layer 108 of FIG. 3. A portion of the conductive layer 108 forms a via 305 through the carrier 302. After the conductive layer is formed, the exposed portion of the seed layer 106 may be etched away using a suitable wet or dry etch process. As noted in FIG. 34, in some embodiments an upper surface of the conductive layer 108 may have depressions formed therein according to the openings in the carrier 302.

In FIG. 35, the remainder of the redistribution structure 100 may be formed using processes and materials similar to those discussed above with respect to FIGS. 4 through 17. In some embodiments, portions of the insulating layer 122 may have a bottom surface contacting the conductive layer 108 which is lower than an upper surface 112s of the insulating layer 112.

Figure 36:
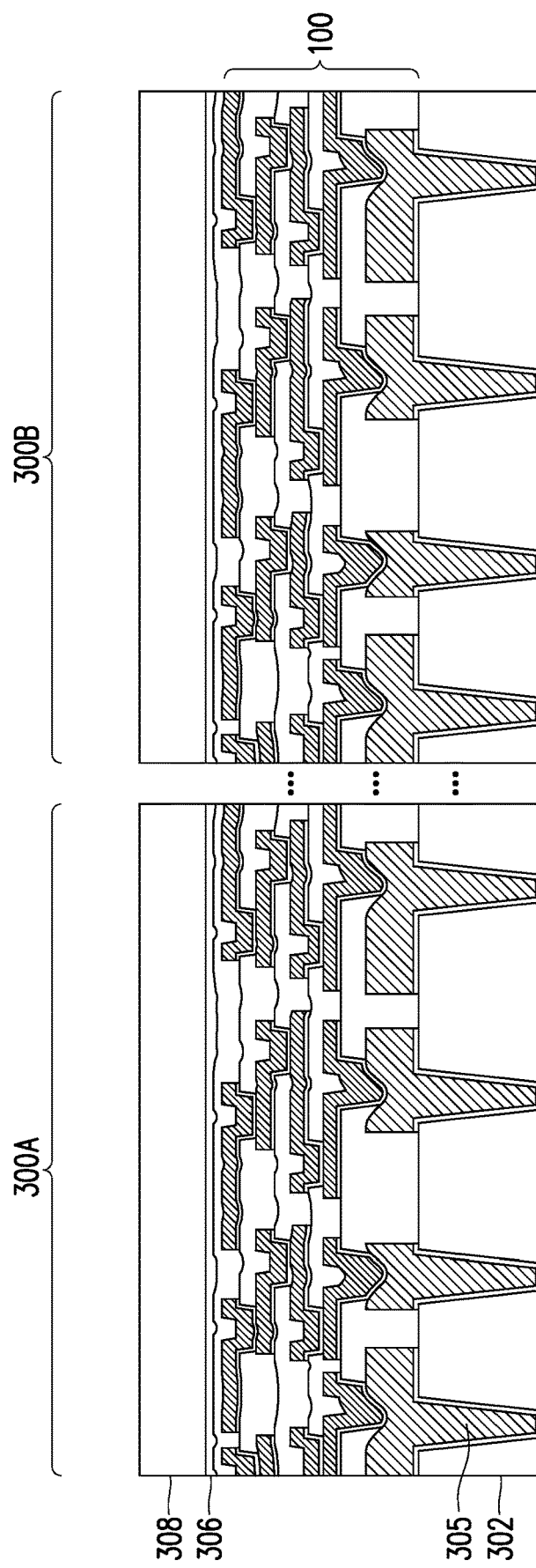

In FIG. 36, the tape 304 is removed and the package region 300A is attached to a carrier 308 by a die attach film 306, such as a release layer. The carrier 308 may be a glass carrier substrate, a ceramic carrier substrate, or the like. The carrier 308 may be a wafer, such that multiple packages can be formed on the carrier 308 simultaneously. The die attach film 306 may be formed of a polymer-based material, which may be removed along with the carrier 308 from the overlying structures that will be formed in subsequent steps. In some embodiments, the die attach film 306 is an epoxy-based thermal-release material, which loses its adhesive property when heated, such as a light-to-heat-conversion (LTHC) release coating. In other embodiments, the die attach film 306 may be an ultra-violet (UV) glue, which loses its adhesive property when exposed to UV lights. The die attach film 306 may be dispensed as a liquid and cured, may be a laminate film laminated onto the carrier 308, or may be the like. The top surface of the die attach film 306 may be leveled and may have a high degree of planarity.

In some embodiments, such as illustrated in FIG. 36, multiple package regions may be attached to the carrier 308. In some embodiments, the respective layers of the multiple package regions may extend continuously to one another, for example, that the carrier 302 of the package region 300A extends continuously to the carrier 302 of the package region 300B, or in other words, that the carrier 302 in the package region 300A is the same carrier as the carrier 302 in the package region 300B. A similar correspondence occurs for each of the layers of the package regions 300A and 300B. In other embodiments, the package regions 300A and 300B may be separate and may each be attached by a die attach film 306 to a common carrier 308. In other words, in such embodiments, the carrier 302 of the package region 300A is a different carrier than the carrier 302 of the package region 300B. Although two package regions 300A and 300B are illustrated, any suitable number of package regions may be used, including only one package region.

Figure 37:
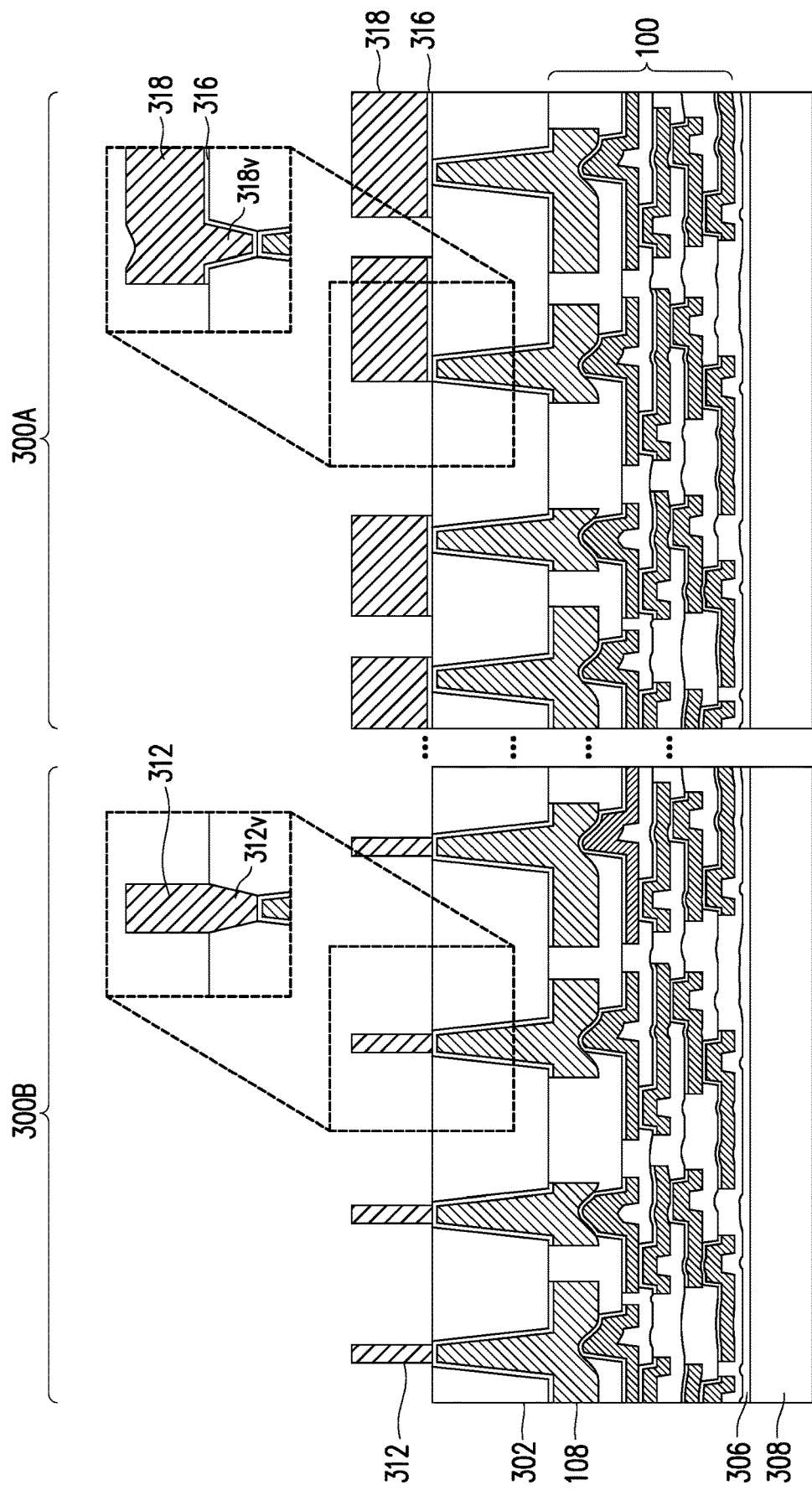

In FIG. 37, the carrier 308 is flipped over and either conductive vias 312 (left side in package region 300B), conductive lines 318 (right side in package region 300A), or a combination of the two may be formed on the now upper side of the carrier 302. If the openings in the carrier 302 (see FIG. 31) did not traverse the entire thickness of the carrier 302, new openings may be formed in the now upper side of the carrier 302 to expose the via 305 of the conductive layer 108 and its associated seed layer 106. The inset illustration in the package region 300A and the inset illustration in the package region 300B illustrate that a via portion 318v of the conductive lines 318 and/or that a bottom via portion 312v of the conductive vias 312 may extend down through a portion of the carrier 302. In such embodiments, as illustrated in the inset illustrations, the resulting conductors through the carrier 302 can have an hour glass shape.

The conductive vias 312 may be formed by any suitable process, such as by electroplating, electroless plating, and the like. In some embodiments, a separate seed layer (not shown) may be deposited first where the conductive vias 312 vias will be made, while in other embodiments the conductive vias 312 may use the seed layer 106 as a seed layer, thereby reducing processing complexity. The conductive lines 318 may be formed by first depositing a seed layer 316, then using a mask to cover portions of the seed layer where the pattern will be removed, then using any suitable deposition process, such as electro plating, electroless plating, CVD, PVD, the like, or combinations thereof. The mask is then removed and the exposed portions of the seed layer 316 etched away. The formation of the seed layer 316 and conductive lines 318 may uses processes and materials similar to those discussed above with respect to the seed layer 106 and conductive layer 108.

Figure 38:
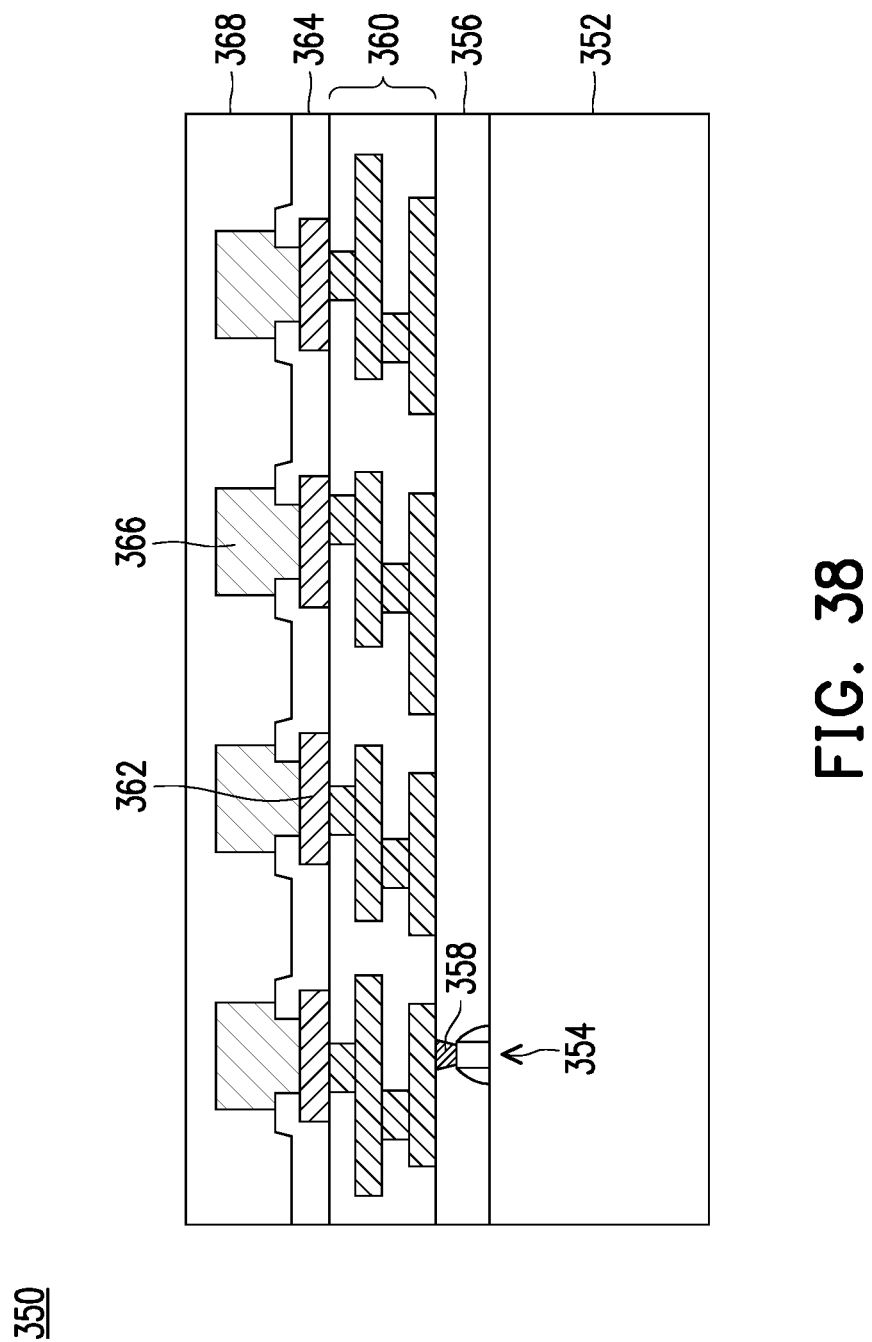
FIG. 38 illustrates a cross-sectional view of an integrated circuit die in accordance with some embodiments.

FIG. 38 illustrates a cross-sectional view of an integrated circuit die 350 in accordance with some embodiments. The integrated circuit die 350 will be packaged in subsequent processing to form an integrated circuit package. The integrated circuit die 350 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a MEMS controller (e.g., application specific integrated circuit (ASIC)), a signal processing die (e.g., digital signal processing (DSP) die), a front-end die (e.g., analog front-end (AFE) dies), the like, or combinations thereof.

The integrated circuit die 350 may be formed in a wafer, which may include different device regions that are singulated in subsequent steps to form a plurality of integrated circuit dies. The integrated circuit die 350 may be processed according to applicable manufacturing processes to form integrated circuits. For example, the integrated circuit die 350 includes a semiconductor substrate 352, such as silicon, doped or undoped, or an active layer of a semiconductor-on-insulator (SOI) substrate. The semiconductor substrate 352 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 352 has an active surface (e.g., the surface facing upwards in FIG. 38), sometimes called a front side, and an inactive surface (e.g., the surface facing downwards in FIG. 38), sometimes called a back side.

Devices 354 (represented by a transistor) may be formed at the front surface of the semiconductor substrate 352. The devices 354 may be active devices (e.g., transistors, diodes, etc.), capacitors, resistors, etc. An inter-layer dielectric (ILD) 356 is over the front surface of the semiconductor substrate 352. The ILD 356 surrounds and may cover the devices 354. The ILD 356 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 358 extend through the ILD 356 to electrically and physically couple the devices 354. For example, when the devices 354 are transistors, the conductive plugs 358 may couple the gates and source/drain regions of the transistors. The conductive plugs 358 may be formed of tungsten, cobalt, nickel, copper, silver, gold, aluminum, the like, or combinations thereof. An interconnect structure 360 is over the ILD 356 and conductive plugs 358. The interconnect structure 360 interconnects the devices 54 to form an integrated circuit. The interconnect structure 360 may be formed by, for example, metallization patterns in dielectric layers on the ILD 356. The metallization patterns include metal lines and vias formed in one or more low-k dielectric layers. The metallization patterns of the interconnect structure 360 are electrically coupled to the devices 354 by the conductive plugs 358.

The integrated circuit die 350 further includes pads 362, such as aluminum pads, to which external connections are made. The pads 362 are on the active side of the integrated circuit die 350, such as in and/or on the interconnect structure 360. One or more passivation films 364 are on the integrated circuit die 350, such as on portions of the interconnect structure 360 and pads 362. Openings extend through the passivation films 364 to the pads 362. Die connectors 366, such as conductive pillars (for example, formed of a metal such as copper), extend through the openings in the passivation films 364 and are physically and electrically coupled to respective ones of the pads 362. The die connectors 366 may be formed by, for example, plating, or the like. The die connectors 366 electrically couple the respective integrated circuits of the integrated circuit die 350.

Optionally, solder regions (e.g., solder balls or solder bumps) may be disposed on the pads 362. The solder balls may be used to perform chip probe (CP) testing on the integrated circuit die 350. CP testing may be performed on the integrated circuit die 350 to ascertain whether the integrated circuit die 350 is a known good die (KGD). Thus, only integrated circuit dies 350, which are KGDs, undergo subsequent processing and are packaged, and dies, which fail the CP testing, are not packaged. After testing, the solder regions may be removed in subsequent processing steps.

A dielectric layer 368 may (or may not) be on the active side of the integrated circuit die 350, such as on the passivation films 364 and the die connectors 366. The dielectric layer 368 laterally encapsulates the die connectors 366, and the dielectric layer 368 is laterally coterminous with the integrated circuit die 350. Initially, the dielectric layer 368 may bury the die connectors 366, such that the topmost surface of the dielectric layer 368 is above the topmost surfaces of the die connectors 366. In some embodiments where solder regions are disposed on the die connectors 366, the dielectric layer 368 may bury the solder regions as well. Alternatively, the solder regions may be removed prior to forming the dielectric layer 368.

The dielectric layer 368 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 368 may be formed, for example, by spin coating, lamination, chemical vapor deposition (CVD), or the like. In some embodiments, the die connectors 366 are exposed through the dielectric layer 368 during formation of the integrated circuit die 350. In some embodiments, the die connectors 366 remain buried and are exposed during a subsequent process for packaging the integrated circuit die 350. Exposing the die connectors 366 may remove any solder regions that may be present on the die connectors 366.

In some embodiments, the integrated circuit die 350 is a stacked device that includes multiple semiconductor substrates 352. For example, the integrated circuit die 350 may be a memory device such as a hybrid memory cube (HMC) module, a high bandwidth memory (HBM) module, or the like that includes multiple memory dies. In such embodiments, the integrated circuit die 350 includes multiple semiconductor substrates 352 interconnected by through-substrate vias (TSVs). Each of the semiconductor substrates 352 may (or may not) have an interconnect structure 360.

Figure 39:
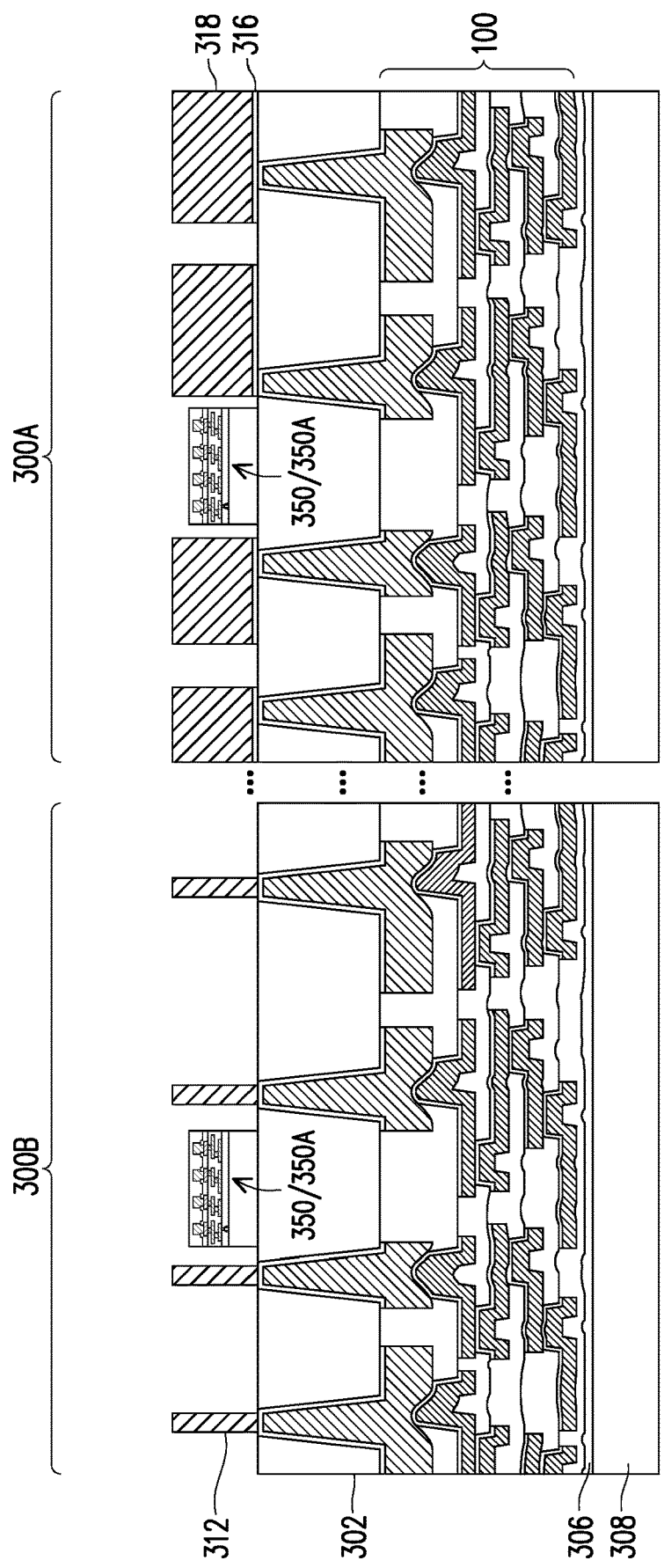
FIGS. 39 through 53 illustrate intermediate processes in the formation of a device stack, in accordance with some embodiments.
Figure 45:
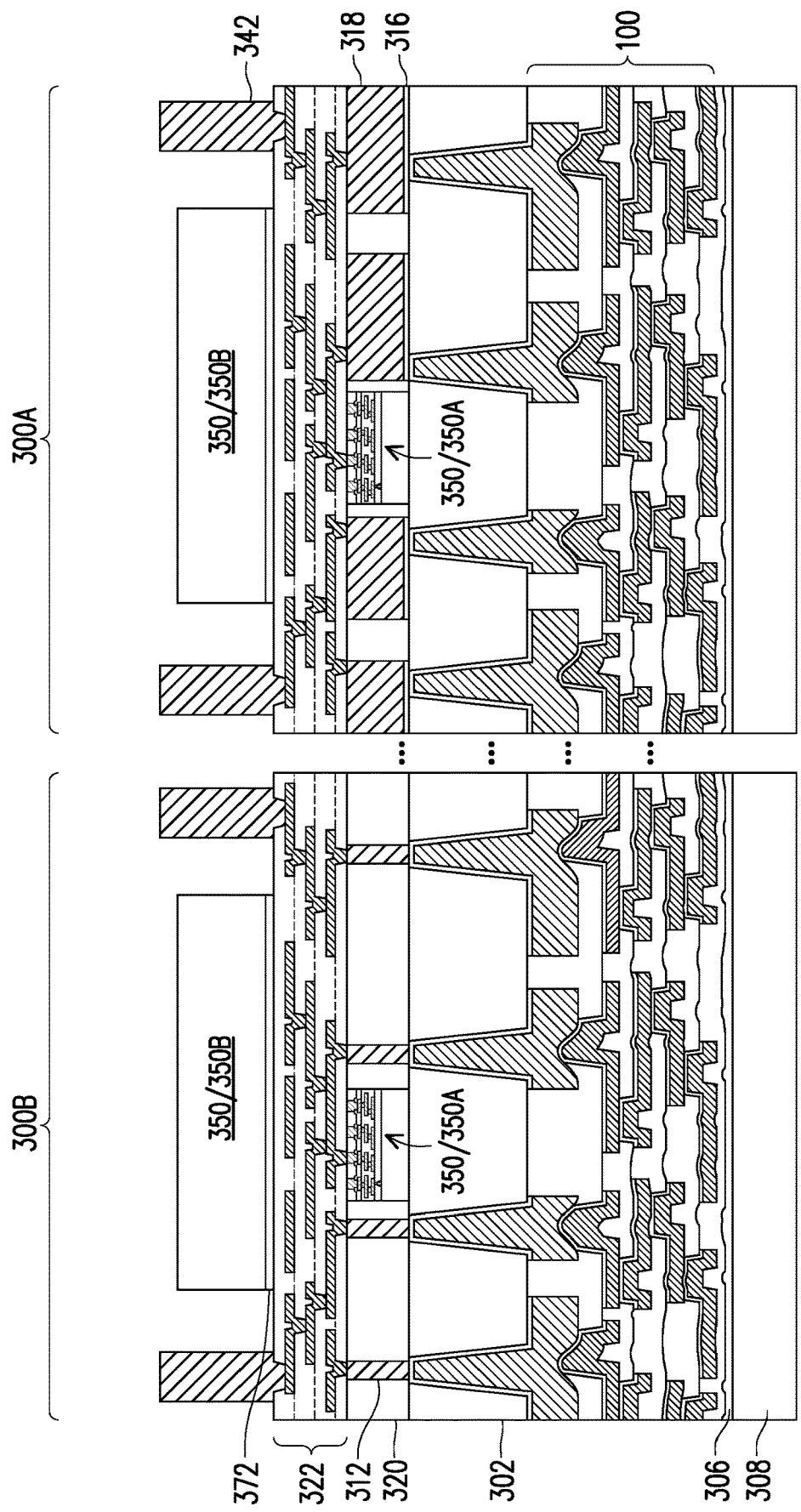

In FIG. 39, integrated circuit dies 350, such as integrated circuit dies 350A, are adhered to the carrier 308 by an adhesive (see, e.g., adhesive 372 of FIG. 45). A desired type and quantity of integrated circuit dies 350A are adhered in each of the package regions 300A and 300B. The integrated circuit die 350A may be any of the candidate die-types discussed above with respect to FIG. 38, including, for example, a MEMS device or MEMS controller, such as an ASIC device. Additional integrated circuit dies 350/350A may be attached in each of the package regions 300A and 300B and may have the same or different functionalities as the illustrated integrated circuit die 350A. Where multiple integrated circuit dies 350A are used in each package region, they may be formed in processes of a same technology node, or may be formed in processes of different technology nodes. For example, a first integrated circuit die 350A may be of a more advanced process node than a second integrated circuit die 350/350A. Where multiple integrated circuit dies 350A are used in each package region, they may have different sizes (e.g., different heights and/or surface areas), or may have the same size (e.g., same heights and/or surface areas). The space available for the conductive vias 312 and/or conductive lines 318 in the package region 300A and the package region 300B may be limited, particularly when the integrated circuit dies 350A include devices with a large footprint, such as SoCs. The use of the back-side redistribution structure 100 allows for an improved interconnect arrangement when the package region 300A and the package region 300B have limited space available for the conductive vias 312 and/or conductive lines 318.

The adhesive for the integrated circuit dies 350A is on back-sides of the integrated circuit dies 350A and adheres the integrated circuit dies 350A to the carrier 308. The adhesive may be any suitable adhesive, epoxy, die attach film (DAF), or the like. The adhesive may be applied to back-sides of the integrated circuit dies 350A. For example, the adhesive may be applied to the back-sides of the integrated circuit dies 350A before singulating to separate the integrated circuit dies 350A.

Figure 40:
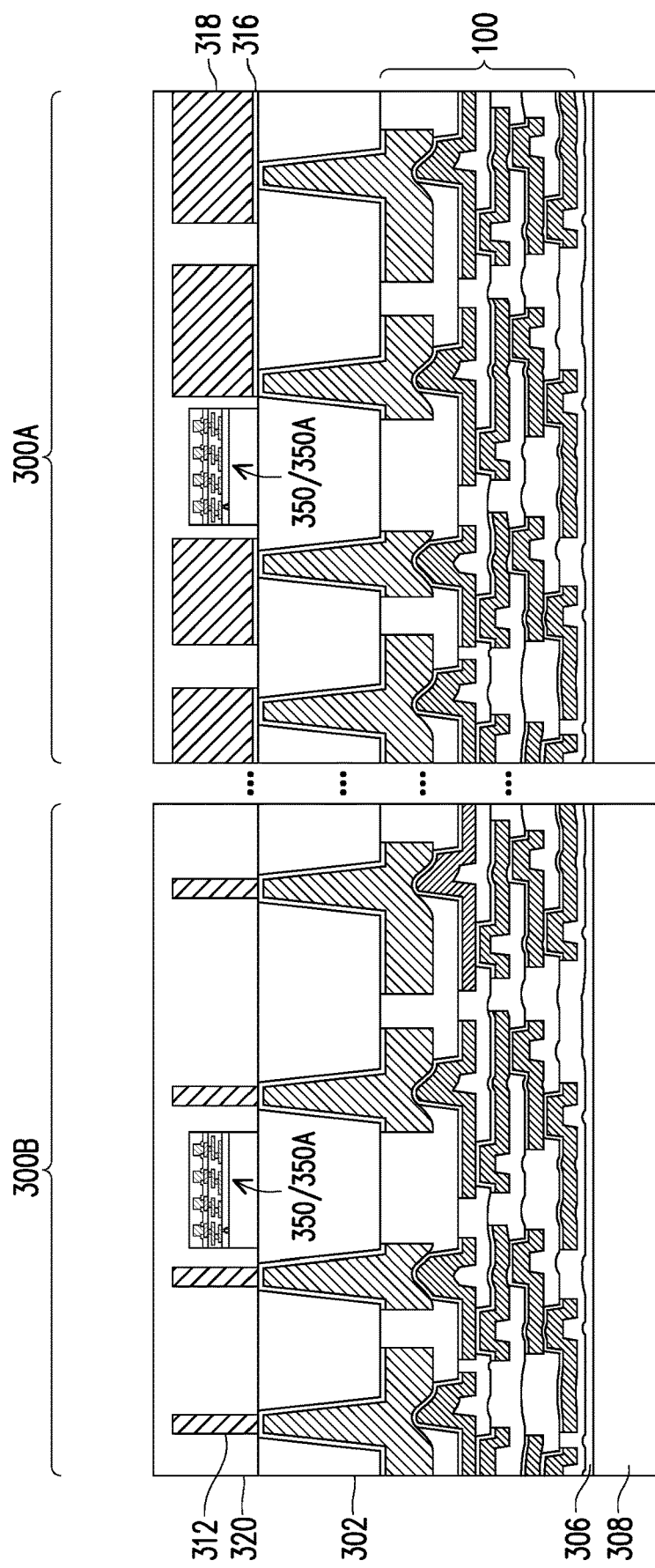

In FIG. 40, an encapsulant 320 is formed on and around the various components. After formation, the encapsulant 320 encapsulates the conductive vias 312 and/or conductive lines 318, and integrated circuit dies 350A. The encapsulant 320 may be a molding compound, epoxy, or the like. The encapsulant 320 may be applied by compression molding, transfer molding, or the like, and may be formed over the carrier 302 such that the conductive vias 312, the conductive lines 318, and/or the integrated circuit dies 350A are buried or covered. The encapsulant 320 is further formed in gap regions between the integrated circuit dies 350A. The encapsulant 320 may be applied in liquid or semi-liquid form and then subsequently cured.

Figure 41:
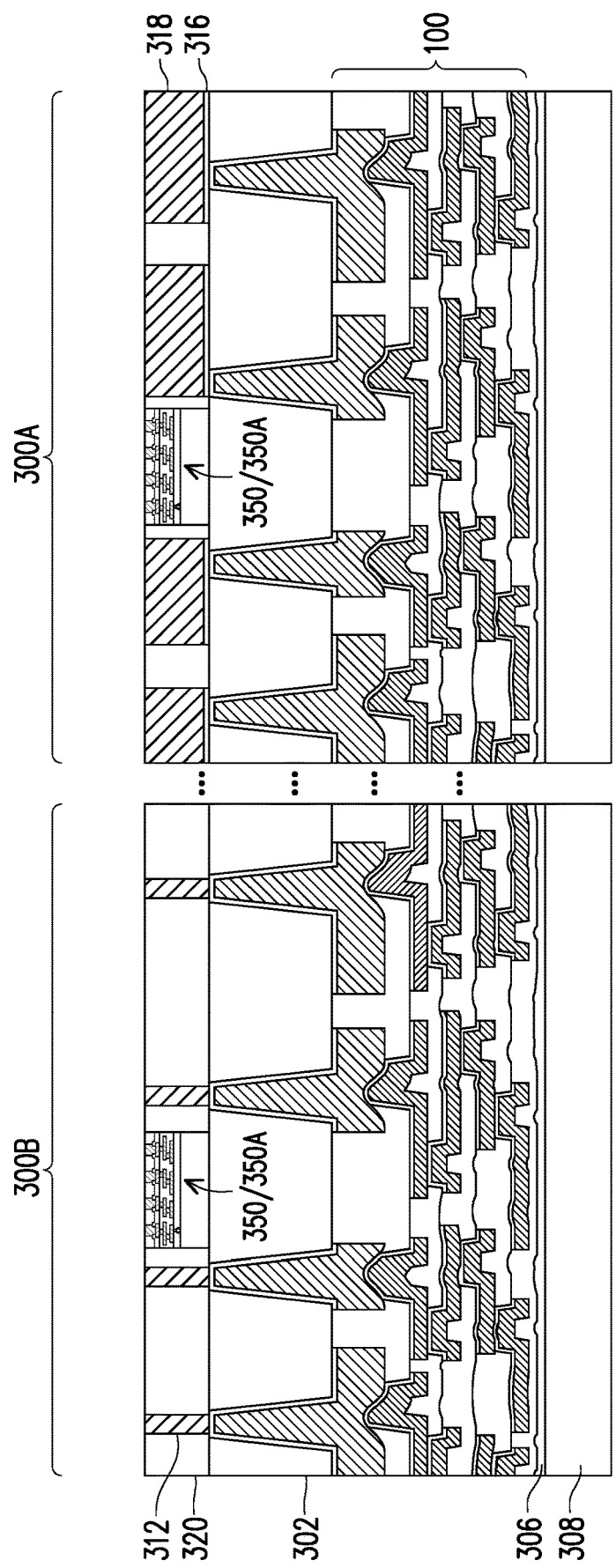

In FIG. 41, a planarization process is performed on the encapsulant 320 to expose the conductive vias 312 and/or conductive lines 318 and the die connectors 366 (see FIG. 38) of the integrated circuit dies 350A. The planarization process may also remove material of the conductive vias 312 and/or conductive lines 318, dielectric layer 368 (see FIG. 38), and/or die connectors 366 (see FIG. 38) until the die connectors 366 and conductive vias 312 and/or conductive lines 318 are exposed. Top surfaces of the conductive vias 312 and/or conductive lines 318, die connectors 366, dielectric layer 368, and encapsulant 320 are substantially coplanar after the planarization process within process variations. The planarization process may be, for example, a chemical-mechanical polish (CMP), a grinding process, or the like. In some embodiments, the planarization may be omitted, for example, if the conductive vias 312 and/or conductive lines 318 and/or die connectors 366 are already exposed.

Figure 42:
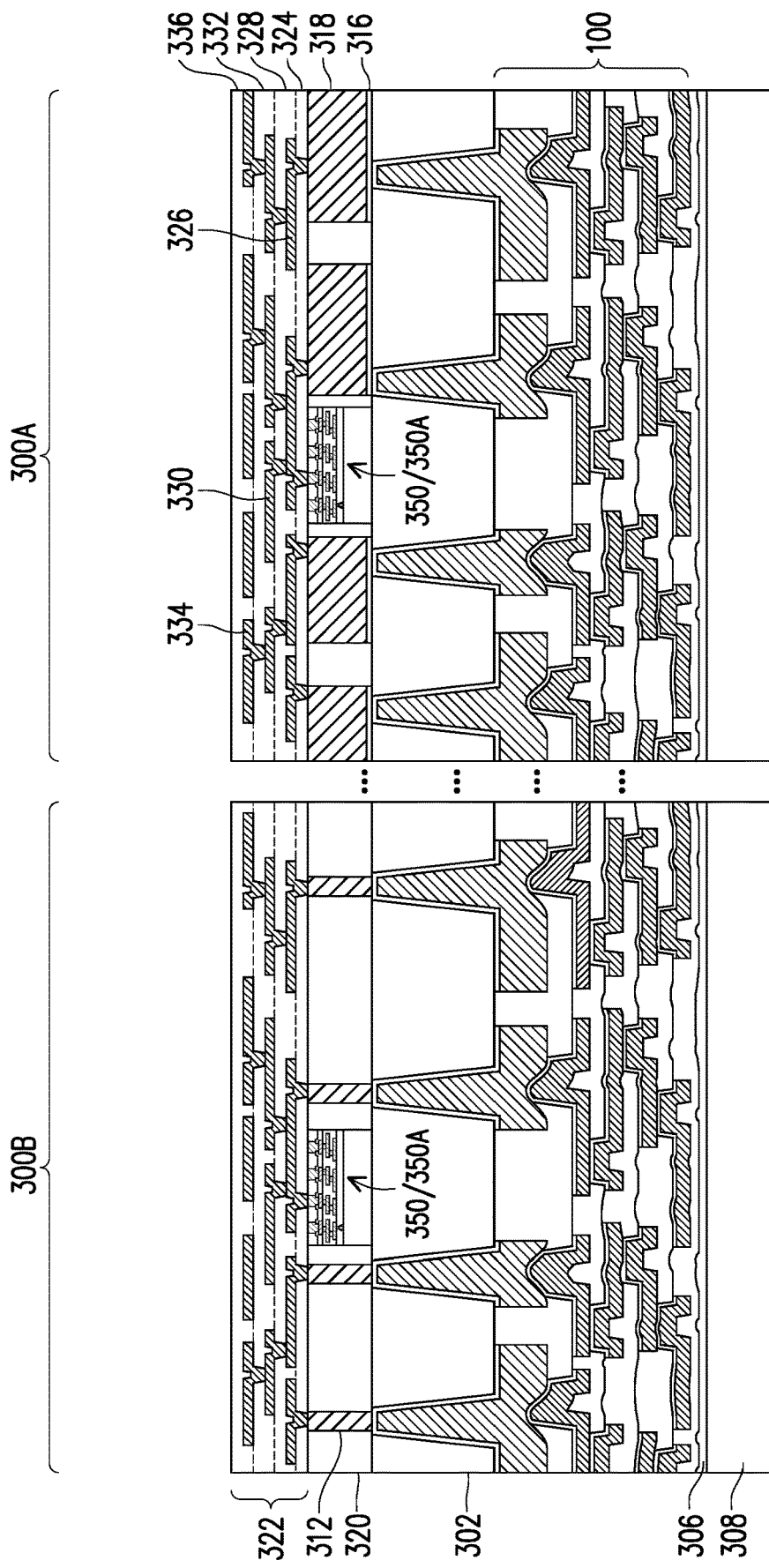

In FIG. 42, a redistribution structure 322 is formed over the encapsulant 32 The redistribution structure 322 may be a fan-out redistribution structure. In some embodiments, the redistribution structure 322 may be formed using processes and materials similar to those discussed above with respect to the redistribution structures 100 and/or 200. In other embodiments, the redistribution structure 322 may be formed using other processes and materials.

For example, the dielectric layer 324 may be deposited on the encapsulant 320, conductive vias 312 and/or conductive lines 318, and die connectors 366 (see FIG. 38). In some embodiments, the dielectric layer 324 is formed of a photo-sensitive material such as PBO, polyimide, BCB, or the like, which may be patterned using a lithography mask. The dielectric layer 324 may be formed by spin coating, lamination, CVD, the like, or a combination thereof. The dielectric layer 324 is then patterned. The patterning forms openings exposing portions of the conductive vias 312 and/or conductive lines 318 and the die connectors 366. The patterning may be by an acceptable process, such as by exposing and developing the dielectric layer 324 to light when the dielectric layer 324 is a photo-sensitive material or by etching using, for example, an anisotropic etch.

The metallization pattern 326 may then be formed. The metallization pattern 326 includes conductive elements extending along the major surface of the dielectric layer 324 and extending through the dielectric layer 324 to physically and electrically couple to the conductive vias 312 and/or conductive lines 318 and the integrated circuit dies 350A. As an example to form the metallization pattern 326, a seed layer is formed over the dielectric layer 324 and in the openings extending through the dielectric layer 324. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 326. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 326. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Then, the dielectric layer 328 is deposited on the metallization pattern 326 and the dielectric layer 324. The dielectric layer 328 may be formed in a manner similar to the dielectric layer 324, and may be formed of a similar material as the dielectric layer 324. The metallization pattern 330 is then formed. The metallization pattern 330 includes portions on and extending along the major surface of the dielectric layer 328. The metallization pattern 330 further includes portions extending through the dielectric layer 328 to physically and electrically couple the metallization pattern 326. The metallization pattern 330 may be formed in a similar manner and of a similar material as the metallization pattern 326. In some embodiments, the metallization pattern 330 has a different size than the metallization pattern 326. For example, the conductive lines and/or vias of the metallization pattern 330 may be wider or thicker than the conductive lines and/or vias of the metallization pattern 326. Further, the metallization pattern 330 may be formed to a greater pitch than the metallization pattern 326.

The process of forming dielectric layers and metallization patterns are repeated any desired number of times to form the remaining layers of the redistribution structure. As illustrated in FIG. 42, these include the formation of the dielectric layer 332 and the dielectric layer 336 as well as the metallization pattern 334. In the illustrated embodiment, the metallization pattern 334 is the topmost metallization pattern of the redistribution structure 322. As such, all of the intermediate metallization patterns of the redistribution structure 322 (e.g., the metallization patterns 326 and 330) are disposed between the metallization pattern 334 and the integrated circuit dies 350A. In some embodiments, the metallization pattern 334 has a different size than the metallization patterns 326 and 330. For example, the conductive lines and/or vias of the metallization pattern 334 may be wider or thicker than the conductive lines and/or vias of the metallization patterns 326 and 330. Further, the metallization pattern 334 may be formed to a greater pitch than the metallization pattern 330. The dielectric layer 336 is the topmost dielectric layer of the redistribution structure 322. As such, all of the metallization patterns of the redistribution structure 322 (e.g., the metallization patterns 326, 330, and 334) are disposed between the dielectric layer 336 and the integrated circuit dies 350A. Further, all of the intermediate dielectric layers of the redistribution structure 322 (e.g., the dielectric layers 324, 328, 332) are disposed between the dielectric layer 336 and the integrated circuit dies 350A.

Figure 43:
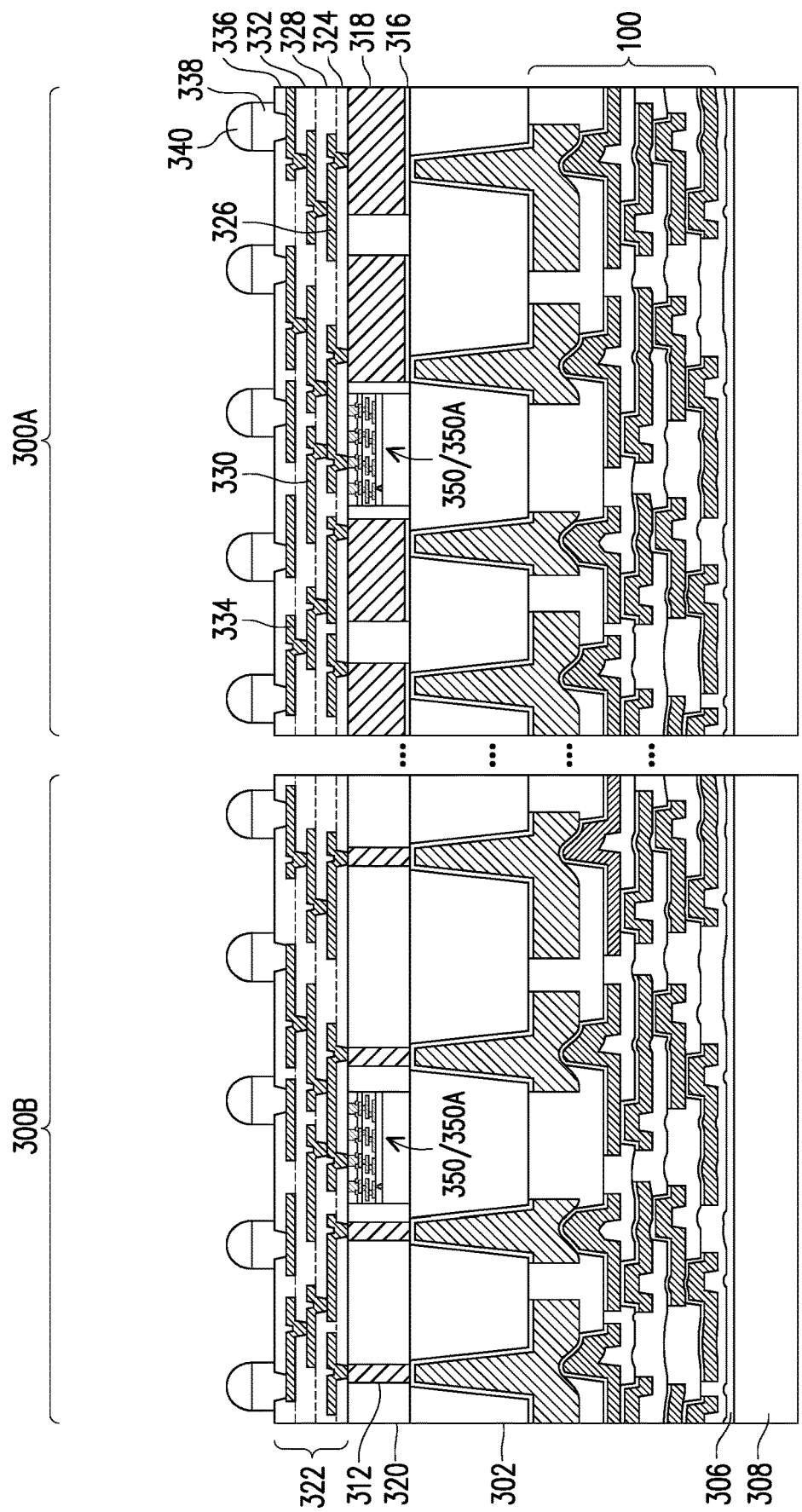

In FIG. 43, an embodiment is illustrated which forms conductive connectors 340 attached to the redistribution structure 322. In some embodiments under bump metallurgies (UBMs) 338 are formed for external connection to the fan-out redistribution structure 322. The UBMs 338 have bump portions on and extending along the major surface of the dielectric layer 336, and have via portions extending through the dielectric layer 336 to physically and electrically couple the metallization pattern 334. As a result, the UBMs 338 are electrically coupled to the conductive vias 312 and/or conductive lines 318 and the integrated circuit dies 350A. The UBMs 338 may be formed of the same material as the metallization pattern 326. In some embodiments, the UBMs 338 have a different size than the metallization patterns 326, 330, and 334.

Next, conductive connectors 340 are formed on the UBMs 338. The conductive connectors 340 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 340 may include a conductive material such as solder, copper, aluminum, gold, nickel, silver, palladium, tin, the like, or a combination thereof. In some embodiments, the conductive connectors 340 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 340 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 44:
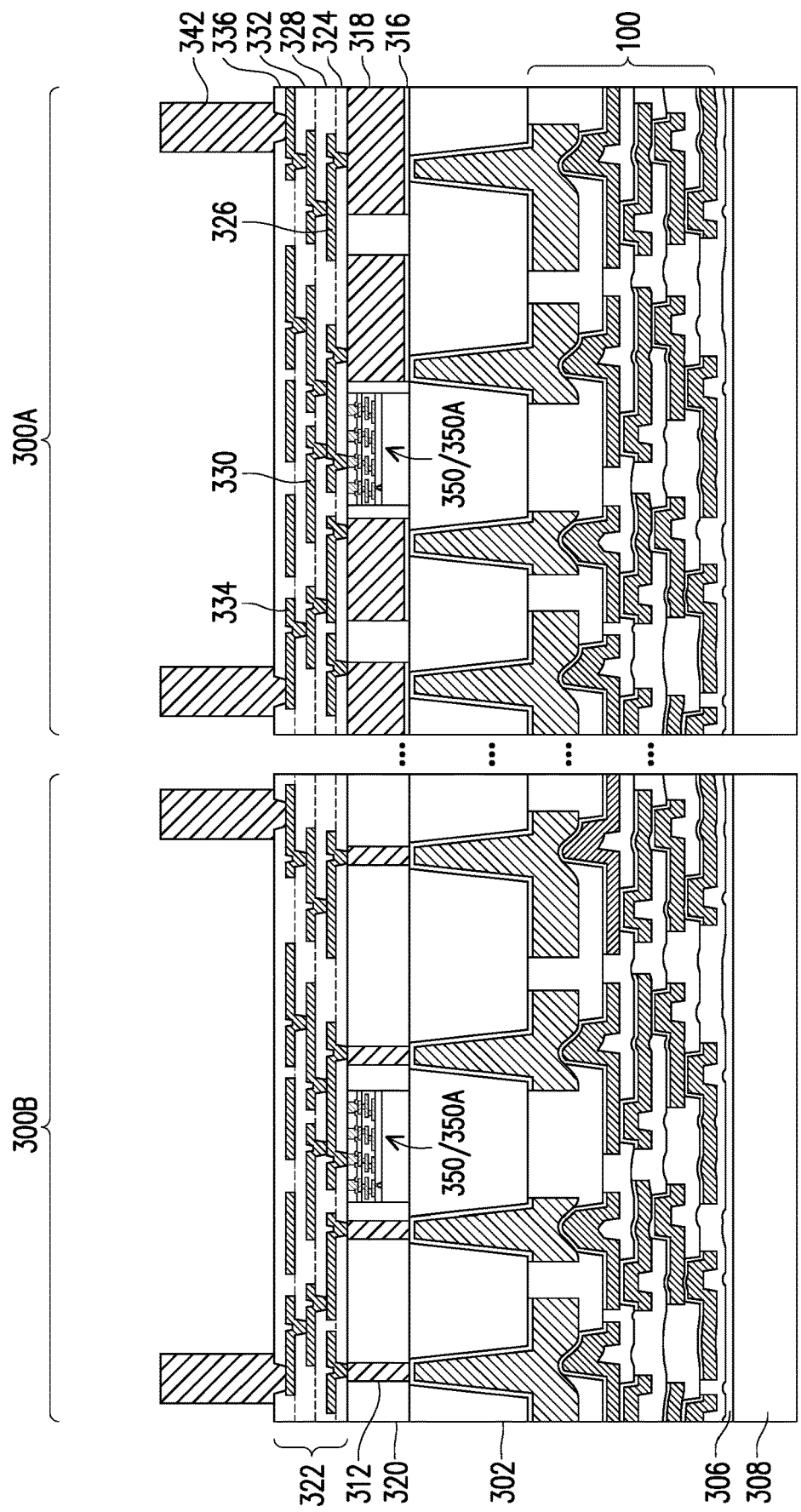

FIGS. 44 through 53 illustrate the addition of another embedded integrated circuit die over the redistribution structure 322. In some embodiments, rather than forming conductive connectors 340, through-vias 342 are formed contact the top most metallization pattern, e.g., metallization pattern 334, of the redistribution structure 322. In FIG. 44, the dielectric layer 336 is patterned to form openings exposing portions of the metallization pattern 334. The patterning may be formed by an acceptable process, such as by exposing the dielectric layer 336 to light when the dielectric layer 336 is a photo-sensitive material or by etching using, for example, an anisotropic etch. If the dielectric layer 336 is a photo-sensitive material, the dielectric layer 336 can be developed after the exposure. Through-vias 342 are formed in the openings in the dielectric layer 336 and extend away from the carrier 302. The through-vias 342 may be formed using materials and processes similar to the conductive vias 312 discussed above.

In FIG. 45, integrated circuit dies 350, such as integrated circuit dies 350B, are adhered to the redistribution structure 322 by an adhesive 372. A desired type and quantity of integrated circuit dies 350B are adhered in each of the package regions 300A and 300B. The integrated circuit dies 350B may be any of the candidate die-types discussed above with respect to the integrated circuit dies 350 of FIG. 38, including, for example, a MEMS device, an analog device, a radio frequency (RF) device, and so forth. The adhesive 372 for the integrated circuit dies 350B is on back-sides of the integrated circuit dies 350B and adheres the integrated circuit dies 350B to the redistribution structure 322. The adhesive 372 may be similar to the adhesive discussed above with respect to FIG. 39.

Figure 46:
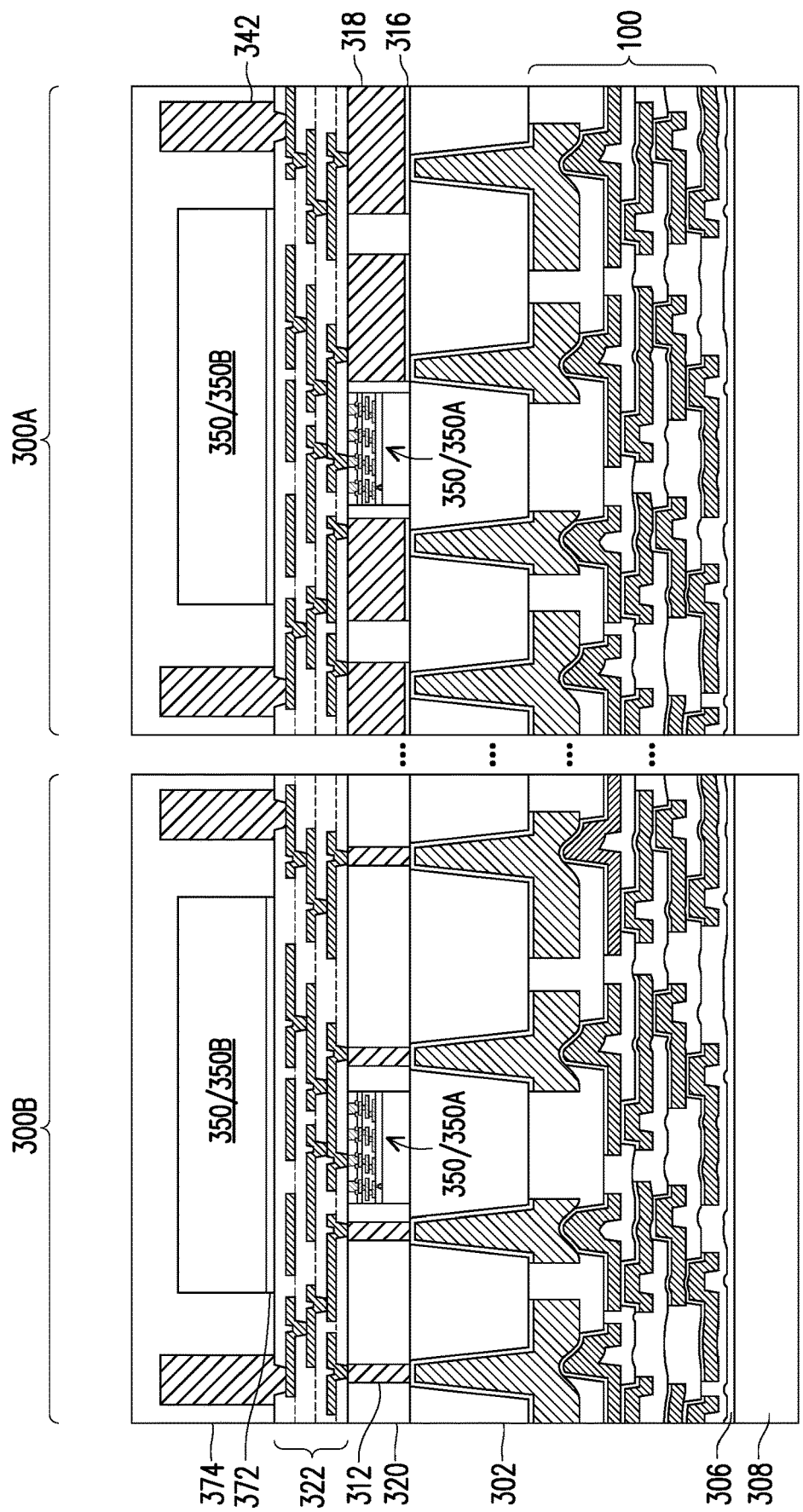

In FIG. 46, an encapsulant 374 is formed on and around the various components. After formation, the encapsulant 374 encapsulates the through-vias 342 and integrated circuit dies 350B. The encapsulant 374 may be formed by processes and materials such as those discussed above with respect to the encapsulant 320 of FIG. 40.

Figure 47:
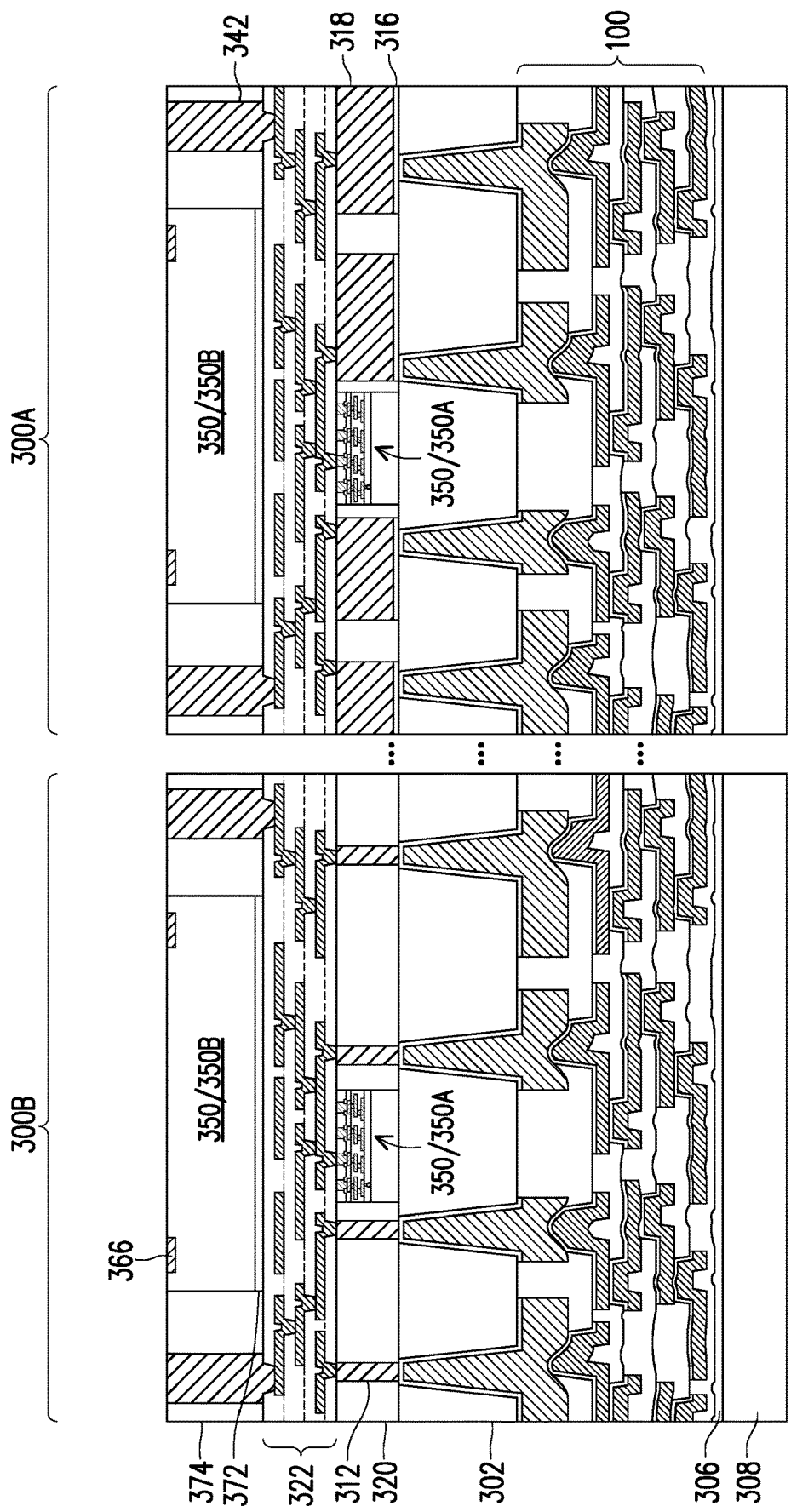

In FIG. 47, a planarization process is performed on the encapsulant 374 to expose the through-vias 342 and the die connectors 366 of the integrated circuit dies 350B. The planarization process may also remove material of the through-vias 342, dielectric layer 368 (see FIG. 38), and/or die connectors 366 (see FIG. 38) until the die connectors 366 and through-vias 342 are exposed. Top surfaces of the through-vias 342, die connectors 366, dielectric layer 368, and encapsulant 374 are substantially coplanar after the planarization process within process variations. The planarization process may be, for example, a chemical-mechanical polish (CMP), a grinding process, or the like. In some embodiments, the planarization may be omitted, for example, if the through-vias 342 and/or die connectors 366 are already exposed.

Figure 48:
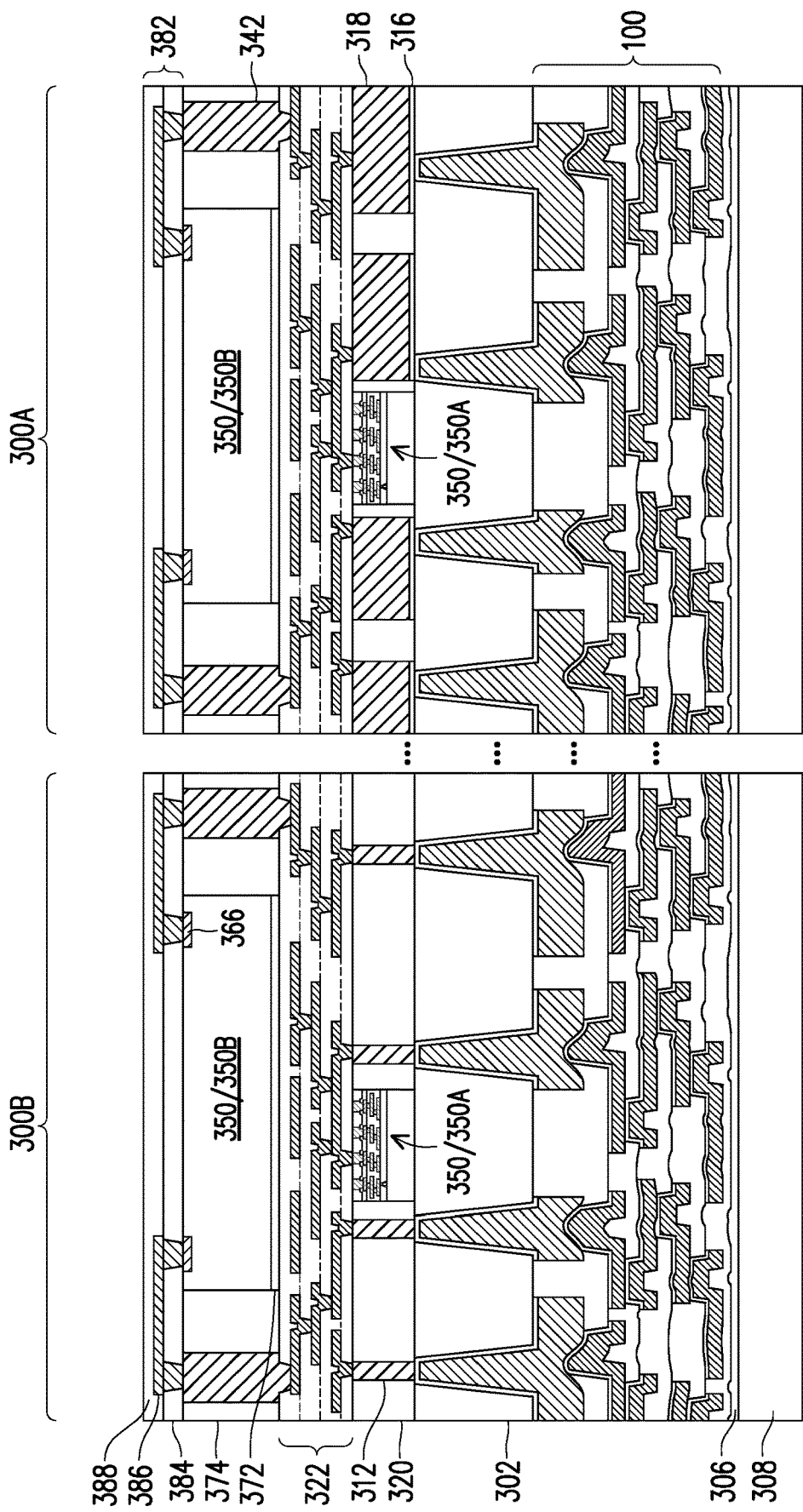

In FIG. 48, an interconnect 382 is formed over the encapsulant 374, through-vias 342, and integrated circuit dies 350B. A dielectric layer 384 of the interconnect 382 may be deposited on the encapsulant 374, through-vias 342, and integrated circuit dies 350B. In some embodiments, the dielectric layer 384 is formed of a photo-sensitive material such as PBO, polyimide, BCB, or the like, which may be patterned using a lithography mask. The dielectric layer 384 may be formed by spin coating, lamination, CVD, the like, or a combination thereof. The dielectric layer 384 is then patterned. The patterning forms openings exposing portions of the through-vias 342 and the die connectors 366. The patterning may be by an acceptable process, such as by exposing and developing the dielectric layer 384 to light when the dielectric layer 384 is a photo-sensitive material or by etching using, for example, an anisotropic etch.

Next, a metallization pattern 386 is formed over the dielectric layer 384 and in the openings through the dielectric layer 384 and contacting the through-vias 342. The metallization pattern 386 may be formed using any suitable processes and materials. In some embodiments, the metallization pattern 386 may be formed in a manner similar to that discussed above with respect to the metallization pattern 326 of FIG. 42. The interconnect 382 may be formed of any number of dielectric layers and metallization patterns. An upper dielectric layer 388 is formed over the uppermost metallization pattern, the metallization pattern 386 as illustrated in FIG. 48.

Figure 49:
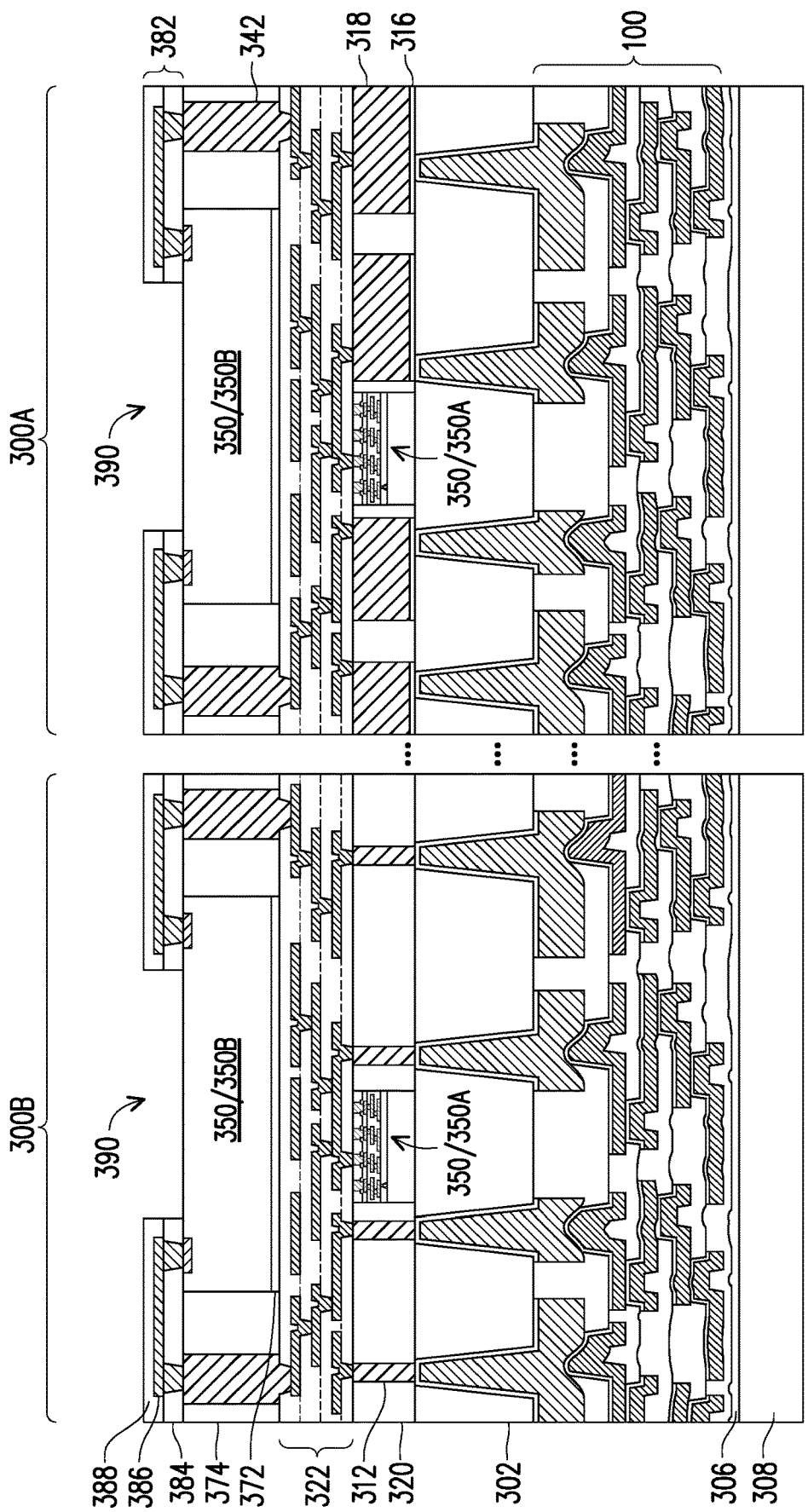

In FIG. 49 an opening 390 may be formed through the dielectric layers of the interconnect 382 to expose an upper portion of the integrated circuit dies 350B. For example, if the integrated circuit dies 350B are MEMS devices, sensor areas of the MEMS devices may be exposed. The opening 390 may be formed by depositing a mask over the interconnect 382 and patterning the mask to protect the areas of the interconnect 382 which are retained, thereby exposing areas of the interconnect 382 which will be removed. Next, any suitable removal process, such as a dry etch or wet etch, may be used to remove the exposed portions of the interconnect 382. Each layer of the dielectric layers of the interconnect, such as the dielectric layer 388 and the dielectric layer 384, may be removed in successive order, extending the opening 390 until the integrated circuit dies 350B are exposed through the opening 390.

Figure 50:
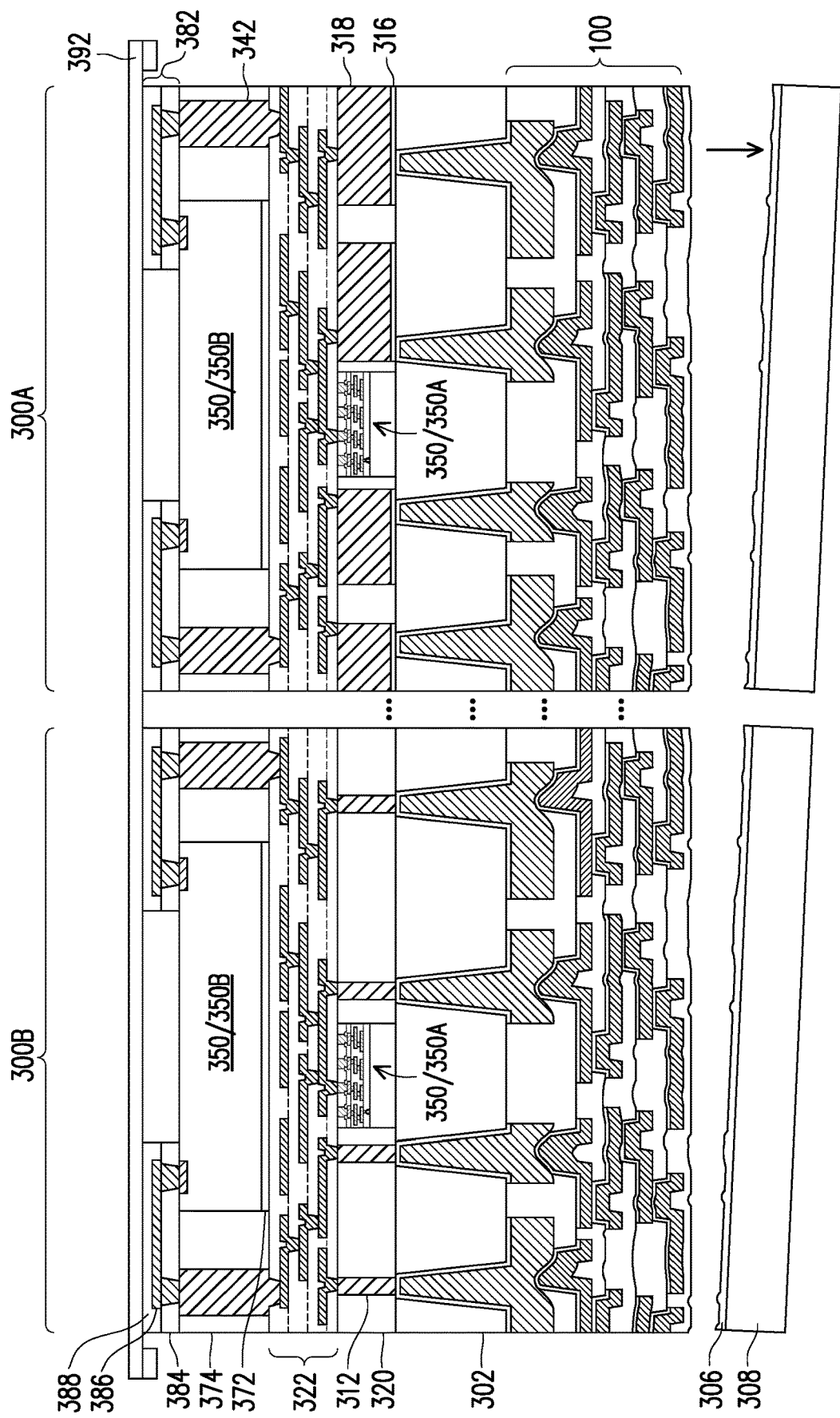

In FIG. 50, the package regions 300A and 300B are attached to a frame 392. In some embodiments, an adhesive can be used between the frame 392 and the interconnect 382. In other embodiments, the frame 392 may be attached by suction or electrostatic charge. FIG. 50 also illustrates a carrier substrate de-bonding to detach (or "de-bond") the carrier 308 from the redistribution structure 100. In accordance with some embodiments, the de-bonding includes projecting a light such as a laser light or an UV light on the die attach film 306 so that the die attach film 306 decomposes under the heat of the light and the carrier 308 can be removed. The structure may then be flipped over in some embodiments.

Figure 51:
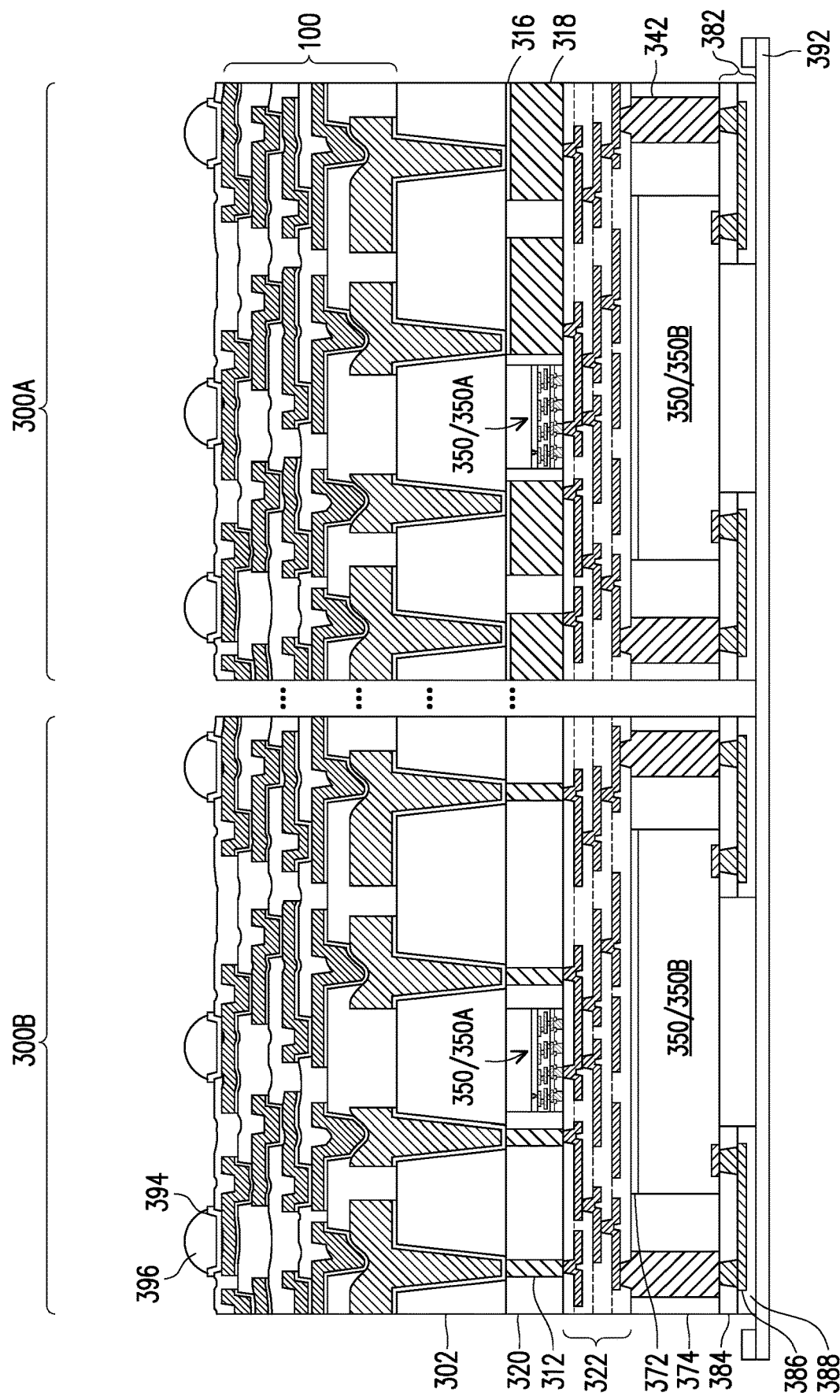

In FIG. 51, in some embodiments, conductive connectors 396 are formed to couple to the redistribution structure 100. Openings may be formed through the upper insulating layer (i.e., insulating layer 152) of the redistribution structure 100 using an acceptable photolithography technique, for example, by depositing a photo-patternable mask over the redistribution structure, patterning the photo-patternable mask by exposure, developing, and curing the photo-patternable mask, and then using openings in the mask to etch the upper insulating layer of the redistribution structure 100 to expose the conductive layer 148.

UBMs 394 may optionally be formed in the openings for external connection to the front-side of the redistribution structure 100. The UBMs 394 may have bump portions on and extending along the major surface of the insulating layer 152 of the redistribution structure 100, and have via portions extending through the insulating layer 152 to physically and electrically couple the conductive layer 148. As a result, the UBMs are electrically coupled through the various conductive layers 148 to the conductive vias 312 and/or the conductive lines 318, the integrated circuit dies 350A, and the integrated circuit dies 350B by way of the redistribution structure 322 and interconnect 382. The UBMs 394 may be formed of the same material as the seed layer 146 and/or conductive layer 148 of the redistribution structure 100. The UBMs 394 may have a different size (e.g., thickness) than the metallization patterns corresponding to the conductive layers 108, 118, 128, 138, 148, and so forth.

The conductive connectors 396 are formed in the openings and on the UBMs 394 (if used). The conductive connectors 396 may be formed using processes and materials similar to the conductive connectors 160 of FIG. 19 or similar to the conductive connectors 340 of FIG. 43.

Figure 52:
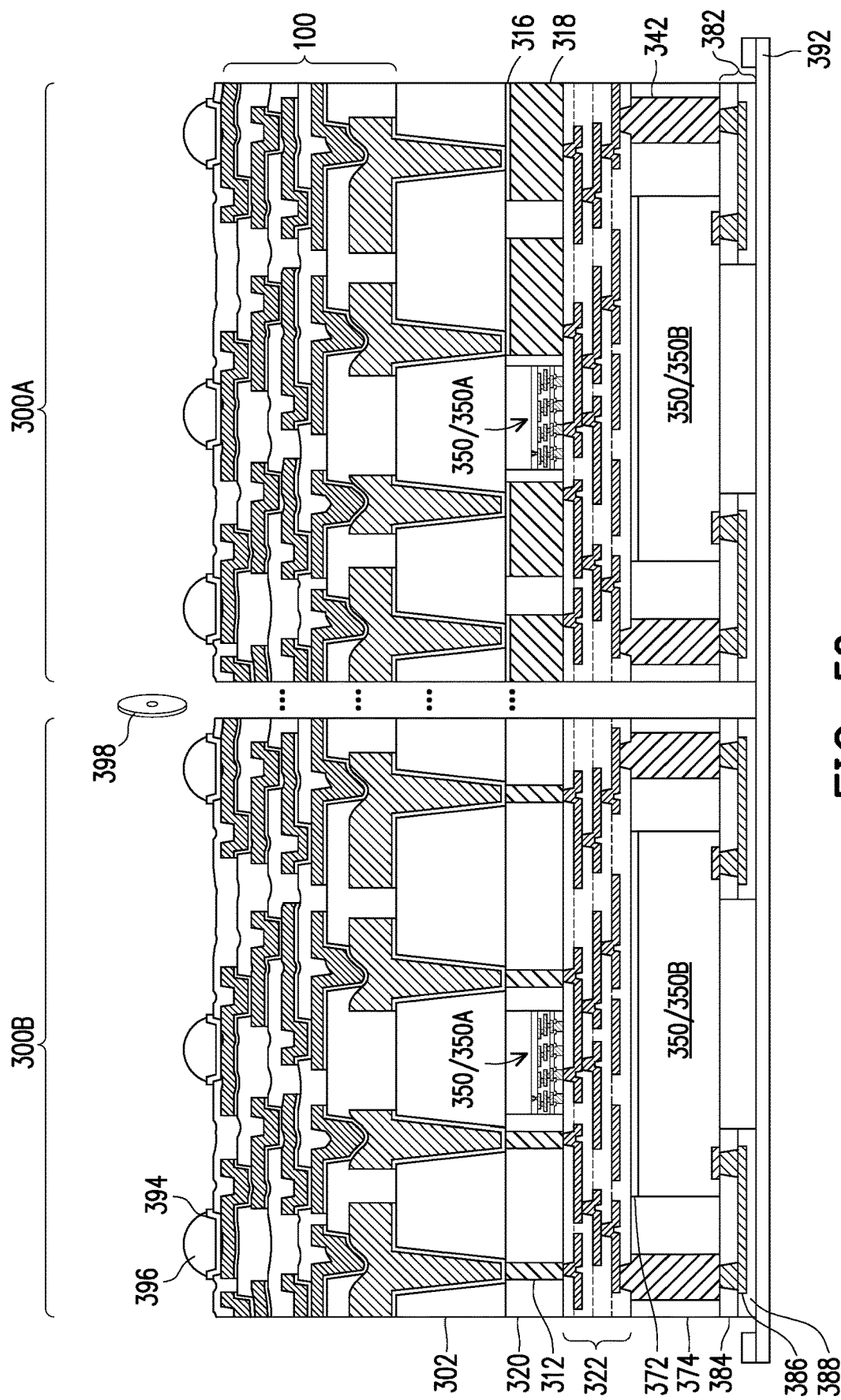

In FIG. 52, a singulation process 398 can separate one package from another so that a package is formed from the structures in the package region 300A and another package is formed from the structures in the package region 300B. The singulation process is performed by sawing or laser cutting along scribe line regions, e.g., between the package region 300A and the package region 300B. The sawing singulates the package region 300A from the package region 300B.

Figure 53:
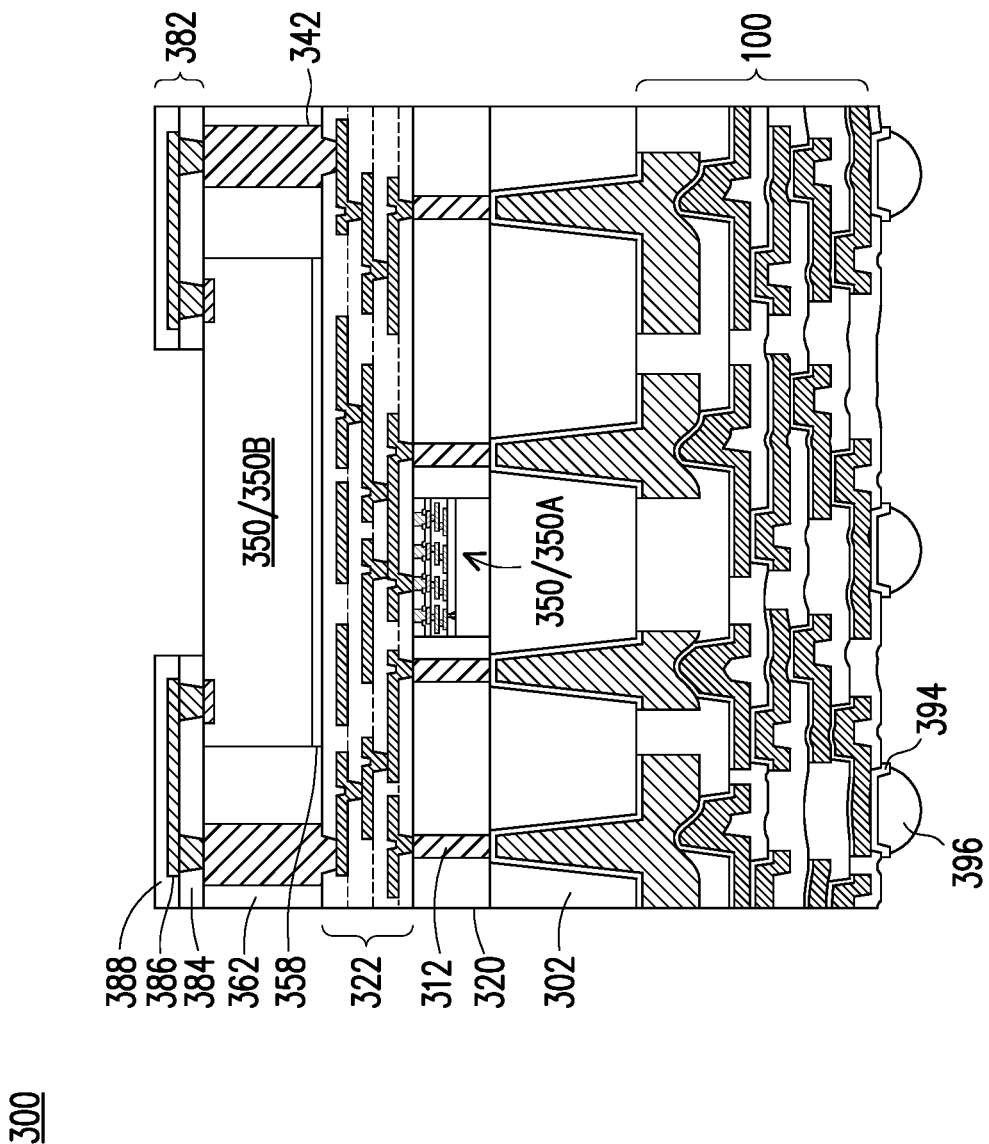

In FIG. 53, the resulting, singulated device stack 300 is from one of the package region 300A or the package region 300B. Because the device stack 300 includes the redistribution structure 100, including the fill free high shrinkage insulating layer 112, and fill-free high shrinkage insulating layers 122, 132, 142, and 152, the device stack 300 may be made with fewer planarization processes at smaller thicknesses. It should be understood that the thickness of the redistribution structure 100 as illustrated in 53 is not to scale and is, instead, exaggerated to show detail. For example, the resulting redistribution structure 100 may be less than 50% the thickness of the redistribution structure 322, such as between 20% and 50%, for the same number of metallization layers.

Figure 54:
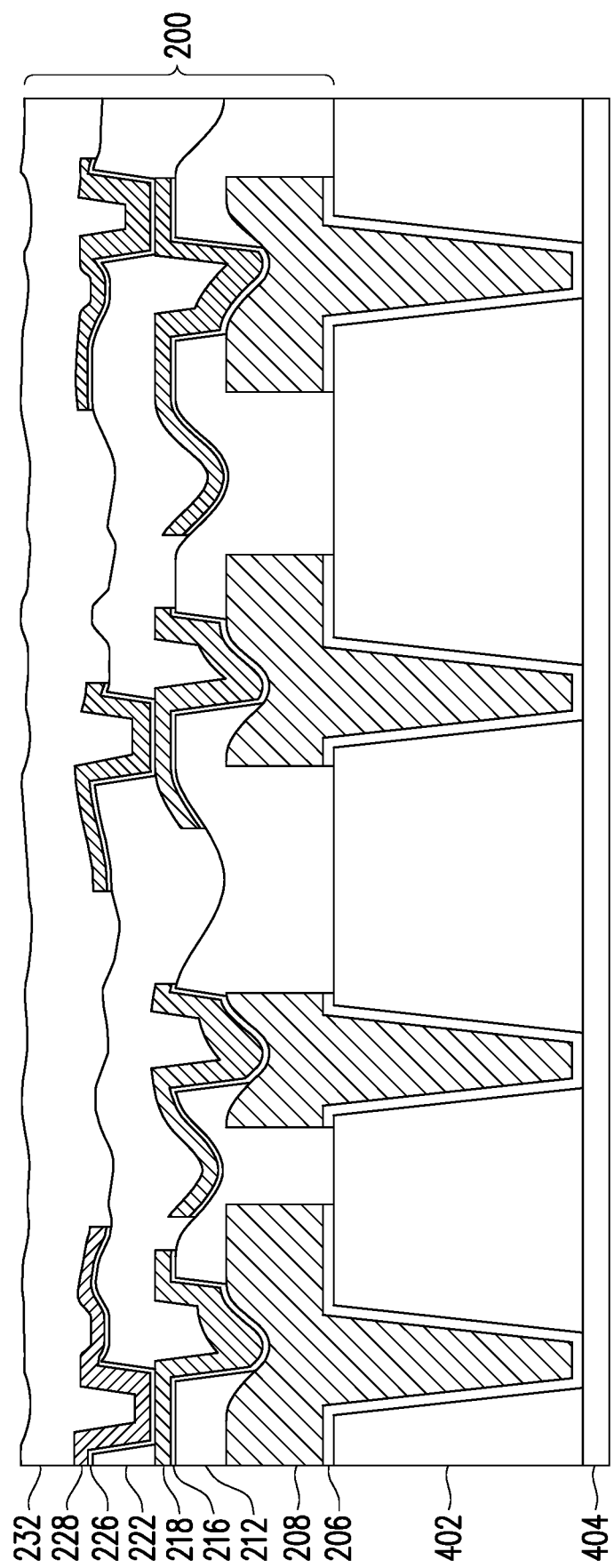
FIGS. 54 through 59 illustrate intermediate processes in the formation of a device stack, in accordance with some embodiments.

FIGS. 54 through 59 illustrate cross-sectional views of various intermediate stages in forming a semiconductor device, such as integrated fan out (InFO) package, for example, for use with a MEMS device. The package regions 400A and 400B may be likened to the package regions 300A and 300B, discussed above. FIG. 54 illustrates a redistribution structure 200 (see FIG. 29) formed over a carrier 402 which is attached to a tape 404. The carrier 402 and tape 404 may be similar to those discussed above with respect to the carrier 301 and the tape 304. The seed layer 206 of the redistribution structure and conductive layer 208 of the redistribution structure 200 may be similar to those discussed above with respect to the seed layer 106 and the conductive layer 108 of FIG. 34. In particular, with respect to the seed layer 206 and conductive layer 208, each of these has a portion that extends down into the carrier 402, and in some embodiments through the carrier 402. An upper surface of the conductive layer 208 may have depressions which align to the openings in the carrier 402, similar to those discussed above with respect to the conductive layer 108 of FIG. 34 and FIG. 35.

Figure 55:
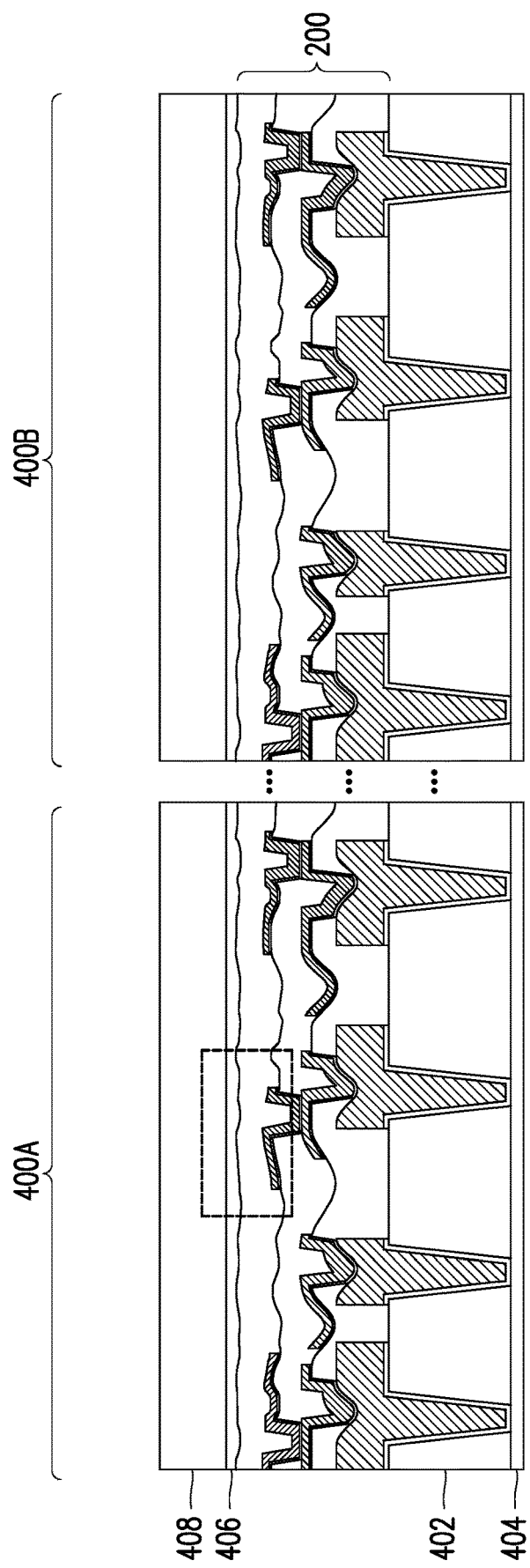

In FIG. 55, the tape 404 is removed and the package region 300A is attached to a carrier 408 by a die attach film 406. The carrier 408 and the die attach film 406 may by similar to those discussed above with respect to the carrier 308 and the die attach film 306. As discussed above, the upper surface of the redistribution structure 200 is wavy. The top surface of the die attach film 406 may have a high degree of planarity. Thus, the die attach film 406 has a varying thickness across the face of the redistribution structure 200.

Figure 56:
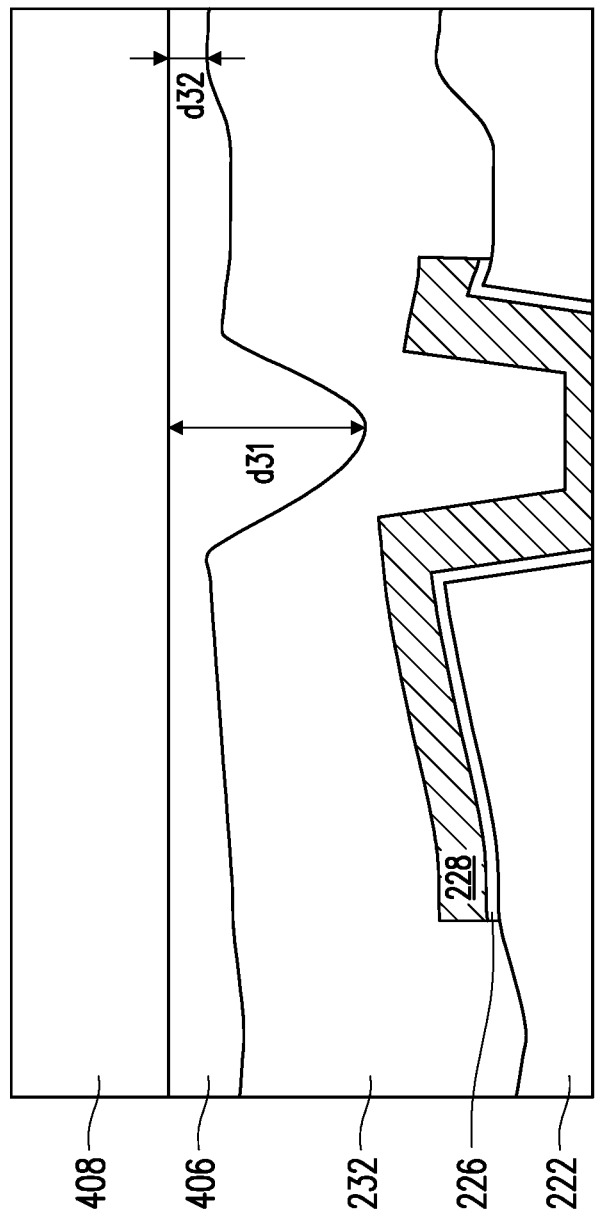

FIG. 56 illustrates a magnified portion of the dashed box depicted in FIG. 55 to better illustrate the varying thickness of the die attach film 406. The distance d31 represents that the die attach film 406 can extend into any depressions in the surface of the uppermost insulating layer (e.g., insulating layer 232) of the redistribution structure 200. The distance d32 represents a thinnest portion of the die attach film 406. The distance d31 can be representative of a thickest portion of the die attach film 406. In some embodiments, the thinnest portion of the die attach film 405, distance d32 may be as little as 10% to 25% the thickest portion of the die attach film 405. The die attach film 406 can be made thicker so that the difference between the distances d31 and d32 are minimal, however, providing the ability to have a relatively smaller distance d32 of 10% to 25% of the distance d31 allows for greater flexibility in the waviness of the insulating layer 232 of the redistribution structure 200.

Figure 57:
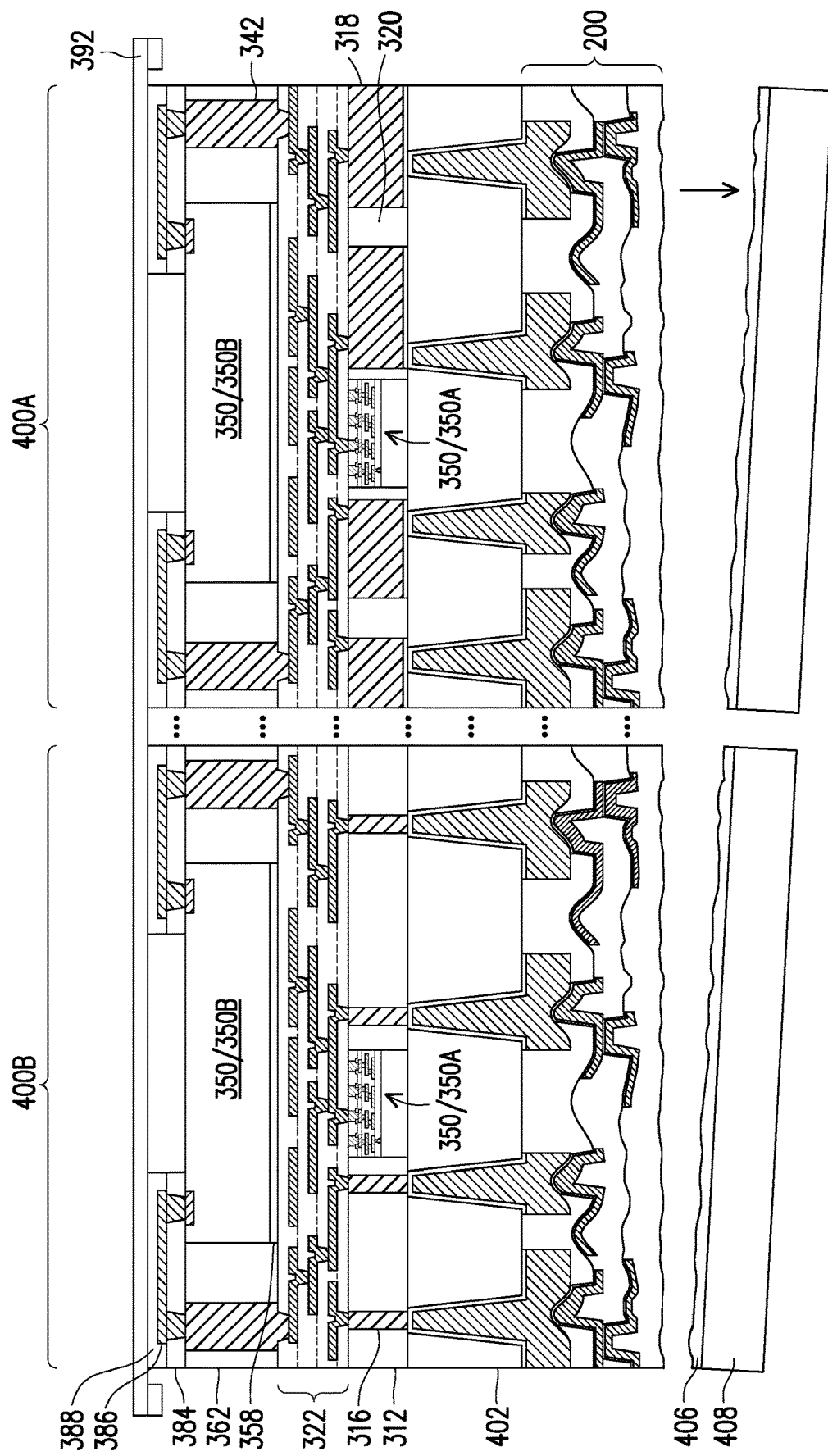

In FIG. 57, the carrier 408 is flipped over and various structures are formed over the carrier 402. Like reference numbers indicate like elements to those discussed above with respect to FIGS. 31 through 53. The package regions 400A and 400B are attached to a frame 392 and the carrier 408 removed using processes similar to those discussed above with respect to the carrier 308.

Figure 58:
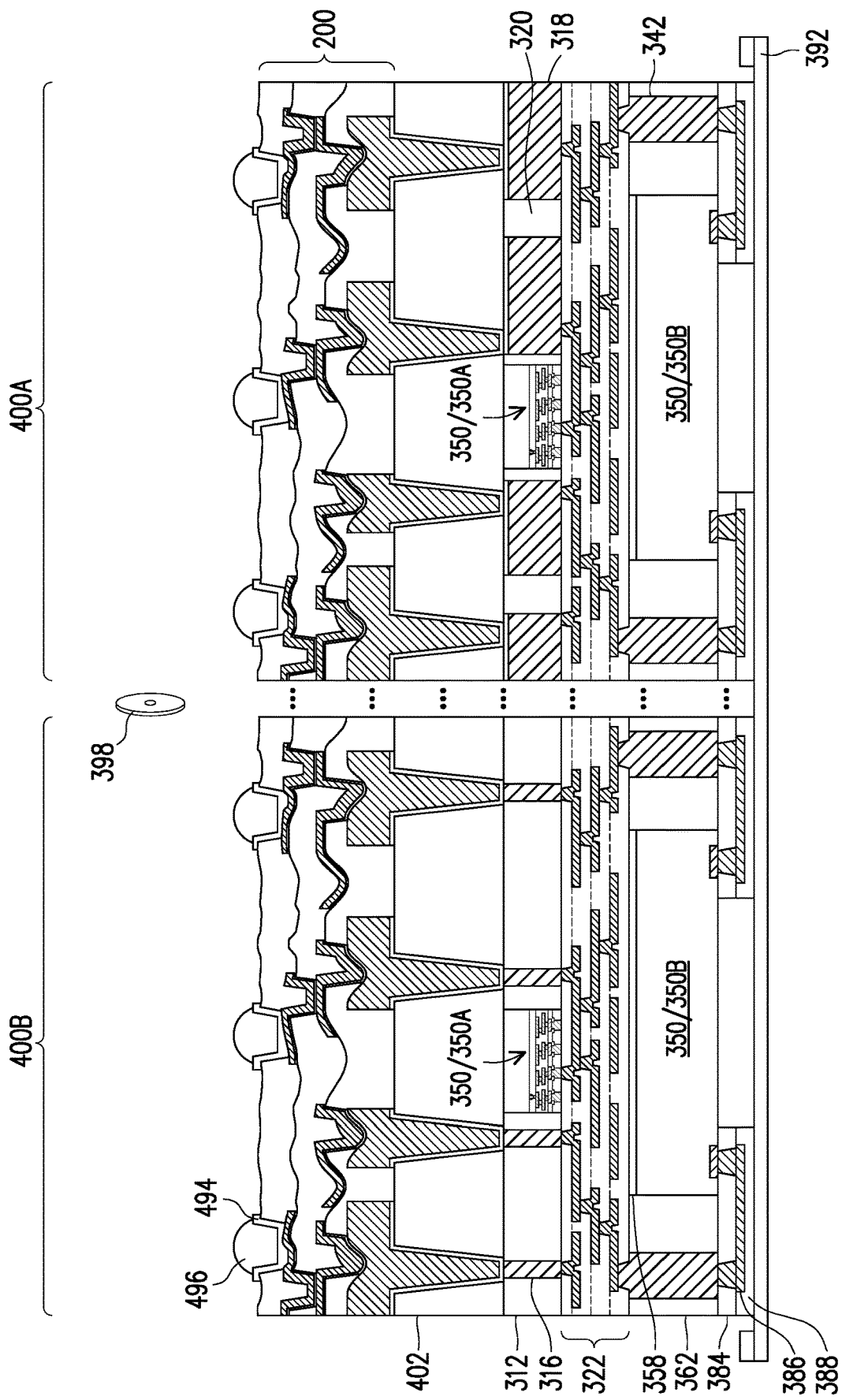

In FIG. 58, optional UBMs 494 and conductive connectors 496 are formed through the upper most insulating layer of the redistribution structure 200 to contact the upper conductive layer 228. The UBMs 494 and conductive connectors 496 may be formed using processes and materials similar to those discussed above with respect to the UBMs 394 and the conductive connectors 396. The package regions may then be singulated using a singulation process 398, for example, to separate the package region 400A from the package region 400B.

Figure 59:
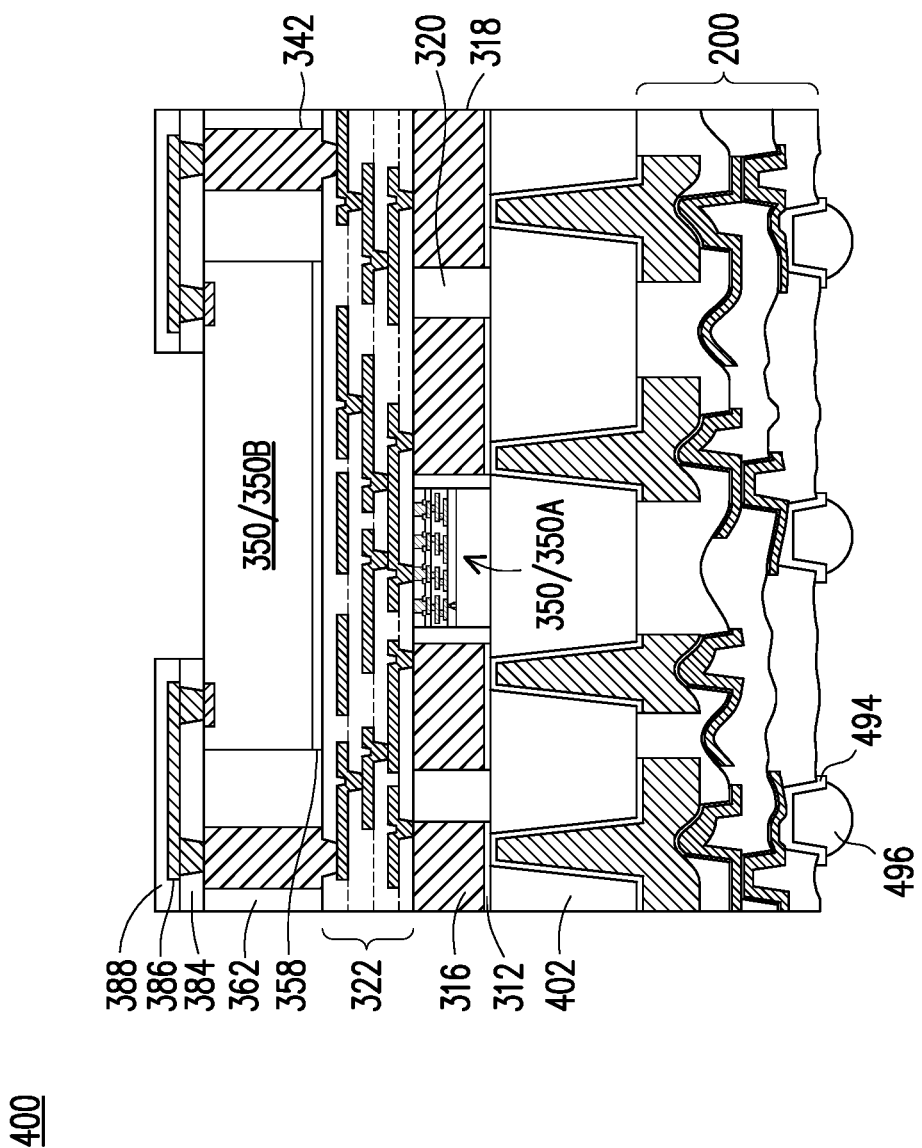

In FIG. 59, the resulting, singulated device stack 400 is from one of the package region 400A or the package region 400B. Because the device stack 400 includes the redistribution structure 200, including the fill-free high shrinkage insulating layers 212, 222, and 232 (including more or less insulating layers based on design), the device stack 400 may be made with fewer planarization processes at smaller thicknesses. It should be understood that the thickness of the redistribution structure 100 as illustrated in 58 is not to scale and is, instead, exaggerated to show detail. For example, the resulting redistribution structure 200 may be less than 50% the thickness of the redistribution structure 322, such as between 20% and 50%, for the same number of metallization layers.

Figure 60:
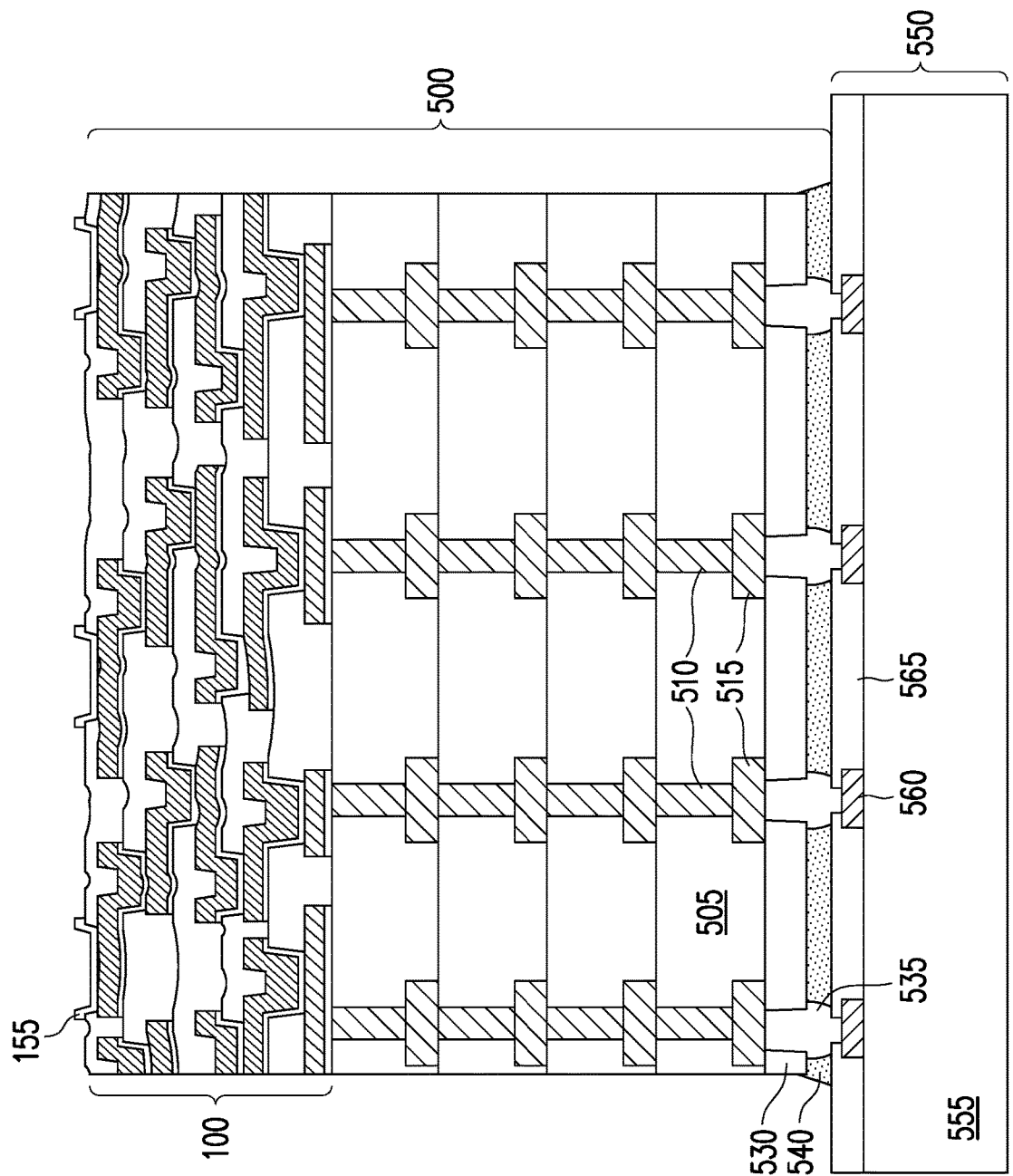
FIGS. 60 and 61 illustrate device packages, in accordance with some embodiments.
Figure 61:
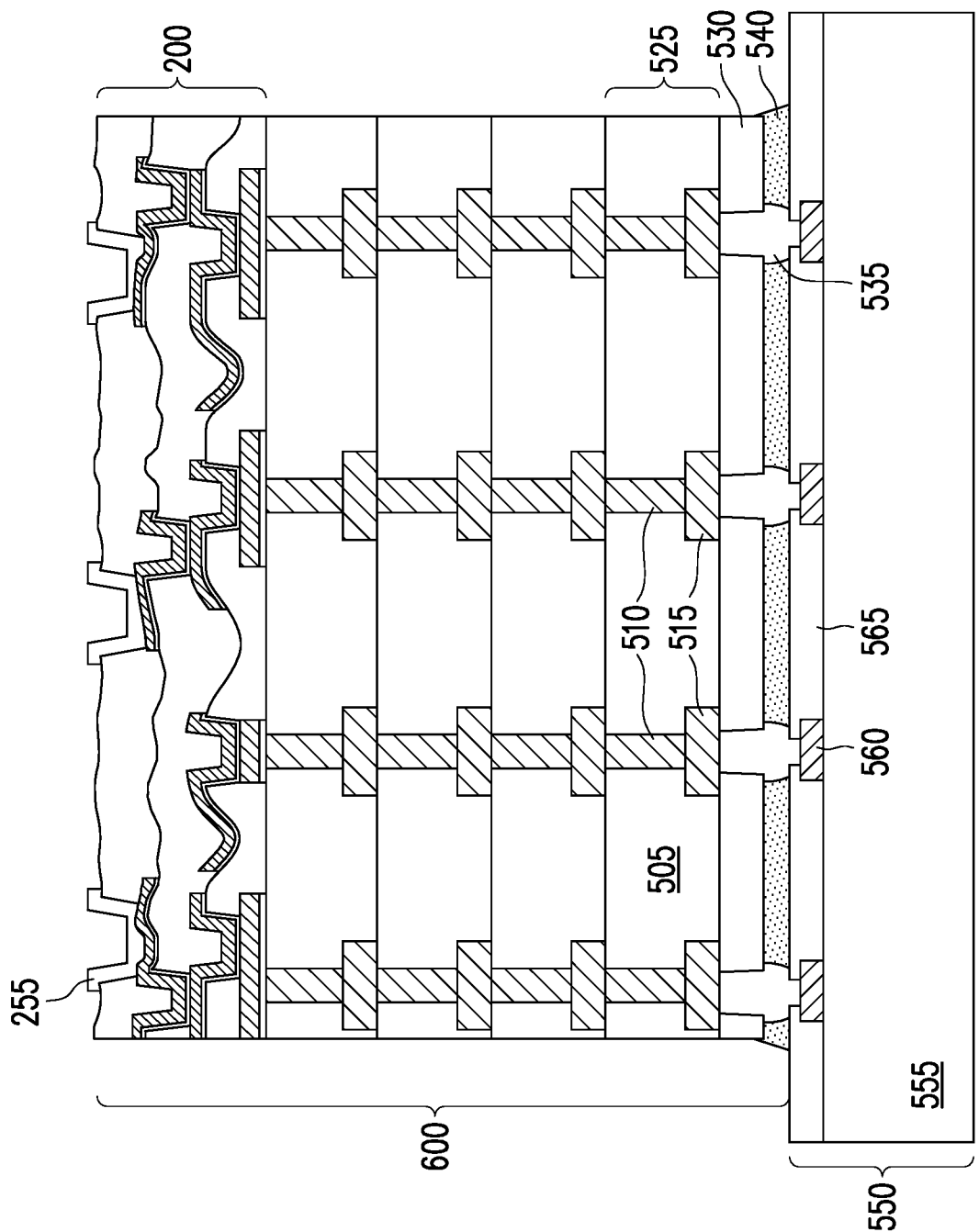

FIGS. 60 and 61 illustrate additional embodiments which utilize the redistribution structure 100 and the redistribution structure 200, respectively in a package 500 and package 600. The primary difference between the embodiments in FIG. 60 and FIG. 61 is that the embodiment of FIG. 60 utilizes a redistribution structure which is formed according to the redistribution structure 100, discussed above, while the embodiment of FIG. 61 utilizes a redistribution structure which is formed according to the redistribution structure 200, discussed above. The remaining elements of FIGS. 60 and 61 will be discussed together.

Each of the layers 525 of the packages 500 and 600 may be singulated wafer portions 505 of a wafer. In some embodiments, the packages 500 and 600 may be formed by stacking wafers in a wafer-on-wafer process to make a wafer stack. Each of the wafer portions 505 may include through-vias 510 and bond pads 515. Devices may be formed in the wafers, such as transistors, resistors, capacitors, and so forth. While four wafers portions 505 are illustrated, it should be understood that more or fewer wafers portions may be used. Next, the redistribution structures 100 or 200, respectively, are formed. Then, the wafer stack may be flipped over and an insulating layer 530 may be formed on a first side of the packages 500 and 600, and conductive connectors 535 formed through the insulating layer 530. The conductive connectors 535 may be formed using materials and processes similar to those used in forming the conductive connectors 160 or 396, discussed above.

In other embodiments, the layers 525 may represent other structures, such as encapsulated dies, interposers, semiconductor substrates, the like, and combinations thereof.

After the conductive connectors 535 are formed, then the packages 500 and 600 may be singulated from other similar packages in the wafer stack. Each singulated package 500 or 600 may then be mounted to a package substrate 550 using the conductive connectors 535. The package substrate 550 includes a substrate core 555 and bond pads 560 over the substrate core 555. The substrate core 555 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 555 may be an SOI substrate. Generally, an SOI substrate includes a layer of a semiconductor material such as epitaxial silicon, germanium, silicon germanium, SOI, SGOI, or combinations thereof. The substrate core 555 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 555.

The substrate core 555 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 555 may also include metallization layers and vias (not shown), with the bond pads 560 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 555 is substantially free of active and passive devices.

In some embodiments, the conductive connectors 535 are reflowed to attach the packages 500 or 600 to the bond pads 560. The conductive connectors 535 electrically and/or physically couple the package substrate 550, including metallization layers in the substrate core 555, to the packages 500 or 600. In some embodiments, a solder resist 565 may be formed on the substrate core 555. The conductive connectors 535 may be disposed in openings in the solder resist 565 to be electrically and mechanically coupled to the bond pads 560. The solder resist 565 may be used to protect areas of the package substrate 550 from external damage.

The conductive connectors 535 may have an epoxy flux (not shown) formed thereon before they are reflowed with at least some of the epoxy portion of the epoxy flux remaining after the packages 500 or 600 are attached to the package substrate 550. This remaining epoxy portion may act as an underfill to reduce stress and protect the joints resulting from reflowing the conductive connectors 535. In some embodiments, an underfill 540 may be formed between the packages 500 or 600 and the package substrate 550 and surrounding the conductive connectors 535. The underfill 540 may be formed by a capillary flow process after the packages 500 or 600 are attached or may be formed by a suitable deposition method before the packages 500 or 600 are attached.

In some embodiments, passive devices (e.g., surface mount devices (SMDs), not shown) may also be attached to the packages 500 or 600 (e.g., to the bond pads 515) or to the package substrate 550 (e.g., to the bond pads 560). For example, the passive devices may be bonded to a same surface of the packages 500 or 600 or the package substrate 550 as the conductive connectors 535. The passive devices may be attached to the packages 500 or 600 prior to mounting the packages 500 or 600 on the package substrate 550, or may be attached to the package substrate 550 prior to or after mounting the packages 500 or 600 on the package substrate 550.

The packages 500 or 600 may be implemented in other device stacks. For example, a PoP structure is shown and configured to accept an additional package component attached thereto (e.g., at the UBMs 155 and 255), but the packages 500 or 600 may also be implemented in a Flip Chip Ball Grid Array (FCBGA) package. In such embodiments, the packages 500 or 600 are mounted to a substrate such as the package substrate 550, but the UBMs 155 and 255 may be omitted. Instead, a lid or heat spreader may be attached to the packages 500 or 600.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve several advantages. Embodiments utilize a redistribution structure which does not use a planarization process after forming an insulating layer of the redistribution structure, thereby simplifying the process of making the redistribution structure. In addition the insulating layers between the metallization patterns can be made thinly since no planarization is performed. The insulating layers of the redistribution structure may also be made of filler-free materials with shrinkage rates resulting in flatter insulating layers, even without a planarization process. The resulting wavy insulating layers are less wavy than they would be using typical insulating materials. The redistribution structure may also have a first metallization pattern which is thicker than the other metallization patterns in other layers, providing better conductivity and limiting attenuation of signals through the first metallization pattern. Due to the thinness of the insulating layers separating each of the metallization patterns, the overlying metallization pattern extends along sidewalls of openings in the insulating layers and along an exposed portion of the underlying metallization pattern.

One embodiment is a redistribution structure coupled to a conductive feature of a substrate. The redistribution structure may include a first conductive layer and a first insulating layer over the first conductive layer. The first insulating layer may include a first filler-free insulating material. A second conductive layer may be over the first insulating layer, the second conductive layer coupled to the first conducting layer, and a second insulating layer may be over the second conductive layer, and the second insulating layer may include a second filler-free insulating material. The device also includes a conductive connector electrically coupled to the redistribution structure. In an embodiment, the first filler-free insulating material is different than the second filler-free insulating material. In an embodiment, an upper surface of the second insulating layer is wavy. In an embodiment, a difference between an average peak of the upper surface and a average valley of the upper surface is between 3 μm and 5 μm. In an embodiment, the first conductive layer is three to five times thicker than the second conductive layer. In an embodiment, a surface of the second insulating layer is free of polishing marks. In an embodiment, the second conductive layer may include a seed layer and a metal layer over the seed layer, where the seed layer conformally coats a recess in the first insulating layer, the recess exposing a portion of the first conductive layer. In an embodiment, the substrate is a ceramic carrier and the substrate is interposed between the redistribution structure and the encapsulated die. In an embodiment, the device may include: a metallization layer disposed in a same layer as the encapsulated die, a thickness of the metallization layer being the same as a thickness of the encapsulated die.

Another embodiment includes a first redistribution structure, and the first redistribution structure may include: a first metallization pattern, the first metallization pattern having a first thickness, a first insulating layer adjacent the first metallization pattern, and a second metallization pattern adjacent the first insulating layer. The first insulating layer has a second thickness between the first metallization pattern and the second metallization pattern, where the second thickness is less than the first thickness. The device also includes an encapsulated die disposed over the first redistribution structure. In an embodiment, the device may include: a ceramic carrier disposed between the first redistribution structure and the encapsulated die. In an embodiment, the encapsulated die includes a micro-electro-mechanical-system (MEMS) device. In an embodiment, the second metallization pattern has a third thickness, where the third thickness is less than the first thickness, where the first metallization pattern is disposed closer to the encapsulated die than the second metallization pattern. In an embodiment, the second metallization pattern may include a seed layer and a conductive layer, where the seed layer conformally coats sidewalls of an opening through the first insulating layer. In an embodiment, an upper surface of the first insulating layer is wavy.

Another embodiment is a method including depositing a first metallization pattern on a substrate. The method also includes depositing a first insulating layer over the first metallization pattern, the first insulating layer being filler-free. The method also includes curing the first insulating layer, causing the first insulating layer to shrink by less than 5%. The method also includes forming a first opening through the first insulating layer to expose a portion of the first metallization pattern. The method also includes without leveling the first insulating layer, depositing a second metallization pattern over the first insulating layer and in the first opening. The method also includes depositing a second insulating layer over the second metallization pattern, the second insulating layer being filler-free. In an embodiment, the first insulating layer shrinks by between 1% and 5%. In an embodiment, the first insulating layer has a different shrinkage rate than the second insulating layer. In an embodiment, the metallization pattern is deposited over a ceramic carrier. In an embodiment, flip the ceramic carrier over. In an embodiment, attaching an integrated circuit die to the ceramic carrier; and depositing an encapsulant laterally surrounding the integrated circuit die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a first metallization pattern on a substrate;
depositing a first insulating layer over the first metallization pattern, the first insulating layer being filler-free;
curing the first insulating layer, causing the first insulating layer to shrink less than 5%;
forming a first opening through the first insulating layer to expose a portion of the first metallization pattern;
without leveling the first insulating layer, depositing a second metallization pattern over the first insulating layer and in the first opening;
depositing a second insulating layer over the second metallization pattern, the second insulating layer being filler-free; and
curing the second insulating layer, causing the second insulating layer to shrink between 20% and 35%.

2. The method of claim 1, wherein the first insulating layer shrinks by between 1% and 5%.

3. The method of claim 1, wherein the substrate comprises a metallic coated carrier.

4. The method of claim 3, further comprising:
flipping the carrier over;
attaching an integrated circuit die to the carrier; and
depositing an encapsulant laterally surrounding the integrated circuit die.

5. The method of claim 3, wherein the carrier includes pre-formed through-via openings disposed therein.

6. The method of claim 1, further comprising depositing the first metallization pattern to be three to five times thicker than the second metallization pattern.

7. A method comprising:
forming a redistribution structure coupled to a conductive feature of a substrate, comprising:
depositing and patterning a first conductive layer,
depositing a first insulating layer over the first conductive layer, the first insulating layer comprising a first filler-free insulating material,
forming openings in the first insulating layer to expose portions of the first conductive layer,
depositing and patterning a second conductive layer over the first insulating layer, the second conductive layer coupled to the first conducting layer through the openings, and
depositing a second insulating layer over the second conductive layer, the second insulating layer comprising a second filler-free insulating material, the second filler-free insulating material having a shrinkage rate between 65% and 80%; and
forming a conductive connector over the redistribution structure, the conductive connector electrically coupled to the redistribution structure.

8. The method of claim 7, wherein the first filler-free insulating material is different than the second filler-free insulating material.

9. The method of claim 7, wherein after depositing the second insulating layer, an upper surface of the second insulating layer is wavy.

10. The method of claim 9, wherein a difference between an average peak of the upper surface and an average valley of the upper surface is between 3 µm and 5 µm.

11. The method of claim 7, further comprising depositing the first conductive layer to be three to five times thicker than the second conductive layer.

12. The method of claim 7, wherein after depositing the second insulating layer, forming the conductive connector over the redistribution structure without performing a planarization or polishing process.

13. The method of claim 7, wherein depositing the second conductive layer comprises:
depositing a seed layer and depositing a metal layer over the seed layer, wherein the seed layer conformally coats a recess in the first insulating layer, the recess exposing a portion of the first conductive layer.

14. The method of claim 7, further comprising:
attaching a die to an opposite side of the substrate from the redistribution structure; and
depositing an encapsulating material laterally surrounding the die.

15. The method of claim 14, further comprising:
prior to depositing the encapsulating material, forming a metallization structure disposed in a same layer as the die;
depositing the encapsulating material over the metallization structure and the die; and
planarizing the encapsulating material to level an upper surface of the metallization structure, an upper surface of the die, and an upper surface of the encapsulating material.

16. A method comprising:
forming a first redistribution structure over a metallic coated carrier, comprising:
depositing a first metallization pattern over the metallic coated carrier, the first metallization pattern having a first thickness,
depositing a first insulating layer adjacent the first metallization pattern, the first insulating layer comprising a filler free material, and
depositing a second metallization pattern adjacent the first insulating layer, wherein the first insulating layer has a second thickness between the first metallization pattern and the second metallization pattern, wherein the second thickness is less than the first thickness;
attaching a die over the first redistribution structure on a side of the metallic coated carrier opposite the first redistribution structure; and
encapsulating the die in an encapsulant.

17. The method of claim 16, wherein the die includes a micro-electro-mechanical-system (MEMS) device.

18. The method of claim 16, wherein the second metallization pattern has a third thickness, wherein the third thickness is less than the first thickness, wherein the first metallization pattern is disposed closer to the encapsulated die than the second metallization pattern.

19. The method of claim 16, further comprising forming an opening through the first insulating layer, and wherein depositing the second metallization pattern comprises depositing a seed layer in the opening and over the first insulating layer, and after depositing the seed layer depositing a conductive layer.

20. The method of claim 16, further comprising:
curing the first insulating layer, causing the first insulating layer to shrink between 20% and 35%, wherein after curing the first insulating layer, an upper surface of the first insulating layer is wavy.

* * * * *